US012554168B2

(12) United States Patent
Zhao et al.

(10) Patent No.: US 12,554,168 B2
(45) Date of Patent: Feb. 17, 2026

(54) ARRAY SUBSTRATE AND MANUFACTURING METHOD THEREOF, AND DISPLAY DEVICE

(71) Applicants: Chengdu BOE Display Sci-tech Co., Ltd., Sichuan (CN); BOE TECHNOLOGY GROUP CO., LTD., Beijing (CN)

(72) Inventors: Yijing Zhao, Beijing (CN); Chao Xie, Beijing (CN); Yudan Yang, Beijing (CN); Xi Yang, Beijing (CN); Tao Xiong, Beijing (CN)

(73) Assignees: Chengdu BOE Display Sci-tech Co., Ltd., Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 505 days.

(21) Appl. No.: 18/248,957

(22) PCT Filed: Mar. 25, 2022

(86) PCT No.: PCT/CN2022/083203

§ 371 (c)(1),
(2) Date: Apr. 13, 2023

(87) PCT Pub. No.: WO2023/178705

PCT Pub. Date: Sep. 28, 2023

(65) Prior Publication Data

US 2024/0377686 A1 Nov. 14, 2024

(51) Int. Cl.
*G02F 1/1362* (2006.01)
*H10D 86/40* (2025.01)

(52) U.S. Cl.
CPC ..... *G02F 1/136263* (2021.01); *H10D 86/441* (2025.01)

(58) Field of Classification Search
CPC ........................ G02F 1/136263; H10D 86/441
See application file for complete search history.

(56) References Cited

U.S. PATENT DOCUMENTS

2009/0152552 A1* 6/2009 Ku ........................ H10D 86/441 257/59

* cited by examiner

*Primary Examiner* — Peter M Albrecht
(74) *Attorney, Agent, or Firm* — Dority & Manning, P.A.

(57) ABSTRACT

An array substrate includes a substrate, a first gate line, a plurality of data lines, a plurality of first pixel electrodes, a plurality of first transistors and a plurality of first capacitive lines that are all disposed on the substrate. A data line and the first gate line cross, and are insulated from each other. An orthographic projection of a first capacitive line on the substrate is overlapped with an orthographic projection of a first pixel electrode on the substrate. The first capacitive line includes a first conductive segment that is proximate to the first gate line and is provided with a first break therein. An orthographic projection, on the substrate, of a portion of the first conductive segment located on a side of the first break away from the middle subsection is overlapped with an orthographic projection of a second electrode of a first transistor on the substrate.

20 Claims, 27 Drawing Sheets

Form a first gate line, a plurality of data lines, a plurality of first transistors and a plurality of first capacitive lines on a substrate; the first gate line having a first side and a second side opposite to each other in a width direction of the first gate line; a data line and the first gate line crossing, and being insulated from each other; a gate and a first electrode of a first transistor being coupled to the first gate line and the data line, respectively — S100

↓

Form a plurality of first pixel electrodes on the substrate; a first pixel electrode being located on the first side of the first gate line, and being coupled to a second electrode of the first transistor; an orthographic projection of a first capacitive line on the substrate being overlapped with an orthographic projection of the first pixel electrode on the substrate; the first capacitive line including a first conductive segment whose extending direction is substantially parallel to an extending direction of the first gate line, and the first conductive segment being proximate to the first gate line; the first conductive segment being provided with a first break therein, and the first break being located on a side of a charging coupling point away from the data line, and deviating from a middle subsection of the first conductive segment; the charging coupling point being a coupling position of the first pixel electrode and the second electrode of the first transistor, and the middle subsection of the first conductive segment being a portion of the first conductive segment that is located in the middle and has a length of 1/3 of a total length of the first conductive segment; an orthographic projection, on the substrate, of a portion of the first conductive segment located on a side of the first break away from the middle subsection being overlapped with an orthographic projection of the second electrode of the first transistor on the substrate — S200

FIG. 31

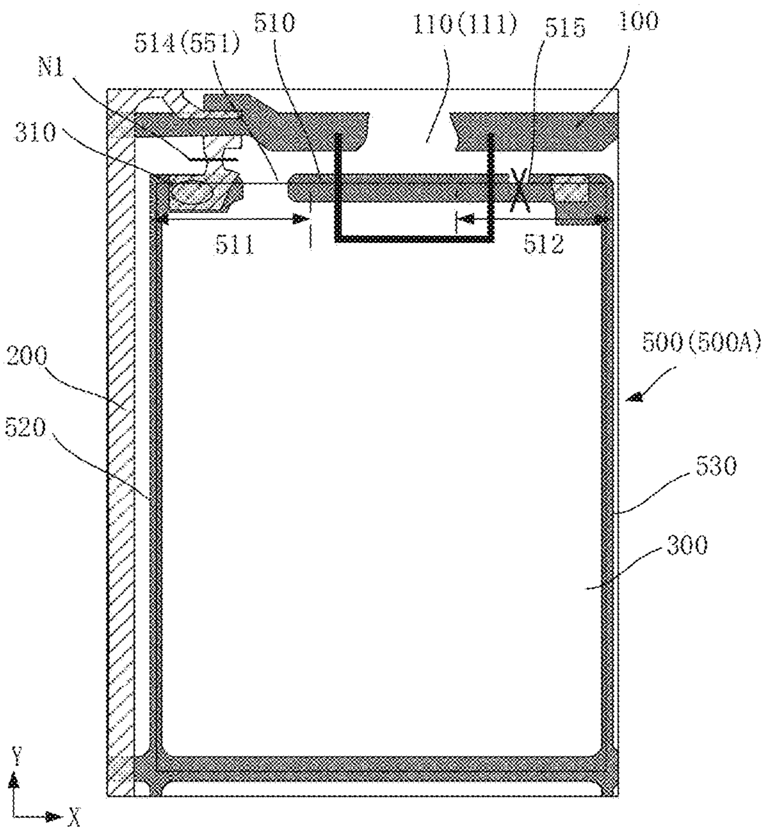

FIG. 32

ARRAY SUBSTRATE AND MANUFACTURING METHOD THEREOF, AND DISPLAY DEVICE

CROSS-REFERENCE TO RELATED APPLICATION

This application is a national phase entry under 35 USC 371 of International Patent Application No. PCT/CN 2022/083203 filed on Mar. 25, 2022, which is incorporated herein by reference in its entirety.

TECHNICAL FIELD

The present disclosure relates to the field of display technologies, and in particular, to an array substrate and a manufacturing method thereof, and a display device.

BACKGROUND

In a process of manufacturing an array substrate of a display device (e.g. liquid crystal display), scan line(s) (also referred to as gate line(s)) are often broken. In this case, repair is usually performed by connecting a repair line to two sides of a breaking point of a scan line. However, this repair method is easy to cause bright spots.

SUMMARY

In an aspect, an array substrate is provided. The array substrate includes a substrate, and a first gate line, a plurality of data lines, a plurality of first pixel electrodes, a plurality of first transistors and a plurality of first capacitive lines that are all disposed on the substrate.

The first gate line has a first side and a second side opposite to each other in a width direction of the first gate line. A data line and the first gate line cross, and are insulated from each other. A first pixel electrode is located on the first side of the first gate line. A gate, a first electrode and a second electrode of a first transistor are coupled to the first gate line, the data line and the first pixel electrode, respectively.

An orthographic projection of a first capacitive line on the substrate is overlapped with an orthographic projection of the first pixel electrode on the substrate. The first capacitive line includes a first conductive segment whose extending direction is substantially parallel to an extending direction of the first gate line, and the first conductive segment is proximate to the first gate line. The first conductive segment is provided with a first break therein, and the first break is located on a side of a charging coupling point away from the data line, and deviates from a middle subsection of the first conductive segment. The charging coupling point is a coupling position of the first pixel electrode and the second electrode of the first transistor, and the middle subsection of the first conductive segment is a portion of the first conductive segment that is located in the middle and has a length of ⅓ of a total length of the first conductive segment. An orthographic projection, on the substrate, of a portion of the first conductive segment located on a side of the first break away from the middle subsection is overlapped with an orthographic projection of the second electrode of the first transistor on the substrate.

In some embodiments, the first break is located on a side of the middle subsection of the first conductive segment proximate to the charging coupling point; or the first break is located on a side of the middle subsection of the first conductive segment away from the charging coupling point.

In some embodiments, the orthographic projection, on the substrate, of the portion of the first conductive segment located on the side of the first break away from the middle subsection, the orthographic projection of the second electrode of the first transistor on the substrate, and the orthographic projection of the first pixel electrode on the substrate are overlapped with each other.

In some embodiments, the first conductive segment is provided with a recess whose opening faces the first gate line or faces away from the first gate line. The recess and the first break are respectively disposed on two sides of the middle subsection.

In some embodiments, an orthographic projection, on the substrate, of a portion of the first conductive segment located on a side of the recess away from the middle subsection is overlapped with the orthographic projection of the second electrode of the first transistor on the substrate.

In some embodiments, at the recess, a ratio of a width of a retained portion of the first conductive segment to a width of the first conductive segment is in a range of ⅓ to ½, inclusive; and/or a width of the opening of the recess is in a range of 7.5 μm to 8.5 μm, inclusive.

In some embodiments, the portion of the first conductive segment located on the side of the first break away from the middle subsection has a length of greater than or equal to 15 μm.

In some embodiments, the first gate line has a first gate line break. The array substrate further includes a first bridge, and two ends of the first bridge are respectively connected to two sides of the first gate line break in the first gate line. The first bridge and a first repair capacitive line cross, and the first repair capacitive line is one of the plurality of first capacitive lines. The first repair capacitive line has a first repair break and a second repair break respectively disposed on two sides of the first bridge, and the first repair break is located in a first conductive segment of the first repair capacitive line. One of the first repair break and the second repair break is a first break in the first conductive segment of the first repair capacitive line, or the first repair break and the second repair break are respectively located on two sides of the first break in the first conductive segment of the first repair capacitive line. A portion of the first conductive segment of the first repair capacitive line located on a side of the first repair break away from the first bridge is coupled to a second electrode of a first repair transistor. The first repair transistor is one of the plurality of first transistors, and corresponds to the first repair capacitive line.

In some embodiments, the first repair capacitive line includes a recess located in the first conductive segment. One of the first repair break and the second repair break is located at a position where the recess of the first repair capacitive line is located.

In some embodiments, the first repair break is located between the first bridge and a charging coupling point of the first pixel electrode and the second electrode of the first repair transistor. The second electrode of the first repair transistor, the first pixel electrode and the first repair capacitive line are coupled at the charging coupling point of the first pixel electrode and the second electrode of the first repair transistor.

In some embodiments, the first gate line has a second gate line break. The array substrate further includes a second bridge, and two ends of the second bridge are respectively connected to two sides of the second gate line break in the first gate line. The second bridge crosses a second repair capacitive line and a third repair capacitive line, and each of the second repair capacitive line and the third repair capacitive line is one of the plurality of first capacitive lines. The second repair capacitive line has a third repair break and a fourth repair break respectively disposed on two sides of the second bridge, and the third repair break is located in a first conductive segment of the second repair capacitive line. A portion of the first conductive segment of the second repair capacitive line located on a side of the third repair break away from a middle subsection of the first conductive segment of the second repair capacitive line is coupled to a second electrode of a second repair transistor. The second repair transistor is one of the plurality of first transistors, and corresponds to the second repair capacitive line. The third repair capacitive line has a fifth repair break and a sixth repair break respectively disposed on the two sides of the second bridge, and the fifth repair break is located in a first conductive segment of the third repair capacitive line. A portion of the first conductive segment of the third repair capacitive line located on a side of the fifth repair break away from a middle subsection of the first conductive segment of the third repair capacitive line is coupled to a second electrode of a third repair transistor. The third repair transistor is one of the plurality of first transistors, and corresponds to the third repair capacitive line.

The third repair break is a first break of the second repair capacitive line, or the fifth repair break is a first break of the third repair capacitive line.

In some embodiments, the array substrate further includes a plurality of second pixel electrodes, a plurality of second transistors and a plurality of second capacitive lines that are all disposed on the substrate. A second pixel electrode is located on the second side of the first gate line. A gate, a first electrode and a second electrode of a second transistor are coupled to the first gate line, the data line and the second pixel electrode, respectively. An orthographic projection of a second capacitive line on the substrate is overlapped with an orthographic projection of the second pixel electrode on the substrate.

In some embodiments, the array substrate further includes a second gate line and a plurality of third transistors that are all disposed on the substrate. A gate of a third transistor is coupled to the second gate line, and a first electrode of the third transistor is coupled to the second electrode of the second transistor. An orthographic projection of a second electrode of the third transistor on the substrate is overlapped with the orthographic projection of the second capacitive line on the substrate.

In another aspect, a display device is provided. The display device includes the above array substrate.

In yet another aspect, a manufacturing method of an array substrate is provided. The manufacturing method includes following steps.

A first gate line, a plurality of data lines, a plurality of first transistors and a plurality of first capacitive lines are formed on a substrate. The first gate line has a first side and a second side opposite to each other in a width direction of the first gate line. A data line and the first gate line cross, and are insulated from each other. A gate and a first electrode of a first transistor are coupled to the first gate line and the data line, respectively.

A plurality of first pixel electrodes are formed on the substrate. A first pixel electrode is located on the first side of the first gate line, and is coupled to a second electrode of the first transistor.

An orthographic projection of a first capacitive line on the substrate is overlapped with an orthographic projection of the first pixel electrode on the substrate. The first capacitive line includes a first conductive segment whose extending direction is substantially parallel to an extending direction of the first gate line, and the first conductive segment is proximate to the first gate line. The first conductive segment is provided with a first break therein, and the first break is located on a side of a charging coupling point away from the data line, and deviates from a middle subsection of the first conductive segment. The charging coupling point is a coupling position of the first pixel electrode and the second electrode of the first transistor, and the middle subsection of the first conductive segment is a portion of the first conductive segment that is located in the middle and has a length of ⅓ of a total length of the first conductive segment. An orthographic projection, on the substrate, of a portion of the first conductive segment located on a side of the first break away from the middle subsection is overlapped with an orthographic projection of the second electrode of the first transistor on the substrate.

In some embodiments, the first gate line has a first gate line break. The manufacturing method of the array substrate further includes following steps.

A first bridge is provided on the substrate. Two ends of the first bridge are respectively connected to two sides of the first gate line break in the first gate line. The first bridge and a first repair capacitive line cross, and the first repair capacitive line is one of the plurality of first capacitive lines.

The first repair capacitor line is cut off at least once to obtain a first repair break and a second repair break respectively disposed on two sides of the first bridge. The first repair break is located in a first conductive segment of the first repair capacitive line. One of the first repair break and the second repair break is a first break in the first conductive segment of the first repair capacitive line, or the first repair break and the second repair break are respectively located on two sides of the first break in the first conductive segment of the first repair capacitive line.

A portion of the first conductive segment of the first repair capacitive line located on a side of the first repair break away from the first bridge is coupled to a second electrode of a first repair transistor. The first repair transistor is one of the plurality of first transistors, and corresponds to the first repair capacitive line.

In some embodiments, the first gate line has a second gate line break. The manufacturing method of the array substrate further includes following steps.

A second bridge is provided on the substrate. Two ends of the second bridge are respectively connected to two sides of the second gate line break in the first gate line. The second bridge crosses a second repair capacitive line and a third repair capacitive line, and each of the second repair capacitive line and the third repair capacitive line is one of the plurality of first capacitive lines.

The second repair capacitor line is cut off to obtain a third repair break and a fourth repair break respectively disposed on two sides of the second bridge. The third repair break is located in a first conductive segment of the second repair capacitive line.

A portion of the first conductive segment of the second repair capacitive line located on a side of the third repair break away from a middle subsection of the first conductive segment of the second repair capacitive line is coupled to a second electrode of a second repair transistor. The second repair transistor is one of the plurality of first transistors, and corresponds to the second repair capacitive line.

The third repair capacitive line is cut off to obtain a sixth repair break. A first break in the third repair capacitive line is a fifth repair break. The fifth repair break and the sixth repair break are respectively disposed on the two sides of the second bridge.

A portion of the first conductive segment of the third repair capacitive line located on a side of the fifth repair break away from a middle subsection of the first conductive segment of the third repair capacitive line is coupled to a second electrode of a third repair transistor. The third repair transistor is one of the plurality of first transistors, and corresponds to the third repair capacitive line.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, and an actual timing of a signal involved in the embodiments of the present disclosure.

FIG. 31 is a flow diagram of a manufacturing method of an array substrate, in accordance with some embodiments;

FIG. 32 is a process diagram of manufacturing an array substrate, in accordance with some embodiments.

DETAILED DESCRIPTION

Figure 1:
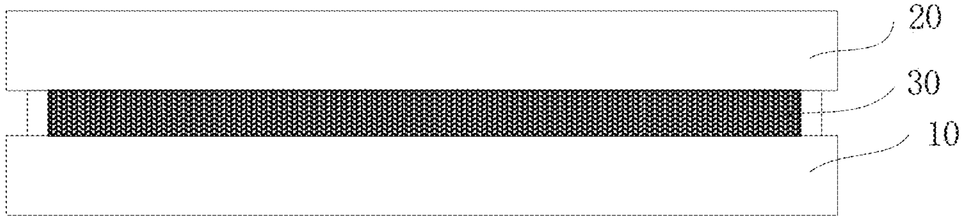
FIG. 1 is a sectional view of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure.

Schematic designations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

As used herein, the term such as "parallel," "perpendicular" or "equal" includes a stated condition and condition(s) similar to the stated condition. The similar condition(s) are within an acceptable range of deviation as determined by a person of ordinary skill in the art, considering measurement in question and errors associated with measurement of a particular quantity (i.e., limitations of a measurement system). For example, the term "parallel" includes "absolutely parallel" and "approximately parallel", and for the phrase "approximately parallel", an acceptable range of deviation may be, for example, within 5°. The term "perpendicular" includes "absolutely perpendicular" and "approximately perpendicular", and for the phrase "approximately perpendicular", an acceptable range of deviation may also be, for example, within 5°. The term "equal" includes "absolutely equal" and "approximately equal", and for the phrase "approximately equal", an acceptable range of deviation may be that, for example, a difference between two that are equal to each other is less than or equal to 5% of any one of the two.

It will be understood that when a layer or element is described as being on another layer or substrate, the layer or element may be directly on the another layer or substrate, or intermediate layer(s) may exist between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display device. The display device is a display panel or a product including the display panel. The display panel is a flat panel that may display image(s). For example, the display panel may be referred to as a screen, and may be specifically a liquid crystal display panel or an organic light-emitting diode (OLED) display panel.

The product including the display panel is a product with an image (including a still image or a moving image that may be a video) display function. For example, the product may be any one of a display, a television, a billboard, a digital photo frame, a laser printer with a display function, a telephone, a mobile phone, a painted screen, a personal digital assistant (PDA), a digital camera, a camcorder, a viewfinder, a navigator, a vehicle, a large-area wall screen, an information inquiry equipment (e.g., a business inquiry equipment of an e-government department, a bank, a hospital or a power department), and a monitor.

A size of a display region of the display panel may be greater than or equal to 65 inches, e.g., 75 inches, 85 inches, 86 inches, or 90 inches. In an example, the product may further include a motherboard coupled to the display panel in addition to the display panel. The motherboard is configured to provide image data. The display panel is configured to display corresponding image(s) in response to the image data.

FIG. 1 is a sectional view of a display panel.

In some embodiments, the display panel is a liquid crystal display panel with a plurality of sub-pixel regions. Referring to FIG. 1, the display panel includes an array substrate 10, an opposite substrate 20, and a liquid crystal layer 30 disposed between the array substrate 10 and the opposite substrate 20. In some examples, the array substrate 10 includes a pixel electrode and a common electrode that are located in a sub-pixel region, and the pixel electrode and the common electrode are configured to drive a portion of the liquid crystal layer 30 in the sub-pixel region, thereby controlling a light transmittance of the sub-pixel region to realize image display. The opposing substrate 20 may include color filters of a plurality of colors. For example, the opposing substrate 20 includes red filters, green filters and blue filters. In some other examples, the array substrate 10 includes a pixel electrode located in a sub-pixel region, and the opposite substrate 20 includes a common electrode directly facing the pixel electrode. Similarly, the pixel electrode and the common electrode are capable of controlling a light transmittance of the sub-pixel region.

Figure 2:
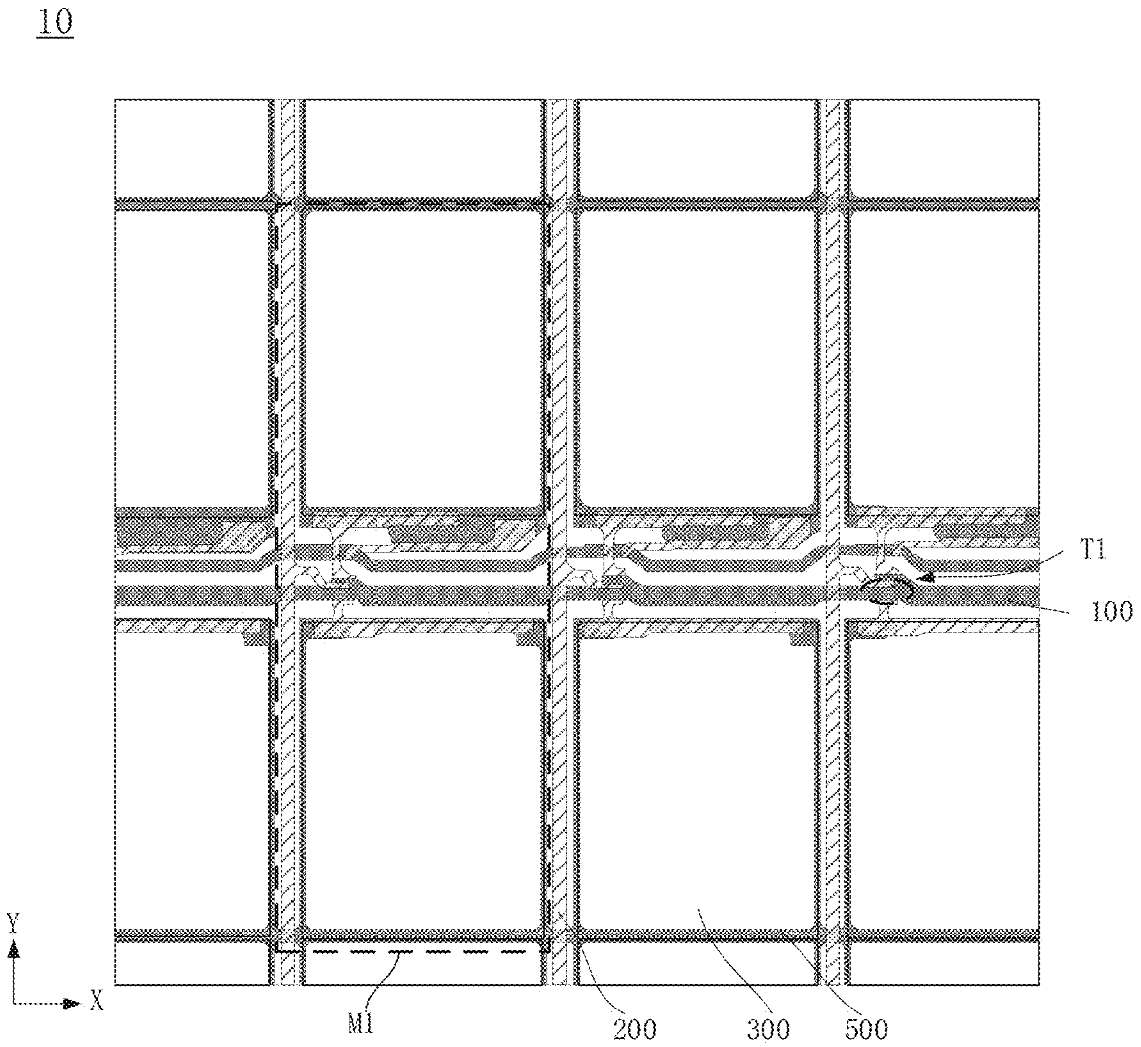
FIG. 2 is a partial top view of an array substrate, in accordance with some embodiments.
Figure 3:
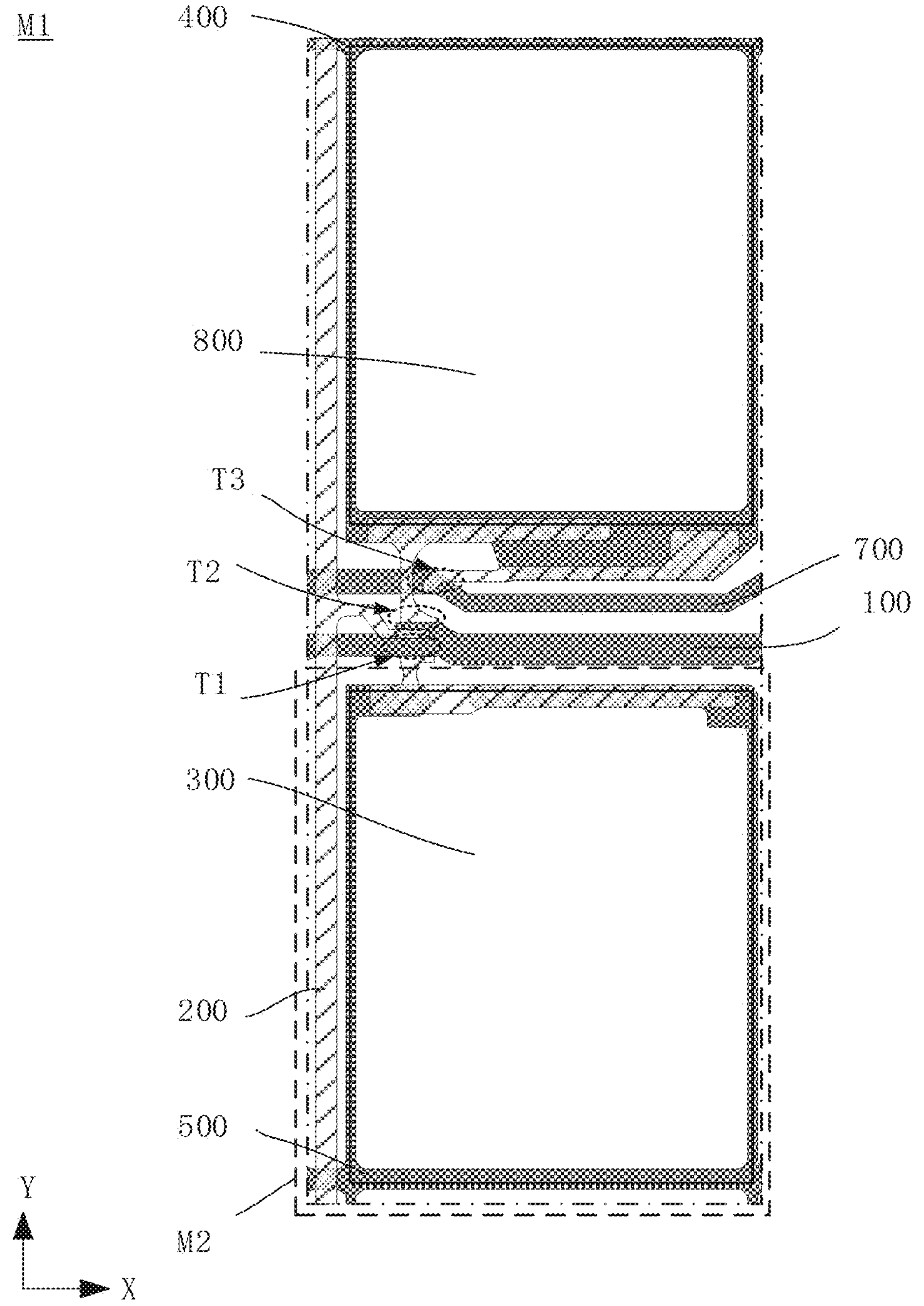
FIG. 3 is an enlarged view at M1 in FIG. 2, in accordance with some embodiments.
Figure 4:
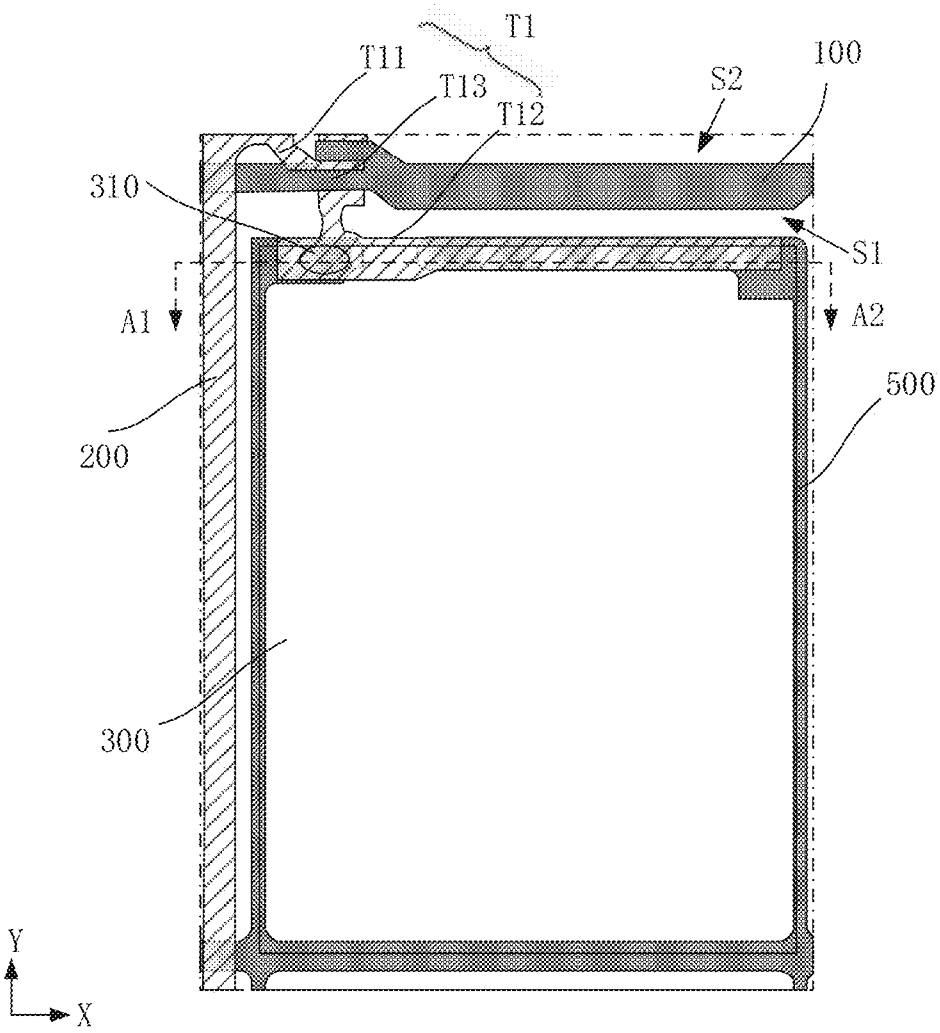
FIG. 4 is an enlarged view at M2 in FIG. 3.
Figure 5:
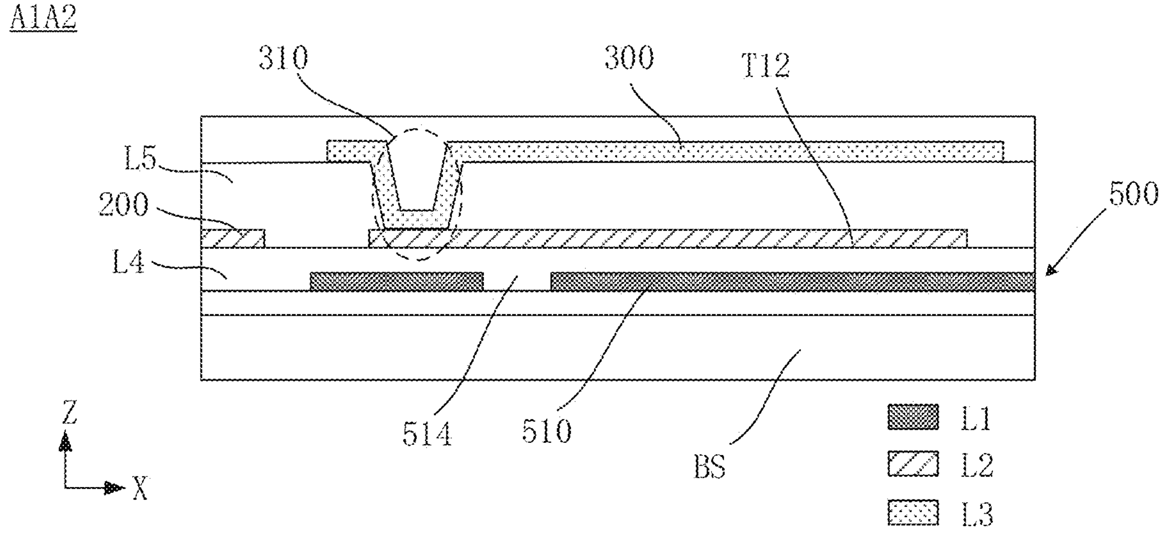
FIG. 5 is a sectional view taken along the A1A2 direction in FIG. 4.

FIG. 2 is a partial top view of an array substrate. FIG. 3 is an enlarged view of the array substrate shown in FIG. 2 at M1. FIG. 4 is an enlarged view of the array substrate shown in FIG. 3 at M2 in FIG. 3. FIG. 5 is a sectional view taken along the A1A2 direction in FIG. 4.

Referring to FIG. 2, the array substrate 10 includes a substrate, and first gate line(s) 100, a plurality of data lines 200, a plurality of first pixel electrodes 300, a plurality of first transistors T1 and a plurality of first capacitive lines 500 that are all disposed on the substrate. There may be a plurality of first gate lines 100.

The substrate may be a rigid substrate or a flexible substrate. The rigid substrate includes, for example, at least one of a glass substrate, a polymethyl methacrylate (PMMA) substrate, a quartz substrate and a metal substrate. The flexible substrate may include, for example, at least one of a polyethylene terephthalate (PET) substrate, a polyethylene naphthalate two formic acid glycol ester (PEN) substrate and a polyimide (PI) substrate.

Referring to FIGS. 3 and 4, the first gate line 100 may transmit a gate signal (also referred to as scan signal), such as a gate turn-on voltage or a gate cut-off voltage. For the convenience of description, an extending direction of the first gate line 100 is defined as a first direction X. A width direction of the first gate line 100 is perpendicular to the extending direction of the first gate line 100, and is defined as a second direction Y. The first gate line 100 has a first side S1 and a second side S2 opposite to each other in the width direction of the first gate line 100.

A material of the first gate line 100 may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr) and tantalum (Ta), or may be an alloy consisting of some of these metals.

The data line 200 may transmit a data signal (e.g., data voltage). A data line 200 (e.g., each data line 200) and the first gate line 100 cross, and are insulated from each other. An extending direction of the data line 200 and the extending direction of the first gate line 100 intersect, and have a certain included angle. For example, the extending direction of the data line 200 and the extending direction of the first gate line 100 are perpendicular to each other or substantially perpendicular to each other. For example, the extending direction of the data line 200 is perpendicular to the extending direction of the first gate line 100. For the convenience of description, the extending direction of the data line 200 is defined as the second direction Y. A material of the data line may refer to the material of the first gate line 100, and will not be repeated here.

Referring to FIGS. 4 and 5, the data line 200 and the first gate line 100 are located in different pattern layers. The first gate line 100 is located in a first pattern layer L1, and the data line 200 is located in a second pattern layer L2. There is an insulating layer (referred to as a first insulating layer herein) L4 between the first pattern layer L1 and the second pattern layer L2, so that the data line 200 is insulated from the first gate line 100. For example, the second pattern layer L2 is located on a side of the first pattern layer L1 away from the substrate BS, i.e., is located above the first gate line 100. For the convenience of description, a direction perpendicular to the substrate BS is defined as a third direction Z.

The term "pattern layer" may mean that at least one film layer is formed by a same film forming process, and then is patterned by one patterning process using a same mask to form a layer structure including specific patterns. Depending on different specific patterns, the one patterning process may include photoresist coating, exposure, development or etching processes, and the specific patterns in the formed layer structure may be continuous or discontinuous, and these specific patterns may also be at different heights or have different thicknesses. A plurality of patterns belonging to the same pattern layer may be described as being in the same layer and made of the same material.

Referring to FIGS. 3 and 4 again, the first pixel electrode 300 is configured to cooperate with a common electrode to generate an electric field, so that liquid crystal molecules in the liquid crystal layer corresponding to the first pixel electrode 300 may rotate under a drive of the electric field. A material of the first pixel electrode 300 may include a transparent conductive material such as indium tin oxide (ITO) or indium zinc oxide (IZO). A first pixel electrode 300 (e.g., each first pixel electrode 300) is located on the first side of the first gate line 100. For example, the first pixel electrode 300 is located in a sub-pixel region. For example, the first pixel electrode 300 is located on the first side of the first gate line 100, and is located on a right side of a data line 200.

Referring to FIG. 5, the first pixel electrode 300 may be located on a side of the data line 200 away from the substrate BS, which means that the first pixel electrode 300 may be located on a side of the second pattern layer L2 away from the substrate BS, i.e., located above the second pattern layer L2.

Referring to FIG. 4 again, the first transistor T1 may be a thin film transistor (TFT) or a metal-oxide-semiconductor field-effect transistor (MOSFET, MOS). For the convenience of description, a description will be made below in an example where the first transistor T1 is a TFT.

The first transistor T1 may include a gate (g) T13, a first electrode T11, and a second electrode T12. The first electrode T11 of the first transistor T1 may be a drain (d), and the second electrode T12 of the first transistor T1 is a source (s). Alternatively, the first electrode T11 of the first transistor T1 may be a source (s), and the second electrode T12 of the first transistor T1 is a drain (d). The first transistor T1 may further include a first active layer (not shown in the drawings for clearly illustrating connection relationships between transistors), and the first active layer is coupled to (e.g., in contact with) the first electrode T11 and the second electrode T12.

The gate T13, the first electrode T11 and the second electrode T12 of the first transistor T1 (e.g., each first transistor T1) are respectively coupled to the first gate line 100, the data line 200 and the first pixel electrode 300. The gate T13 of the first transistor T1 is coupled to the first gate line 100 to receive the gate signal from the first gate line 100. For example, the gate T13 of the first transistor T1 may be a portion of the first gate line 100. For example, the gate T13 of the first transistor T1 and the first gate line 100 may be in the same layer and made of the same material, and are of an integral pattern manufactured in the same process.

The first electrode T11 of the first transistor T1 is coupled to the data line 200 to receive the data signal from the data line 200. The first electrode T11 of the first transistor T1 and the data line 200 may be of an integral pattern.

Referring to FIGS. 4 and 5, the second electrode T12 of the first transistor T1 is coupled to the first pixel electrode 300. The first pixel electrode 300 and the second electrode T12 of the first transistor T1 are located in different layers. For example, the first pixel electrode 300 is located in a third pattern layer L3, the second electrode T12 of the first transistor T1 is located in the second pattern layer L2, and the third pattern layer L3 is located above the second pattern layer L2 (i.e., located on a side of the second pattern layer L2 away from the substrate BS). The third pattern layer L3 and the second pattern layer L2 have an insulating layer (referred to as a second insulating layer herein) L5 therebetween.

For example, a penetrating via hole is provided in the second insulating layer L5. During manufacturing of the first pixel electrode 300, a transparent conductive film passes through the via hole, and is lapped on the second electrode T12 of the first transistor T1. Then, the first pixel electrode 300 is manufactured by an etching process. In this way, the second electrode T12 of the first transistor T1 is coupled to the first pixel electrode 300. For the convenience of description, a coupling position of the first pixel electrode 300 and the second electrode T12 of the first transistor T1 may be referred to as a charging coupling point 310.

The gate T13 of the first transistor T1 can receive the gate signal from the first gate line 100, and the first transistor T1 is configured to be turned on in response to the gate signal received by the gate T13 being an effective voltage (i.e., gate turn-on voltage). In this case, the first active layer of the first transistor T1 is turned on, thereby transmitting the data signal from the data line 200 to the first pixel electrode 300.

Referring to FIGS. 4 and 5, the first capacitive line 500 and the first gate line 100 may belong to (i.e., be included in) the same pattern layer, such as the first pattern layer L1. For example, the first capacitive lines 500 may be in one-to-one correspondence with the first pixel electrodes 300. An orthographic projection of a first capacitive line 500 on the substrate BS is overlapped with an orthographic projection of a first pixel electrode 300 on the substrate BS. That is, at least a portion of the first capacitive line 500 and a portion of the first pixel electrode 300 are arranged opposite to each other in the third direction Z. The first capacitive line 500 and the first pixel electrode 300 have respective portions that are opposite to each other, which constitute a storage capacitor (CS). The storage capacitor may maintain a voltage on the first pixel electrode 300 for driving the liquid crystal layer. For example, the first capacitive line 500 may be a loop-shaped pattern or an approximately loop-shaped pattern (which may be a loop-shaped pattern with a break) corresponding to the first pixel electrode. A voltage applied to the first capacitive line 500 may be set according to actual needs. For example, a fixed voltage may be applied to the first capacitive line 500. Alternatively, a voltage same as the common electrode may be applied to the first capacitive line 500, and in this case, the first capacitive line 500 may be coupled to the common electrode.

Figure 6:
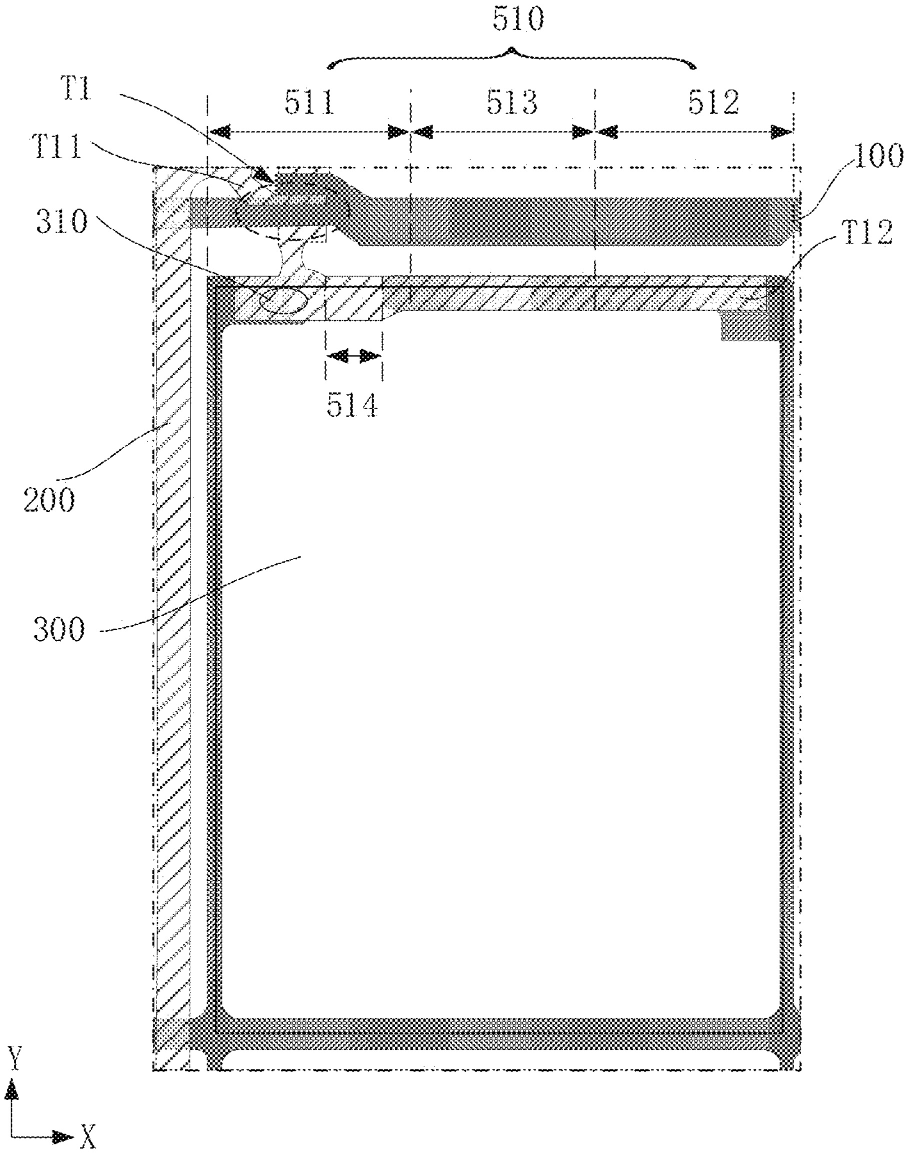
FIG. 6 is a schematic diagram showing a position and a structure of a first capacitive line in FIG. 5.

FIG. 6 is a schematic diagram showing a position and a structure of a first capacitive line in FIG. 5.

Referring to FIG. 6, the first capacitive line 500 includes a first conductive segment 510. An extending direction of the first conductive segment 510 is substantially parallel to the extending direction of the first gate line 100, i.e., is substantially parallel to the first direction X. The first conductive segment 510 is adjacent to the first gate line 100. In a case where the first capacitive line 500 includes a plurality of conductive segments, the first conductive segment 510 is closer to the first gate line 100 than other conductive segments. That is, there is no other conductive segment between the first conductive segment 510 and the first gate line 100.

The first conductive segment 510 is provided with a first break 514. The first break 514 completely cuts the first conductive segment 510 into two segments. The first break 514 is located on a side of the charging coupling point 310 away from the data line 200, and deviates from a middle subsection 513 of the first conductive segment 510.

For example, in a case where the data line 200 is located on a left side of the charging coupling point 310, the first break 514 is disposed on a right side of the charging coupling point 310.

The first conductive segment 510 as a whole includes a first subsection 511, the middle subsection 513 and a second subsection 512 arranged in sequence in the extending direction of the first conductive segment 510. The middle subsection 513 of the first conductive segment 510 is a portion of the first conductive segment 510 that is located in the middle and has a length of ⅓ of a total length. A length of the first subsection 511 is substantially equal to a length of the second subsection 512, and is half of a portion of the first conductive segment 510 except the middle subsection 513, e.g., ⅓ of the total length of the first conductive segment 510. Moreover, one of the first subsection 511 and the second subsection 512 is closer to the data line 200, and another one of the first subsection 511 and the second subsection 512 is farther from the data line 200. For example, the first subsection 511 is closer to the data line 200, and the second subsection 512 is farther from the data line 200. The first break 514 deviates from the middle subsection 513 of the first conductive segment 510, which means that the first break 514 is not in the middle subsection 513 of the first conductive segment 510, but in the first subsection 511 or the second subsection 512.

In an example, referring to FIG. 6 again, the first break 514 is located on a side of the middle subsection 513 of the first conductive segment 510 proximate to the charging coupling point 310. That is, the first break 514 is disposed in the first subsection 511. Moreover, the first break 514 is located on the right side of the charging coupling point 310. In the first direction X, the first break 514 may be located between the middle subsection 513 of the first conductive segment 510 and the charging coupling point 310.

An orthographic projection, on the substrate BS, of a portion of the first conductive segment 510 located on a side of the first break 514 away from the middle subsection 513 is overlapped with an orthographic projection of the second electrode T12 of the first transistor T1 on the substrate BS.

Based on the case shown in FIG. 6, the portion of the first conductive segment 510 located on the side of the first break 514 away from the middle subsection 513 refers to a portion of the first subsection 511 bounded by the first break 514 away from the middle subsection 513, i.e., a left portion of two portions into which the first subsection 511 is divided by the first break 514.

For example, an orthographic projection of the left portion of the first subsection 511 on the substrate BS and an orthographic projection of the second electrode T12 of the first transistor T1 on the substrate BS have an overlapping region, which is referred to as a first overlapping region. The first overlapping region may be configured to couple the first conductive segment 510 to the second electrode T12 of the first transistor T1 by welding during repair of a broken line (i.e., a broken first gate line).

For example, the first overlapping region is overlapped with (i.e., at least partially overlapped with, e.g., partially overlapped with or completely overlapped with) an orthographic projection of the charging coupling point 310 on the substrate BS. Therefore, the array substrate has an overlapping region of the orthographic projection of the first pixel electrode 300 on the substrate BS, the orthographic projection of the second electrode T12 of the first transistor T1 on the substrate BS, and the orthographic projection of the left portion of the first subsection 511 on the substrate BS. That is, the orthographic projection, on the substrate BS, of the portion of the first conductive segment 510 located on the side of the first break 514 away from the middle subsection 513, the orthographic projection of the second electrode T12 of the first transistor T1 on the substrate BS, and the orthographic projection of the first pixel electrode 300 on the substrate BS are overlapped with each other.

Based on this, after the broken line is repaired, in a thickness direction of the substrate BS, a coupling position of the first conductive segment 510 and the second electrode T12 of the first transistor T1 may be aligned or misaligned with the charging coupling point 310. In a case where the coupling position of the first conductive segment 510 and the second electrode T12 of the first transistor T1 is misaligned with the charging coupling point 310, the coupling position of the first conductive segment 510 and the second electrode T12 of the first transistor T1 may be located on a side of the charging coupling point 310 away from the first break 514 (i.e., the left side of the charging coupling point 310 in FIG. 6), which is conducive to maintaining the characteristic that the first conductive segment 510 is broken at the first break 514. In this case, a portion of the first overlapping region may be located on the side of the charging coupling point 310 away from the first break 514 (i.e., the left side of the charging coupling point 310 in FIG. 6).

For another example, the first overlapping region may be non-overlapped with the orthographic projection of the charging coupling point 310 on the substrate BS. Based on this, at least a portion (i.e., all or portion) of the first overlapping region may be located on the side of the charging coupling point 310 away from the first break 514 (i.e., the left side in FIG. 6), which facilitates the repair of the broken line on a premise of maintaining the characteristic that the first conductive segment 510 is broken at the first break 514.

Figure 7:
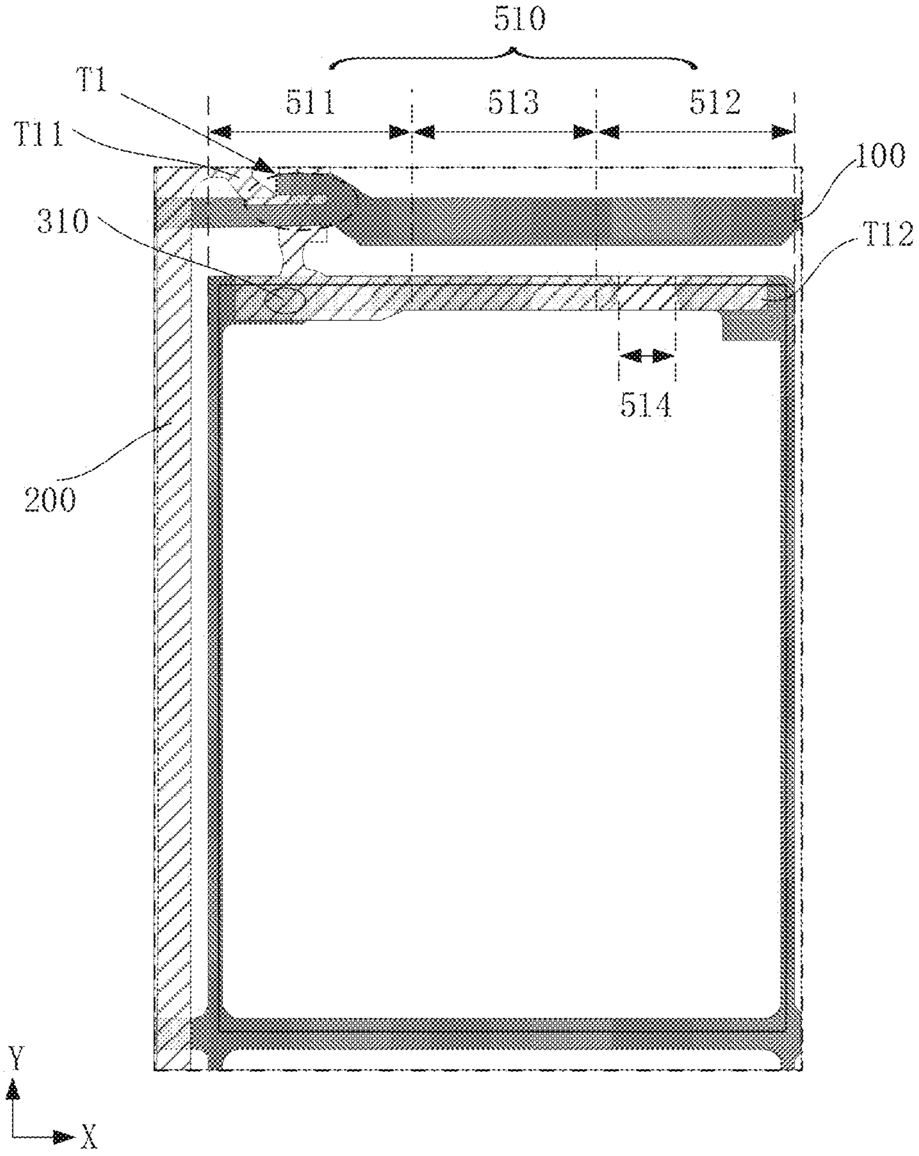
FIG. 7 is a schematic diagram showing a position and a structure of a first capacitive line, in accordance with some other embodiments.

FIG. 7 is a schematic diagram showing a position and a structure of a first capacitive line in another example.

Referring to FIG. 7, in another example, the first break 514 is disposed in the second subsection 512. The charging coupling point 310 is usually arranged adjacent to the data line 200, and the second subsection 512 is far away from the data line 200, so that the second subsection 512 is usually located on a side of the charging coupling point 310 away from the data line 200 (e.g., the right side of the charging coupling point 310).

Therefore, the first break 514 is located on the right side of the charging coupling point 310. That is, the first break 514 is located on a side of the middle subsection 513 of the first conductive segment 510 away from the charging coupling point 310.

Similar to the array substrate shown in FIG. 6, an orthographic projection, on the substrate BS, of a portion of the first conductive segment 510 located on a side of the first break 514 away from the middle subsection 513 is overlapped with the orthographic projection of the second electrode T12 of the first transistor T1 on the substrate BS.

Based on the case shown in FIG. 7, the portion of the first conductive segment 510 located on the side of the first break 514 away from the middle subsection 513 refers to a portion of the second subsection 512 bounded by the first break 514 away from the middle subsection 513, i.e., a right portion of two portions into which the second subsection 512 is divided by the first break 514.

For example, an orthographic projection of the right portion of the second subsection 512 on the substrate BS and the orthographic projection of the second electrode T12 of the first transistor T1 on the substrate BS have an overlapping region, which is referred to as a second overlapping region. The second overlapping region may be configured to couple the first conductive segment 510 to the second electrode T12 of the first transistor T1 by welding during repair of a broken line (i.e., a broken first gate line). In this case, the second electrode T12 of the first transistor T1 may extend from the charging coupling point 310 to a right side of the first break 514 in the first direction X, so as to form the second overlapping region.

In some embodiments, structures of a plurality of sub-pixel regions (e.g., all sub-pixel regions) in the array substrate may refer to FIG. 6 or 7. In this case, first gate lines 100 (e.g., each first gate line 100) are not broken, and repair is not required.

In some other embodiments, since the production process is complicated, there is at least one broken first gate line (i.e., one or more broken first gate lines, which may be referred to as broken line(s)) in the array substrate due to an influence of foreign matters in the environment or electrostatic damage. That is, each of the at least one first gate line may have a gate line break, so that the first gate line(s) each are broken at the gate line break. In this case, in a row of sub-pixels driven by the first gate line, a plurality of sub-pixels cannot realize normal display. In this case, repair may be performed by bridging. The repaired array substrate will be described in detail below.

Figure 8:
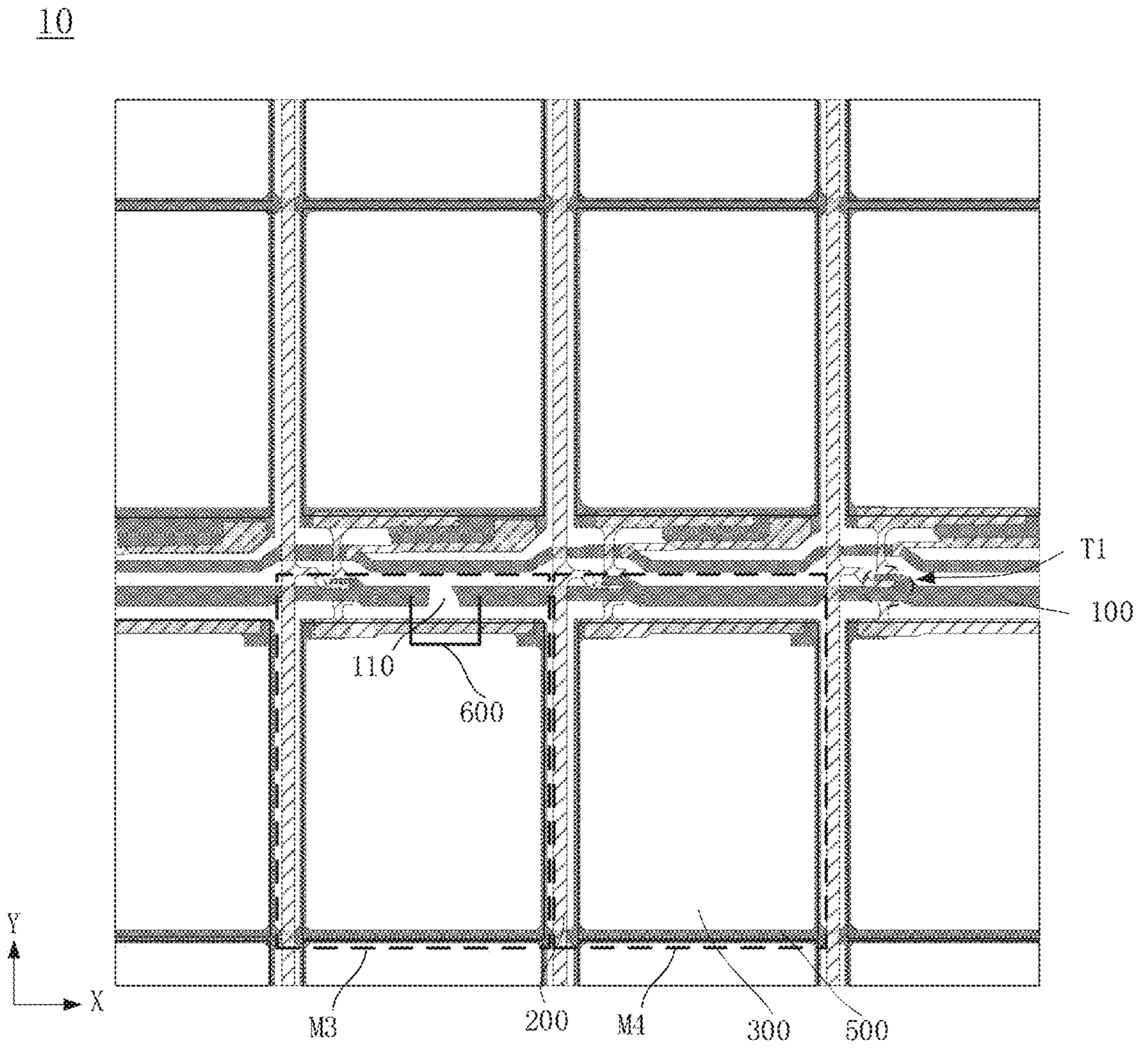
FIG. 8 is a top view of an array substrate after a broken line is repaired, in accordance with some embodiments.
Figure 9:
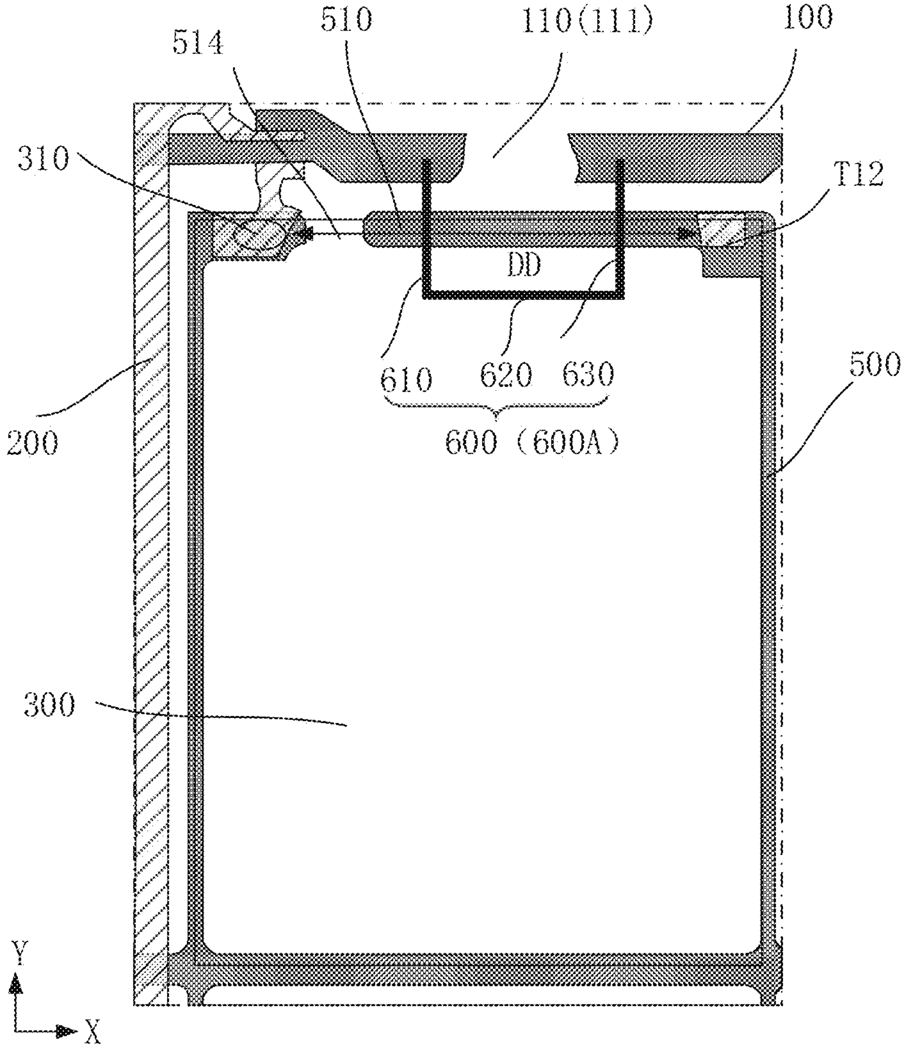
FIG. 9 is a partial enlarged view at M3 in FIG. 8.

FIG. 8 is a top view of an array substrate after a broken line is repaired. FIG. 9 is a partial enlarged view at M3 in FIG. 8. In order to make the structure shown in FIG. 9 clear, only a small portion of the second electrode T12 of the first transistor T1 is retained, and the rest shown by DD is omitted.

In a possible implementation, referring to FIG. 8, the array substrate 10 is provided with bridge(s) 600 each at a gate line break 110 of a first gate line 100 (the charging coupling point and other structures for repairing the array substrate, such as repair breaks below, are omitted in FIG. 8). The bridge 600 is a conductive line, and may include materials such as tungsten (W) and silver (Ag). In order to mitigate an adverse effect of factors causing the first gate line 100 to have the gate line break 110 on the bridge 600, the bridge 600 does not directly cover above the first gate line 100 in the extending direction (i.e., the first direction X) of the first gate line 100. The bridge 600 has two ends that are respectively connected to two sides of the gate line break 110, and bypasses a region of the gate line break 110 to restore the first gate line 100 to be conductive.

Therefore, the bridge 600 may include a plurality of bridge segments. For example, referring to FIG. 9, the bridge 600 includes a first bridge segment 610, a second bridge segment 620 and a third bridge segment 630 connected in sequence. The first bridge segment 610 is closest to the data line 200, and the third bridge segment 630 is farthest from the data line 200. The first bridge segment 610 and the third bridge segment 630 are respectively disposed on the two sides of the gate line break 110. The first bridge segment 610 and the third bridge segment 630 each have an end connected to the first gate line 100 and another end connected to the second bridge segment 620. For example, the first bridge segment 610 and the third bridge segment 630 are perpendicular to the first gate line 100, thereby bypassing the gate line break 110. Extending directions of the first bridge segment 610 and the third bridge segment 630 are different from the extending direction of the first conductive segment 510, so that crossover occurs.

Due to different lengths and distribution positions of the gate line break 110, the bridge 600 is arranged at different positions, so that the bridge 600 passes through one or more sub-pixel regions.

For example, in FIG. 9, the gate line break 110 has a short length, and is located adjacent to the middle subsection 513 of the first capacitive line 500, so that the bridge 600 may pass through only one sub-pixel region, i.e., may intersect with a single first capacitive line 500. For the convenience of description, this type of bridge 600 is designated as a first bridge 600A, and the corresponding gate line break 110 is designated as a first gate line break 111.

In this implementation, the broken first gate line 100 is repaired. If the bridge 600 is not connected to the first capacitive line 500 (for example, the bridge 600 and the first capacitive line 500 may be insulated by an insulating layer), there is little influence on the sub-pixel region where the bridge 600 is located. However, since orthographic projections of the bridge 600 and the first capacitive line 500 on the substrate BS are overlapped, the bridge 600 may be connected in series with the first capacitive line 500 (for example, no insulating layer may be provided between the bridge 600 and the first capacitive line 500, referring to FIG. 5, the bridge 600 may be disposed after the formation of the first pattern layer L1 and before the formation of the first insulating layer L4). That is, the bridge 600 and the first capacitive line 500 have the same potential, and in this case, sub-pixel regions corresponding to the first gate line 100 (i.e., first pixel electrodes 300 coupled to the first gate line 100) are affected in display. To solve this problem, the embodiments of the present disclosure further provide a plurality of examples below.

Example 1

Figure 10:
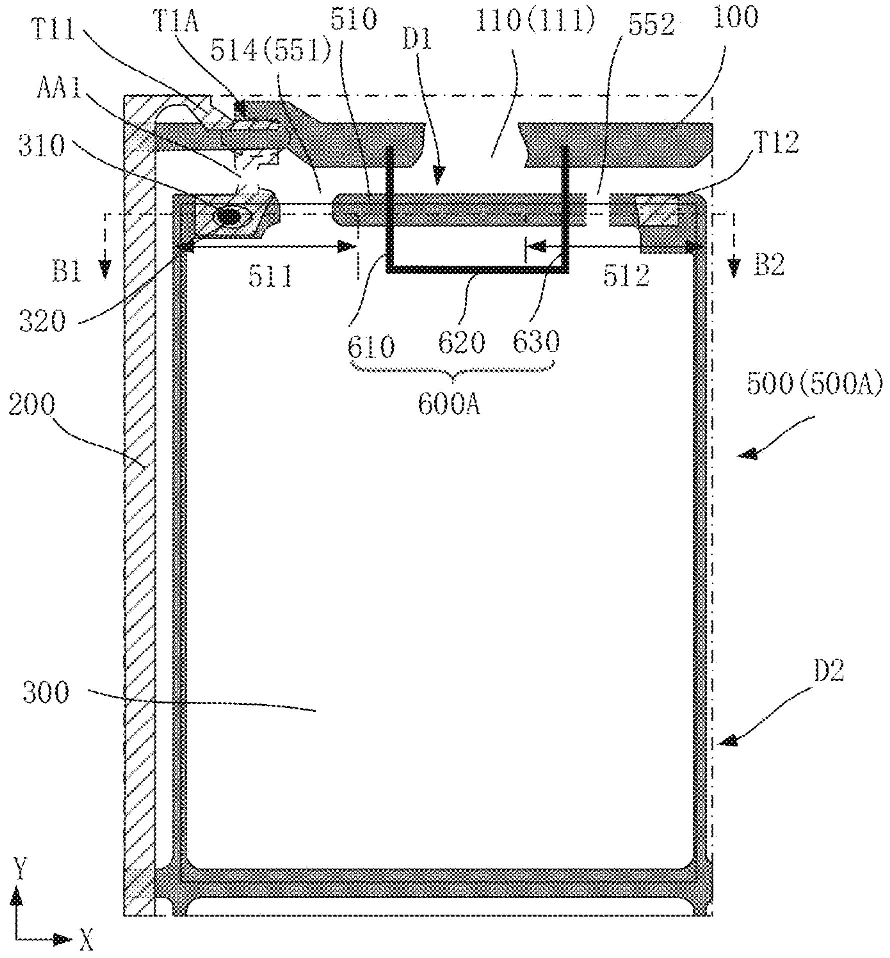
FIG. 10 is another possible enlarged view at M3 in FIG. 8, in accordance with some embodiments.
Figure 11:
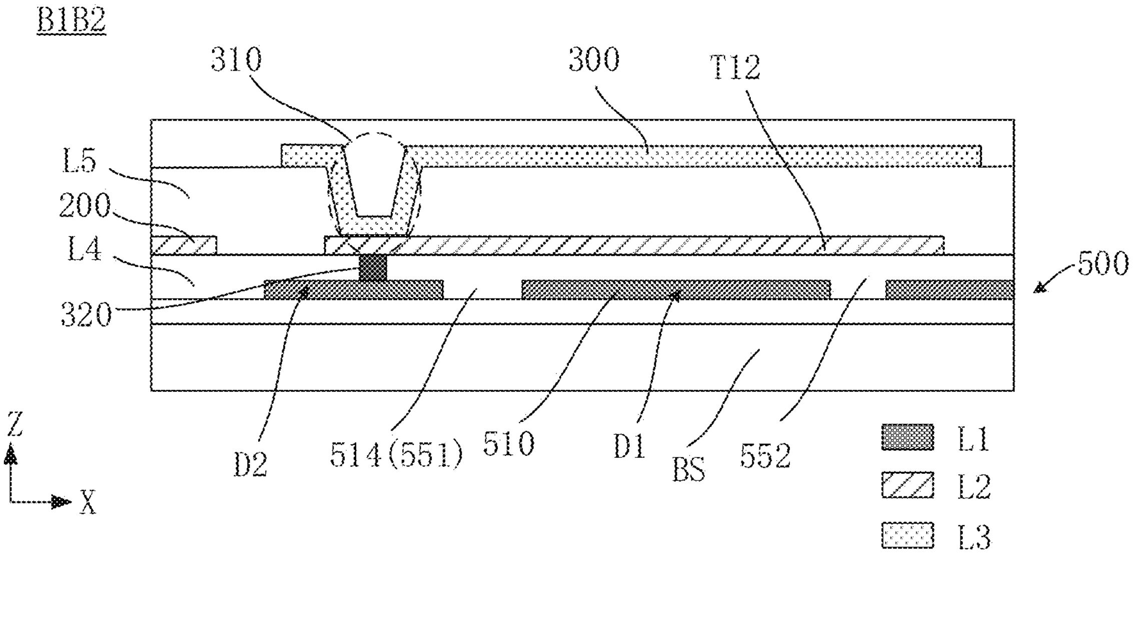
FIG. 11 is a sectional view of the array substrate shown in FIG. 10 taken along the B1B2 direction.

FIG. 10 is another possible enlarged view at M3 in FIG. 8. FIG. 11 is a sectional view taken along the B1B2 direction in FIG. 10.

Referring to FIG. 10, the first gate line 100 in the array substrate 10 has a first gate line break 111, and the array substrate 10 further includes a first bridge 600A. Two ends of the first bridge 600A are respectively connected to two sides of the first gate line break 111 of the first gate line 100. The first bridge 600A and a first repair capacitive line 500A cross. The first repair capacitive line 500A is one of first capacitive lines 500, and the first capacitive lines 500 are, for example, first capacitive lines 500 in all sub-pixel regions corresponding to the first gate line 100. All the sub-pixel regions corresponding to the first gate line 100 are sub-pixel regions where all first pixel electrodes 300 coupled to the first gate line 100 through respective first transistors are respectively located. A first capacitive line 500 in the first capacitive lines 500 closest to the first gate line break 111 is the first repair capacitive line 500A.

Since the first bridge 600A and the first repair capacitive line 500A cross (the first bridge 600A and a first conductive segment 510 of the first repair capacitive line 500A may cross), the first gate line 100 and the first repair capacitive line 500A may be conductive, and thus are short-circuited. Therefore, the first repair capacitive line 500A has a first repair break 551 and a second repair break 552 that are respectively disposed on two sides of the first bridge 600A. In this way, a portion (which is referred to as first portion D1, and the first portion D1 and the first bridge 600A may be conductive) of the first repair capacitive line 500A that crosses the first bridge 600A is cut off from other portion, so that the other portion (referred to as second portion D2 below) and the first bridge 600A are not conductive.

For example, in FIG. 10, the first repair break 551 is located in the first conductive segment 510, and one of the first repair break 551 and the second repair break 552 is a first break 514 (the first break 514 disposed in the first capacitive line 500 itself in FIG. 6 or FIG. 7, i.e., the first break 514 formed while etching to obtain the first capacitive line 500). Which of the first repair break 551 and the second repair break 552 is the first break 514 may be determined by a position and a shape of a first break in a first capacitive line 500 in a sub-pixel region corresponding to a first gate line that does not need to be repaired, or may be determined by a position and a shape of a first break in a first capacitive line 500 in a sub-pixel region (e.g., sub-pixel region M4 in FIG. 8) provided without a first bridge 600A and corresponding to the first gate line 100 that needs to be repaired.

In an example where the first break 514 is located in a first subsection 511, in a case where a distance, in the second direction Y, between the first gate line break 111 and the first break 514 is sufficient to arrange a first bridge segment 610 of the first bridge 600A, the first break 514 may be used as a repair break (e.g., the first repair break 551).

Referring to FIG. 10 again, for example, another repair break (e.g., the second repair break 552) opposite to the first break 514 may be disposed in a second subsection 512 of the first conductive segment 510. In the above case, the second repair break 552 may be machined by, for example, laser cutting.

For example, a third bridge segment 630 of the first bridge 600A is disposed at a middle subsection 513 or the second subsection 512 of the first capacitive line 500. In this case, at least a portion (portion or all) of the second subsection 512 may be away from the third bridge segment 630, and the second repair break 552 may be disposed in the at least a portion. Furthermore, on a side of the second repair break 552 away from the first bridge 600A (i.e., away from the third bridge segment 630 of the first bridge 600A), the at least a portion and the second electrode T12 of the first transistor T1 may have an opposite region (i.e., an orthographic projection of the at least a portion on the substrate is overlapped with the orthographic projection of the second electrode T12 of the first transistor T1 on the substrate), so as to perform welding in the opposite region of the at least a portion and the second electrode T12 of the first transistor T1.

A capacitor A1 is formed between the first pixel electrode 300 and two of the first portion D1 of the first repair capacitive line 500A and the first bridge 600A. Another capacitor A2 is formed between the second portion D2 of the first repair capacitive line 500A and the first pixel electrode 300. When the two capacitors are charged, a bright spot phenomenon occurs (i.e., bright spots occur in the sub-pixel region). For this abnormal display phenomenon, a darkening operation is required. For example, two electrode plates of a capacitor causing bright spots are coupled, so that voltages of the electrode plates are equal, thereby causing the capacitor to fail. Therefore, the bright spots disappear to achieve the purpose of darkening.

In some embodiments, in the first direction X, a length of the first portion D1 may be less than a length of the second portion D2. In this way, compared with the capacitor A1, the capacitor A2 has a greater influence on the appearance of the bright spots in the sub-pixel region. Therefore, the darkening operation may be selectively performed on the second portion D2. Therefore, in the embodiments of the present disclosure, the second portion D2 of the first repair capacitive line 500A and the first pixel electrode 300 in the sub-pixel region are coupled, i.e., have the same potential, thereby realizing the darkening of the sub-pixel region.

In addition, in this example, the two repair breaks 551 and 552 are located in the first conductive segment 510, which is conducive to shortening the first portion D1 of the first repair capacitive line 500A as possible and lengthening the second portion D2 as possible, so that a capacitance of the capacitor A1 is able to be reduced, and the capacitor A2 with a larger capacitance fails by the darkening operation, thereby enhancing the darkening effect of the sub-pixel region. In order to darken the sub-pixel region where the first bridge 600A is located, the connection between the first pixel electrode 300 and the data line 200 in the sub-pixel region may be disconnected, so that the data line 200 cannot provide the data signal to the first pixel electrode 300.

A first repair transistor T1A is one of the plurality of first transistors T1, and corresponds to the first repair capacitive line 500A. The first repair transistor T1A corresponds to the first repair capacitive line 500A, which means that the first pixel electrode 300 directly facing the first repair capacitive line 500A is coupled to the first repair transistor T1A.

A second electrode T12 of the first repair transistor T1A is provided with a transistor break AA1 at a position of the charging coupling point 310 proximate to a first electrode T11 of the first repair transistor T1A, so as to disconnect the first pixel electrode 300 from the data line 200. In order to make the structure shown in FIG. 10 clear, a partial structure of the second electrode T12 of the first repair transistor T1A is also omitted (the omitted portion corresponds to the portion shown by DD in FIG. 9). Hereinafter, the partial structure is omitted in other possible enlarged views at M3 in FIG. 8.

Referring to FIGS. 10 and 11, in order to couple the second portion D2 of the first repair capacitive line 500A to the first pixel electrode 300, in the array substrate, a portion of the first conductive segment 510 located on a side of the first repair break 551 away from the first bridge 600A (e.g., a left portion of the first subsection 511 of the first conductive segment 510) and the second electrode T12 of the first repair transistor T1A are coupled, e.g., may be coupled by laser welding, i.e., have respective portions that are opposite to each other (i.e., respective portions whose orthographic projections on the substrate are completely overlapped) on which the laser welding may be performed. For the convenience of description, a coupling position of the portion of the first conductive segment 510 located on the side of the first repair break 551 away from the first bridge 600A and the second electrode T12 of the first repair transistor T1A is defined as a welding coupling point 320. Since the charging coupling point 310 is located on the second portion D2 of the first repair capacitive line 500A, the second portion D2 of the first repair capacitive line 500A is coupled to the second electrode T12 of the first repair transistor T1A. Since the first pixel electrode 300 is coupled to the second electrode T12 of the first repair transistor T1A at the charging coupling point 310, the first pixel electrode 300 is coupled to the second portion D2 of the first repair capacitive line 500A, thereby causing the capacitor A2 formed by the second portion D2 of the first repair capacitive line 500A and the first pixel electrode 300 to fail, so as to realize the darkening of the sub-pixel region.

The welding coupling point 320 may be formed by any one of following methods.

For example, in Method 1, the first gate line 100 is formed, and the first gate line break 111 is found. After the second electrode T12 of the first repair transistor T1A is formed, and before the first pixel electrode 300 is formed, laser welding is performed downward at a selected welding coupling point 320, so that the second electrode T12 of the first repair transistor T1A is welded to the portion of the first conductive segment 510 located on the side of the first repair break 551 away from the first bridge 600A.

For another example, in Method 2, after the first pixel electrode 300 is formed, the formed first pixel electrode 300 has a cutout, and laser welding is performed downward at the cutout, so that the second electrode T12 of the first repair transistor T1A is welded to the portion of the first conductive segment 510 located on the side of the first repair break 551 away from the first bridge 600A. That is, a welding coupling point 320 directly facing the cutout is formed.

For yet another example, in Method 3, after the first pixel electrode 300 is formed, at a selected welding coupling point 320, the first pixel electrode 300, the second electrode T12 of the first repair transistor T1A, and the portion of the first conductive segment 510 located on the side of the first repair break 551 away from the first bridge 600A have respective portions that are opposite to each other (i.e., have respective orthographic projections on the substrate that are overlapped at the selected welding coupling point 320). Then, laser welding is performed downward to weld the respective portions thereof that are opposite to each other together.

In some possible implementations, as shown in FIG. 11, an orthographic projection of the welding coupling point 320 on the substrate is overlapped with (e.g., at least partially overlapped with) the orthographic projection of the charging coupling point 310 on the substrate. For example, the orthographic projection of the welding coupling point 320 on the substrate may be located within the orthographic projection of the charging coupling point 310 on the substrate. In this case, an area of the welding coupling point 320 is less than or equal to that of the charging coupling point 310. For example, by using Method 3 described above, the laser welding is performed downward at the charging coupling point 310, so that the first pixel electrode 300, the second electrode T12 of the first repair transistor T1A, and the second portion D2 of the first repair capacitive line 500A are welded together (i.e., coupled together), so as to form the welding coupling point 320. Since the first pixel electrode 300 and the second electrode T12 of the first repair transistor T1A are originally coupled together at the charging coupling point 310, in this method, the first pixel electrode 300, the second electrode T12 of the first repair transistor T1A, and the second portion D2 of the first repair capacitive line 500A are able to be coupled without laser breakdown of the second insulating layer L5, thereby reducing the difficulty of welding.

The second portion D2 of the first repair capacitive line 500A and the first repair transistor T1A may be coupled through one or more welding coupling points 320. A diameter of a single welding coupling point is in a range of 2.5 μm to 3.5 μm, such as 2.5 μm, 3 μm, or 3.5 μm. A welding success rate of a single welding coupling point is related to a distance, in the third direction Z, between two pattern layers to be welded. When the distance, in the third direction Z, between the two pattern layers to be welded is small, the welding success rate is high. On the contrary, when the distance, in the third direction Z, between the two pattern layers to be welded is large, the welding success rate is low.

A distance, in the third direction Z, between the third pattern layer L3 and the second pattern layer L2 is greater than a distance, in the third direction Z, between the second pattern layer L2 and the first pattern layer L1, so that a welding success rate of the third pattern layer L3 and the second pattern layer L2 is less than a welding success rate of the second pattern layer L2 and the first pattern layer L1.

In a case where the welding success rate of the single welding coupling point 320 is high, there may be one welding coupling point 320 for coupling the second portion D2 of the first repair capacitive line 500A to the first repair transistor T1A. For example, in the array substrate, laser welding is performed downward at a point position in a region where the charging coupling point 310 is located. In this way, not only the need for coupling may be satisfied, but also a sum of areas of all welding coupling points 320 for coupling the second portion D2 of the first repair capacitive line 500A to the first repair transistor T1A may be small. In a process of designing and manufacturing the array substrate, in a case where a size of the first break 514 in the first conductive segment 510 of each first capacitive line 500 is unchanged, an area of a region reserved for these welding coupling points 320 may be small, and a size of the first conductive segment 510 of the first capacitive line 500 that can be used for arranging the first bridge 600A may be large, thereby being able to adapt to repair of the first gate line break 111 with a longe size.

In a case where the welding success rate of the single welding coupling point 320 is low, the number of the welding coupling points 320 for coupling the second portion D2 of the first repair capacitive line 500A to the first repair transistor T1A may be two or more.

For example, in the array substrate, laser welding is performed downward at a plurality of positions in the region where the charging coupling point 310 is located, so as to improve an overall weld success rate.

In this example, the first break 514 is a break structure disposed in the first repair capacitive line 500 itself, and the first break 514 is used as the repair break (e.g., the first repair break 551). Thus, the number of the repair breaks arranged by machining, such as cutting, in the first repair capacitive line 500A is reduced by one, thereby improving a repair efficiency of the array substrate. Moreover, compared with the first break 514 (e.g., the first repair break 551) disposed in other conductive segment, in a case where the position of the another repair break (e.g., the second repair break 552) is unchanged, the first break 514 in the first conductive segment 510 may make the length of the first portion D1 shorter than the length of the second portion D2 in the first repair capacitive line 500A.

Thus, the influence of the first portion D1 on darkening may be reduced. In addition, in the case where the position of the another repair break (e.g., the second repair break 552) is unchanged, since the first break 514 deviates from the middle subsection of the first conductive segment 510, the portion (i.e., the first portion D1) of the first conductive segment 510 that crosses the first bridge 600A is able to be allowed to have a larger size, and accordingly, the first bridge 600A is allowed to have a larger size (in the first direction X, a length of the second bridge segment 620 may be larger), so that the first gate line break 111 with a larger size is able to be repaired.

Example 2

Figure 12:
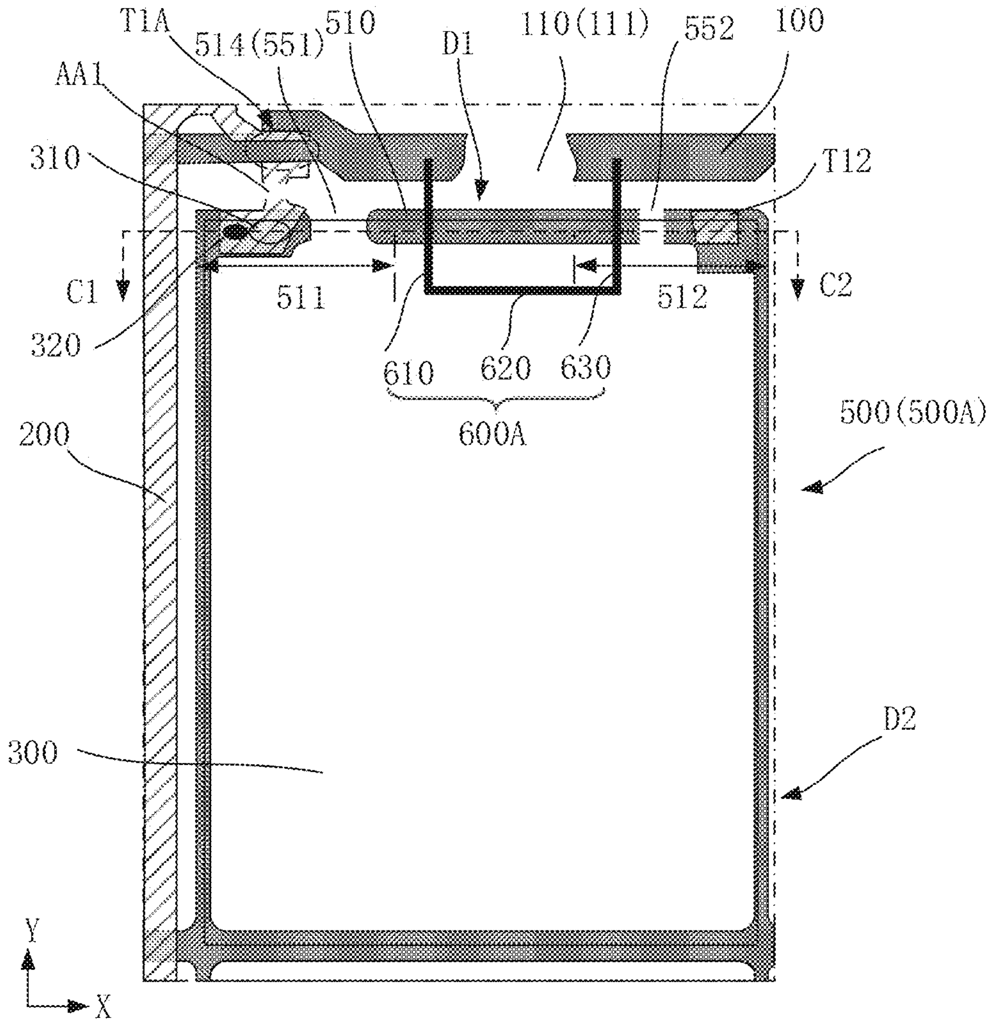
FIG. 12 is yet another possible enlarged view at M3 in FIG. 8, in accordance with some embodiments.
Figure 13:
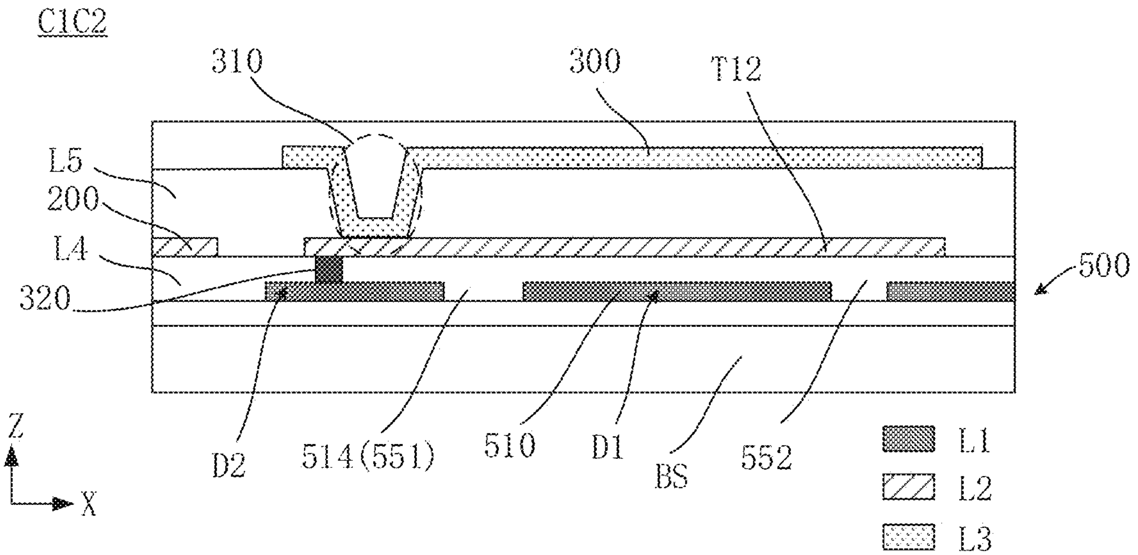
FIG. 13 is a sectional view of the array substrate shown in FIG. 12 taken along the C1C2 direction.

FIG. 12 is yet another possible enlarged view at M3 in FIG. 8. FIG. 13 is a sectional view of the array substrate shown in FIG. 12 taken along the C1C2 direction.

Referring to FIGS. 12 and 13, Example 2 gives another implementation in which the portion of the first conductive segment 510 located on the side of the first repair break 551 away from the first bridge 600A is coupled to the second electrode T12 of the first repair transistor, and other structures in the array substrate may refer to Example 1.

In this example, the first break 514 is located in the first subsection 511 of the first repair capacitive line 500A, and is used as the first repair break 551. Based on this, the welding coupling point 320 is located on the side, away from the first bridge 600A, of the first repair break 551 in the first subsection 511 of the first repair capacitive line 500A. For example, the welding coupling point 320 is located on a side of the first repair break 551 in the first subsection 511 proximate to the data line 200, i.e., located on the left portion of the first subsection 511.

For example, the orthographic projection of the welding coupling point 320 on the substrate BS is non-overlapped with the orthographic projection of the charging coupling point 310 on the Substrate BS (that is, the welding coupling point 320 and the charging coupling point 310 are staggered). In this way, the area of the welding coupling point 320 is not limited by the area of the charging coupling point 310. In this case, in an opposite region of the left portion of the first subsection 511 and the second electrode T12 of the first repair transistor T1A (i.e., a region occupied by an overlapping portion of the orthographic projection of the left portion of the first subsection 511 on the substrate and the orthographic projection of the second electrode T12 of the first repair transistor T1A on the substrate), an appropriate number of welding coupling point(s) 320 may be selected for welding. In addition, even if some positional offset errors occur at the welding coupling point 320, the coupling performance of the charging coupling point 310 is not affected, thereby reducing requirements for an accuracy of a welding process, i.e., reducing the welding difficulty.

For example, the welding coupling point 320 may be located on the side of the charging coupling point 310 on the first subsection 511 away from the first break 514 (i.e., located on the left portion of the first subsection 511), which is capable of reducing the influence of the welding on the broken characteristic of the first repair break 551.

In addition, in this example, the welding coupling point 320 may be formed with reference to any one of the three methods in Example 1. Different from Example 1, the position of the welding coupling point 320 is adjusted to be misaligned with the charging coupling point 310. FIG. 13 shows a structure in which the welding coupling point 320 is formed by using Method 1 in Example 1. In this example, the second electrode T12 of the first repair transistor T1A and the left portion of the first subsection 511 of the first repair capacitive line 500A may be welded together to realize coupling. Moreover, the first pixel electrode 300 is coupled to the second electrode T12 of the first repair transistor T1A at the charging coupling point 310. Thus, the first pixel electrode 300 is indirectly coupled to the second portion D2 of the first repair capacitive line 500A, so that potentials of the first pixel electrode 300 and the second portion D2 of the first repair capacitive line 500A are equal, thereby realizing darkening of the sub-pixel region. In addition, other effects that can be achieved by this example are the same as those of Example 1, and will not be repeated here.

Example 3

Figure 14:
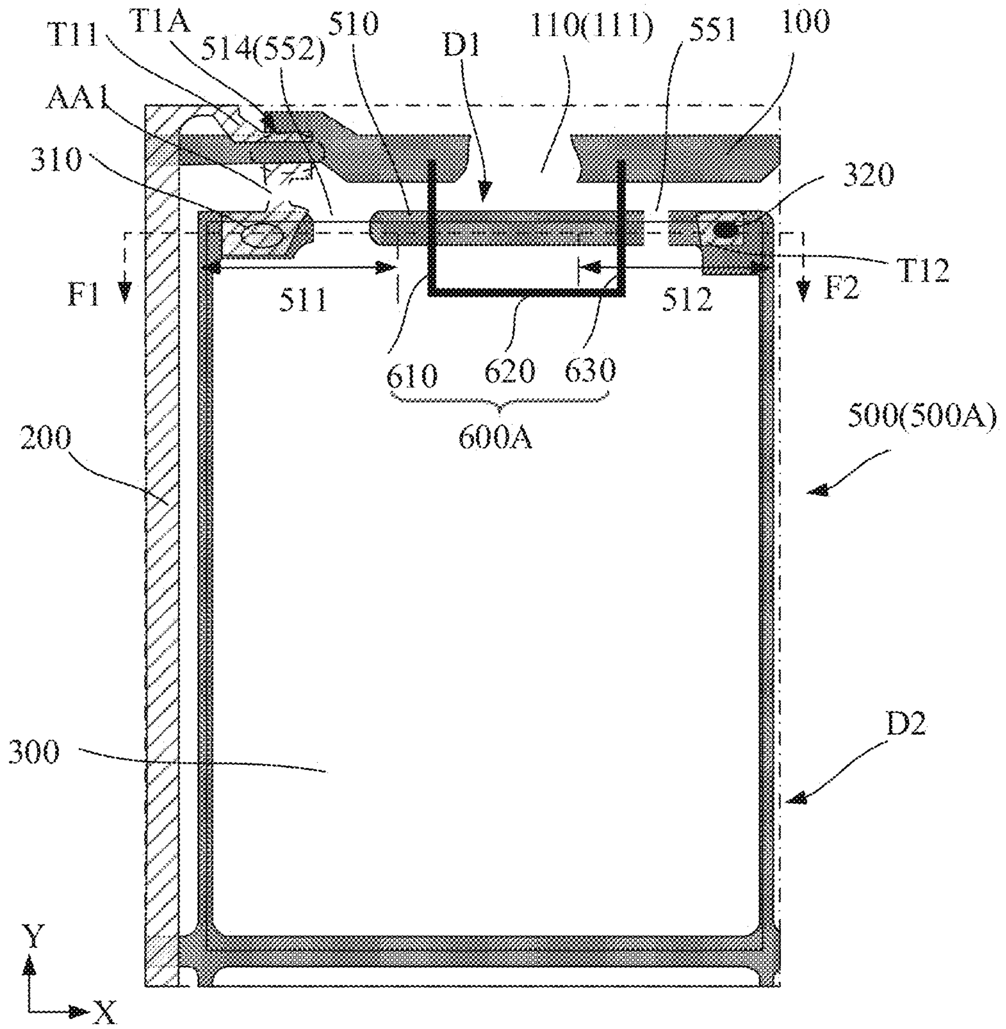
FIG. 14 is yet another possible enlarged view at M3 in FIG. 8, in accordance with some embodiments.
Figure 15:
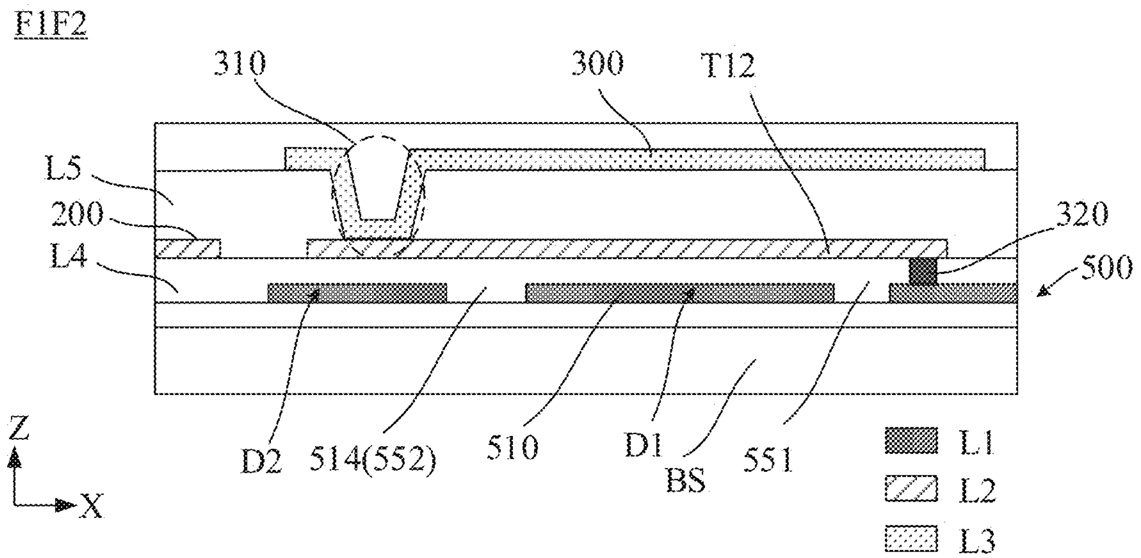
FIG. 15 is a sectional view of the array substrate shown in FIG. 14 taken along the F1F2 direction.

FIG. 14 is yet another possible enlarged view at M3 in FIG. 8. FIG. 15 is a sectional view of the array substrate shown in FIG. 14 taken along the F1F2 direction.

Referring to FIGS. 14 and 15, Example 3 gives yet another implementation in which the portion of the first conductive segment 510 located on the side of the first repair break 551 away from the first bridge 600A is coupled to (e.g., in contact with) the second electrode T12 of the first repair transistor T1A, and other structures in the array substrate may refer to Example 1.

In this example, the first break 514 is located in the first subsection 511 of the first repair capacitive line 500A, and is used as the second repair break 552. In this case, the first repair break 551 may be formed in the first conductive segment 510 by laser cutting during the repair process, and the first repair break 551 is farther from the data line 300 than the second repair break 552. In this case, the first repair break 551 may be disposed in the middle subsection 513 or the second subsection 512 of the first conductive segment 510 according to a length of the first bridge 600A in the first direction X.

Based on this, the welding coupling point 320 is located on the side of the first repair break 551 in the first conductive segment 510 away from the first bridge 600A, which means that the welding coupling point 320 is located on a right side of the first bridge 600A on the first conductive segment 510, i.e., located on a side of the first bridge 600A away from the data line 200 on the first conductive segment 510. In this case, the welding coupling point 320 and the charging coupling point 310 are respectively disposed on the two sides of the first bridge 600A, so that the welding coupling point 320 does not affect the electrical connection performance of the charging coupling point 310. Therefore, in a process of forming the welding coupling point 320, a large positional offset error is able to be allowed, thereby reducing the requirements for the accuracy of the welding process, i.e., reducing the welding difficulty.

In addition, in this example, the welding coupling point 320 may be formed with reference to any one of the three methods in Example 1. Different from Example 1, the position of the welding coupling point 320 is adjusted to be misaligned with the charging coupling point 310. FIG. 15 shows a structure in which the welding coupling point 320 is formed by using Method 1 in Example 1.

In this example, the second electrode T12 of the first repair transistor T1A and the second portion D2 of the first repair capacitive line 500A are welded together at the welding coupling point 320, so as to realize coupling. Moreover, the first pixel electrode 300 is coupled to the second electrode T12 of the first repair transistor T1A at the charging coupling point 310. Thus, the first pixel electrode 300 is indirectly coupled to the second portion D2 of the first repair capacitive line 500A, so that potentials of the first pixel electrode 300 and the second portion D2 of the first repair capacitive line 500A are equal, thereby realizing darkening of the sub-pixel region. In addition, other effects that can be achieved by this example are the same as those of Example 1, and will not be repeated here.

Example 4

In order to facilitate the arrangement of repair breaks formed by cutting in the first conductive segment, the present example provides another array substrate.

Figure 16A:
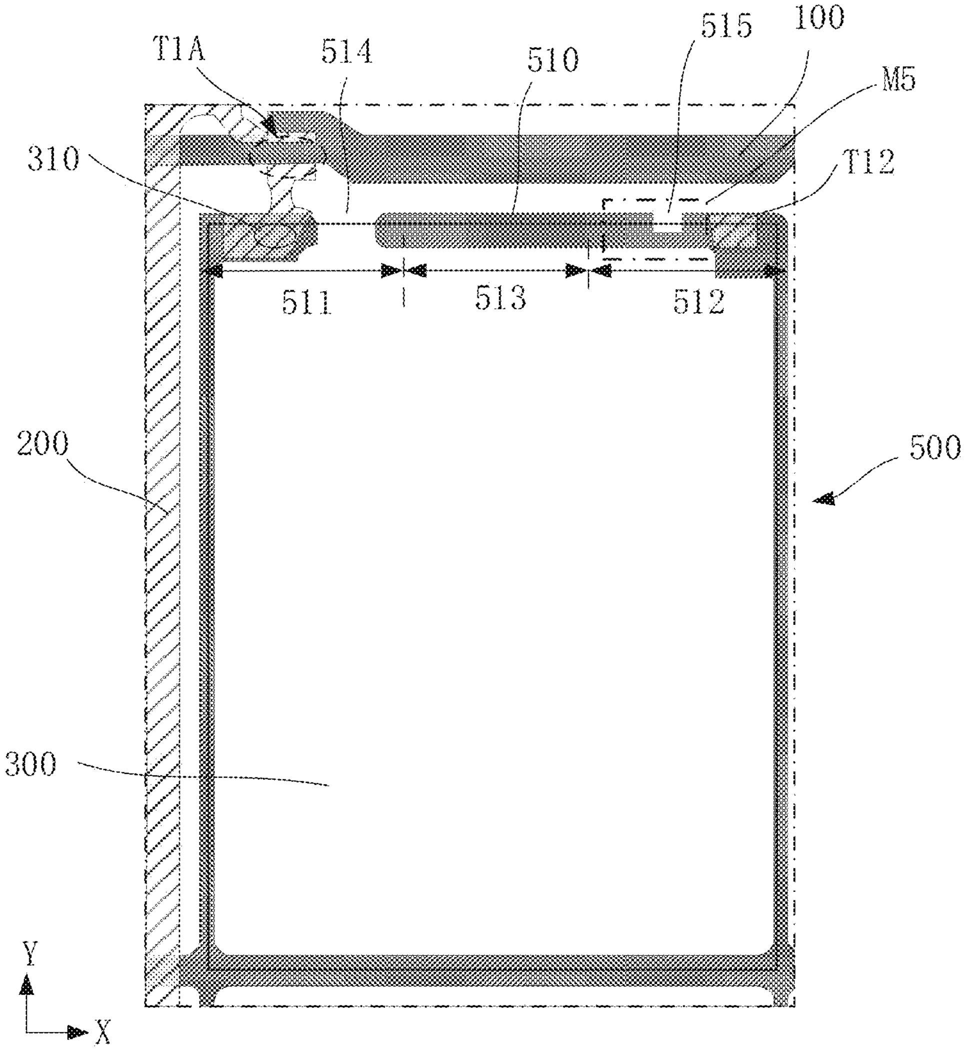
FIG. 16A is another possible enlarged view at M2 in FIG. 3, in accordance with some embodiments.

FIG. 16A is another possible enlarged view at M2 in FIG. 3.

In some possible implementations, the array substrate provided in this example may have no broken first gate line 100, and in this case, shapes of the first capacitive lines 500 in the plurality of sub-pixel regions in the array substrate may refer to FIG. 16A.

In some other possible implementations, the array substrate provided in this example has at least one broken first gate line 100, and in this case, shape(s) of first capacitive line(s) 500 in sub-pixel region(s) (at least one sub-pixel region, i.e., sub-pixel region(s) except sub-pixel region(s) where broken portion(s) of the first gate line(s) 100 are located) in the array substrate may refer to FIG. 16A. For example, the first capacitive line 500 shown in FIG. 16A may replace the first capacitive line 500 in the sub-pixel region M4 in FIG. 8. Referring to FIG. 16A, embodiments of the present disclosure provide the array substrate in which the first conductive segment 510 is provided with a recess 515 whose opening faces the first gate line 100 or faces away from the first gate line 100. As an example, FIG. 16A shows that the opening of the recess 515 faces the first gate line 100. FIG. 16A is based on FIG. 4 with the addition of the recess 515, and other features are the same as the embodiments corresponding to FIG. 4, which will not be repeated.

The recess 515 functions to facilitate the first conductive segment 510 to be cut off at the recess 515, thereby serving as the repair break in the repair process of the broken line.

Therefore, in a case where the array substrate does not need to be repaired, or in a case where the array substrate needs to be repaired but the repair break is not disposed at the recess 515 of the first conductive segment 510, the recess 515 of the first conductive segment 510 may not be cut off.

The recess 515 may be recessed substantially in the width direction (e.g., the second direction Y) of the first gate line 100. For example, a depth direction of the recess 515 is substantially perpendicular to the extending direction (e.g., the first direction X) of the first gate line 100. The recess 515 may not be specifically limited in shape, and may be, for example, a rectangular recess or an arc-shaped recess.

The repair break (e.g., the second repair break 552 in FIG. 10 or 12 or the first repair break 551 in FIG. 14) may be disposed at the recess 515 of the first conductive segment 510. Since a width of the first conductive segment 510 at the recess 515 is narrow, the recess 515 is easy to be cut off, so that the cutting efficiency may be improved, and the repair efficiency of the array substrate may also be improved. In addition, for example, laser with low energy may be used for cutting, thereby reducing a possible influence on elements (e.g., the first gate line 100 or the third bridge segment 630 affecting the first bridge 600A) adjacent to the recess 515 during the cutting process. For another example, laser with narrow beam may be used for cutting, which also reduces the possible influence on the elements adjacent to the recess 515 during the cutting process. In a case where the opening of the recess 515 faces the first gate line 100, a distance, in the second direction Y, between the first conductive segment 510 and the first gate line 100 at the recess 515 is increased, which may further reduce the influence on the first gate line 100 when the first conductive segment 510 is cut off at the recess 515.

The recess 515 and the first break 514 are respectively disposed on two sides of the middle subsection 513. That is, the recess 515 and the first break 514 are respectively located in the first subsection 511 and the second subsection 512 of the first conductive segment 510. For example, the recess 515 is located in the first subsection 511, and the first break 514 is located in the second subsection 512. For another example, as shown in FIG. 16A, the recess 515 is located in the second subsection 512, and the first break 514 is located in the first subsection 511.

Referring to FIG. 16A again, in this example, the first break 514 is located in the first subsection 511, and thus the recess 515 is located in the second subsection 512.

After the first gate line 100 is broken, the first conductive segment 510 may be cut off at the recess 515 to form a repair break, and the first break 514 is used as another repair break to obtain the repaired structure similar to that shown in FIG. 10, 12 or 14. Since the two repair breaks are located in the first conductive segment 510, the length of the first portion D1 of the first capacitive line 500 may be further reduced, so that the length of the second portion D2 is longer.

In some embodiments, an orthographic projection, on the substrate, of a portion of the first conductive segment 510 located on a side of the recess 515 away from the middle subsection 513 is overlapped with the orthographic projection of the second electrode T12 of the first transistor T1 on the substrate. In this case, when repair of a broken line is required, the recess 515 may be cut off to form the first repair break, so that a portion of the first conductive segment 510 located on a side of the first repair break away from the middle subsection 513 may be coupled to the second electrode T12 of the first repair transistor (i.e., first transistor T1).

Figure 16B:
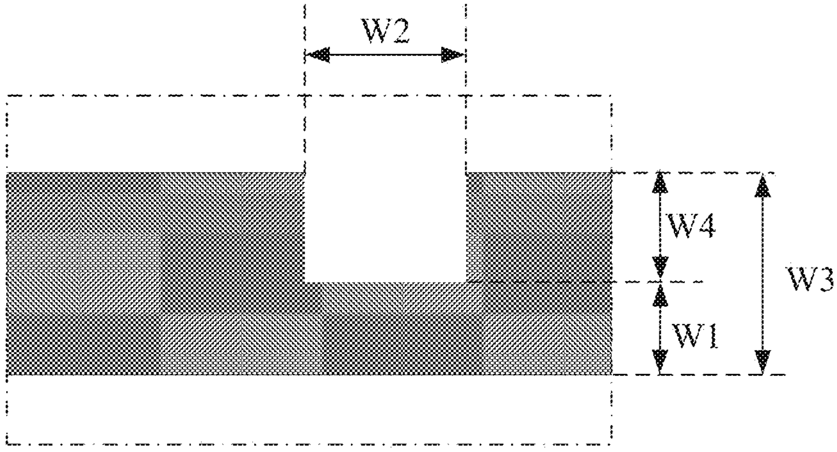
FIG. 16B is an enlarged view at M5 in FIG. 16A.

FIG. 16B is a partial enlarged view at M5 in FIG. 16A.

Referring to FIG. 16B, a portion of the first conductive segment 510 located below the recess 515 is a retained portion of the first conductive segment 510. A width W1 of the retained portion in the second direction Y affects the performance of the first conductive segment 510 and the performance of the array substrate 10 to some extent, and/or a width W2 of the opening of the recess 515 in the first direction X affects the performance of the first conductive segment 510 and the performance of the array substrate 10 to some extent. For example, at the recess 515, in the second direction Y, a ratio of the width W1 of the retained portion of the first conductive segment 510 to a width W3 of the first conductive segment 510 is in a range of ⅓ to ½, inclusive. For example, the width W2 of the opening of the recess 515 is in a range of 7.5 μm to 8.5 μm, inclusive. For another example, the ratio of the width W1 of the retained portion of the first conductive segment 510 to the width W3 of the first conductive segment 510 is in the range of ⅓ to ½, inclusive, and the width W2 of the opening of the recess 515 is in the range of 7.5 μm to 8.5 μm, inclusive.

The width W3 of the first conductive segment 510 is a width of the first conductive segment 510 without the recess 515, which can be calculated by adding a depth W4 of the recess 515 in the second direction Y and the width W1 of the retained portion, or can be obtained by measuring a width of a position of the first conductive segment 510 that is adjacent to the recess 515 in a case where the width of the first conductive segment 510 is substantially the same or changes little everywhere in the extending direction of the first conductive segment 510.

The width W3 of the first conductive segment 510 may be in a range of 11.0 μm to 15.0 μm, inclusive, such as 11.2 μm, 13.4 μm, 14.6 μm, or 15.0 μm. Thus, the width W3 of the first conductive segment 510 is large, and the first conductive segment 510 has a large space to arrange the charging coupling point 310 and the welding coupling point 320.

Laser welding is performed downward to form the welding coupling point 320 above the first capacitive line 500 after the first capacitive line 500 is formed. The diameter of the single welding coupling point 320 is in the range of 2.5 μm to 3.5 μm, inclusive, and the width W3 of the first conductive segment 510 is twice or more than twice the diameter of the single welding coupling point 320. Thus, the first conductive segment 510 has a large space to arrange the welding coupling point 320, and the welding coupling point 320 does not easily deviate from the first conductive segment 510, which is conducive to improving the welding success rate and reducing requirements for the positioning accuracy during laser welding, thereby reducing the processing difficulty.

In a case where the ratio of the width W1 of the retained portion of the first conductive segment 510 to the width W3 of the first conductive segment 510 is in the range of ⅓ to ½, inclusive, the width W1 of the retained portion of the first conductive segment 510 is appropriate. For example, the width W1 of the retained portion is in a range of 3.7 μm to 8.5 μm, inclusive, such as 3.7 μm, 6.2 μm, 7.8 μm or 8.5 μm. Thus, the retained portion of the first conductive segment 510 is easy to be cut off, has a high strength and is not easy to be broken, and has an appropriate resistance value.

In a case where the width of the opening of the recess 515 is in the range of 7.5 μm to 8.5 μm, inclusive, the recess 515 has an appropriate width, which facilitates alignment of laser with the recess 515 to cut off the retained portion. Moreover, the retained portion has an appropriate length, so that the retained portion has a high strength, and is not easy to be broken.

Referring to FIG. 16A, in some embodiments, the portion of the first conductive segment 510 located on the side of the first break 514 away from the middle subsection 513 has a length of greater than or equal to 15 μm. For example, in FIG. 16A, the first break 514 is located in the first subsection 511 of the first conductive segment 510, and in this case, the left portion of the first subsection 511 (see Example 1 or Example 2) may have a welding space for arranging the welding coupling point(s). For another example, the first break 514 may be located in the second subsection 512 of the first conductive segment 510, and in this case, the portion of the second subsection 512 located on the right side of the first break 514 may have a welding space for arranging the welding coupling point(s).

In this example, the diameter of the single welding coupling point is in the range of 2.5 μm to 3.5 μm, inclusive, and the welding space in the first conductive segment 510 is able to allow for at least two welding coupling points, thereby increasing the welding success rate of the portion of the first conductive segment 510 located on the side of the first break 514 away from the middle subsection 513 and the second electrode T12 of the first transistor T1.

It can be understood that, in a case where the first break 514 is located in the second subsection 512, on a premise that the right portion of the second subsection 512 serves as the welding space to meet the requirement for the welding success rate, a length of the right portion of the second subsection 512 is as small as possible, i.e., the first break 514 is positioned as far to the right as possible in the first conductive segment 510. Thus, the size of the first conductive segment 510 of the first capacitive line 500 that can be used for arranging the first bridge 600A may be large, so as to adapt to the repair of the first gate line break 111 with a longer size.

Similarly, referring to FIG. 16A, in a case where the first break 514 is located in the first subsection 511, on a premise that the left portion of the first subsection 511 serves as the welding space to meet the requirement for the welding success rate, a length of the left portion of the first subsection 511 is as small as possible, i.e., the first break 514 is positioned as far to the left as possible in the first conductive segment 510. Thus, the size of the first conductive segment 510 of the first capacitive line 500 that can be used for arranging the first bridge 600A may be large, so as to adapt to the repair of the first gate line break 111 with a longer size.

Referring to FIG. 16A, in some other embodiments, the portion of the first conductive segment 510 located on a side of the recess 515 away from the middle subsection 513 has a length of greater than or equal to 15 μm.

For example, in FIG. 16A, the first break 514 is located in the first subsection 511 of the first conductive segment 510, and in this case, the portion of the first conductive segment 510 located on the side of the recess 515 away from the middle subsection 513 is a portion of the second subsection 512 located on a right side of the recess 515, which may have the welding space for arranging the welding coupling point(s) (see Example 3).

For another example, the first break 514 may be located in the second subsection 512 of the first conductive segment 510, and in this case, the portion of the first conductive segment 510 located on the side of the recess 515 away from the middle subsection 513 is a portion of the first subsection 511 located on a left side of the recess 515, which may have the welding space for arranging the welding coupling point(s) (see Example 1 or Example 2).

Effects of this example may refer to the effects of the case that the length of the portion of the first conductive segment 510 located on the side of the first break 514 away from the middle subsection 513 is greater than or equal to 15 μm.

Example 5

Figure 17:
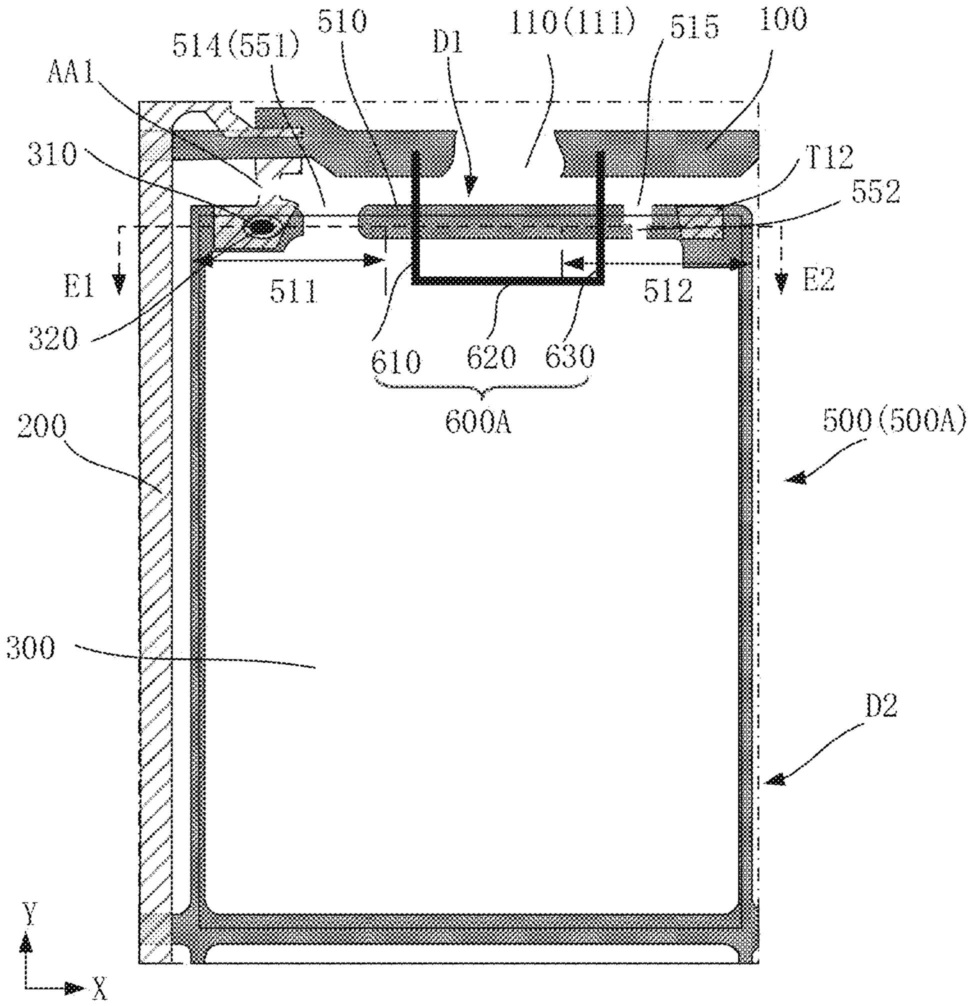
FIG. 17 is yet another possible enlarged view at M3 in FIG. 8, in accordance with some embodiments.
Figure 18:
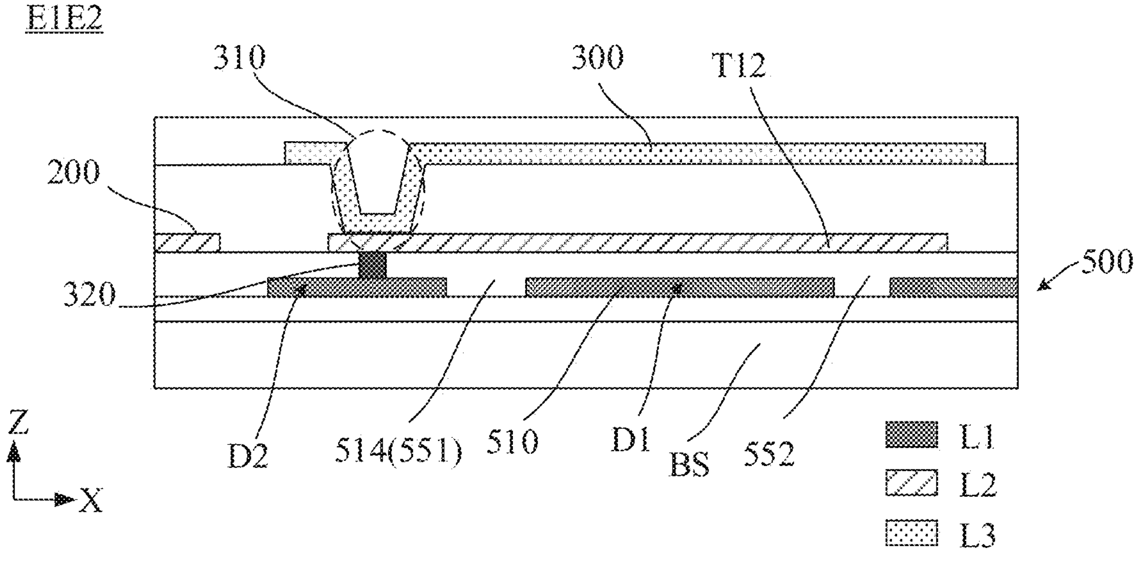
FIG. 18 is a sectional view of the array substrate shown in FIG. 17 taken along the E1E2 direction.

FIG. 17 is yet another possible enlarged view at M3 in FIG. 8. FIG. 18 is a sectional view of the array substrate shown in FIG. 17 taken along the E1E2 direction. Referring to FIGS. 17 and 18, the present example provides an array substrate having at least one broken first gate line 100. The array substrate is based on the structure of the sub-pixel region shown in FIG. 16A, and the broken first gate line 100 is repaired.

As in the above embodiments (e.g., Example 1, Example 2 or Example 3), it is necessary to arrange a first bridge 600A to repair the first gate line 100, and a first capacitive line 500 in a sub-pixel region where the first bridge 600A is located is referred to as a first repair capacitive line 500A. The first repair capacitive line 500A has a first repair break 551 and a second repair break 552 respectively disposed on two sides of the first bridge 600A, and the first repair break 551 is located in the first conductive segment 510. One of the first repair break 551 and the second repair break 552 is a first break 514. The first repair break 551 and the second repair break 552 divide the first repair capacitive line 500A into a first portion D1 and a second portion D2. The second portion D2 is coupled to the first pixel electrode 300 to form a welding coupling point 320.

FIG. 17 or 18 shows the welding coupling point 320 formed with reference to Example 1 described above. The formation of the welding coupling point 320 may also refer to Example 2 or Example 3 described above, and will not be repeated here. Other structures in the sub-pixel region may also refer to Example 1, Example 2 or Example 3 described above.

Unlike these examples, the first repair capacitive line 500A includes a recess 515 in the first conductive segment 510. A position and a size of the recess 515 may refer to Example 4.

In addition, as described above, one of the first repair break 551 and the second repair break 552 is the first break 514, and then, another one of the first repair break 551 and the second repair break 552 may be located at the recess 515 of the first repair capacitive line 500A. For example, the retained portion at the recess 515 of the first conductive segment 510 is cut off by laser to form a repair break. In this way, the retained portion is easier to be cut off, and other elements are less likely to be damaged. In this case, since the first break 514 serving as a repair break and another repair break formed at the recess 515 are both located in the first conductive segment 510, the length of the first portion D1 may less than the length of the second portion D2, which is conducive to the darkening effect of the sub-pixel region.

For example, in FIG. 17, the first break 514 is located in the first subsection 511, and may be used as the first repair break 551. The recess 515 is located in the second subsection 512, and the repair break formed at the recess 515 may be used as the second repair break 552. It will be noted that, if a size of a break point for cutting the retained portion at the recess 515 is close to the width of the opening of the recess 515, it is difficult to distinguish whether the second repair break 552 is located at the recess 515 only by viewing the structures in the sub-pixel region. In this case, the position of the second repair break 552 may be determined in combination with a position of a recess 515 in a sub-pixel region without a bridge.

Effects of the array substrate in this example are the same as those of Example 1, and will not be repeated here.

In each of the above embodiments, for example, referring to FIG. 14 or FIG. 17, in the array substrate in which the broken line is repaired, the first repair break 551 and the second repair break 552 are disposed in the first conductive segment 510, one of the first repair break 551 and the second repair break 552 is the first break 514, and another one of the first repair break 551 and the second repair break 552 needs to be formed by cutting. In some cases, referring to FIG. 17, in a case where the first gate line break 110 has a large size, the first bridge 600A has a large size in the first direction X in this case.

For example, the third bridge segment 630 of the first bridge 600A may need to be moved to the right side of the recess 515, and in this case, the first conductive segment does not have a sufficient space to arrange the second repair break at the right side of the recess 515.

Figure 19:
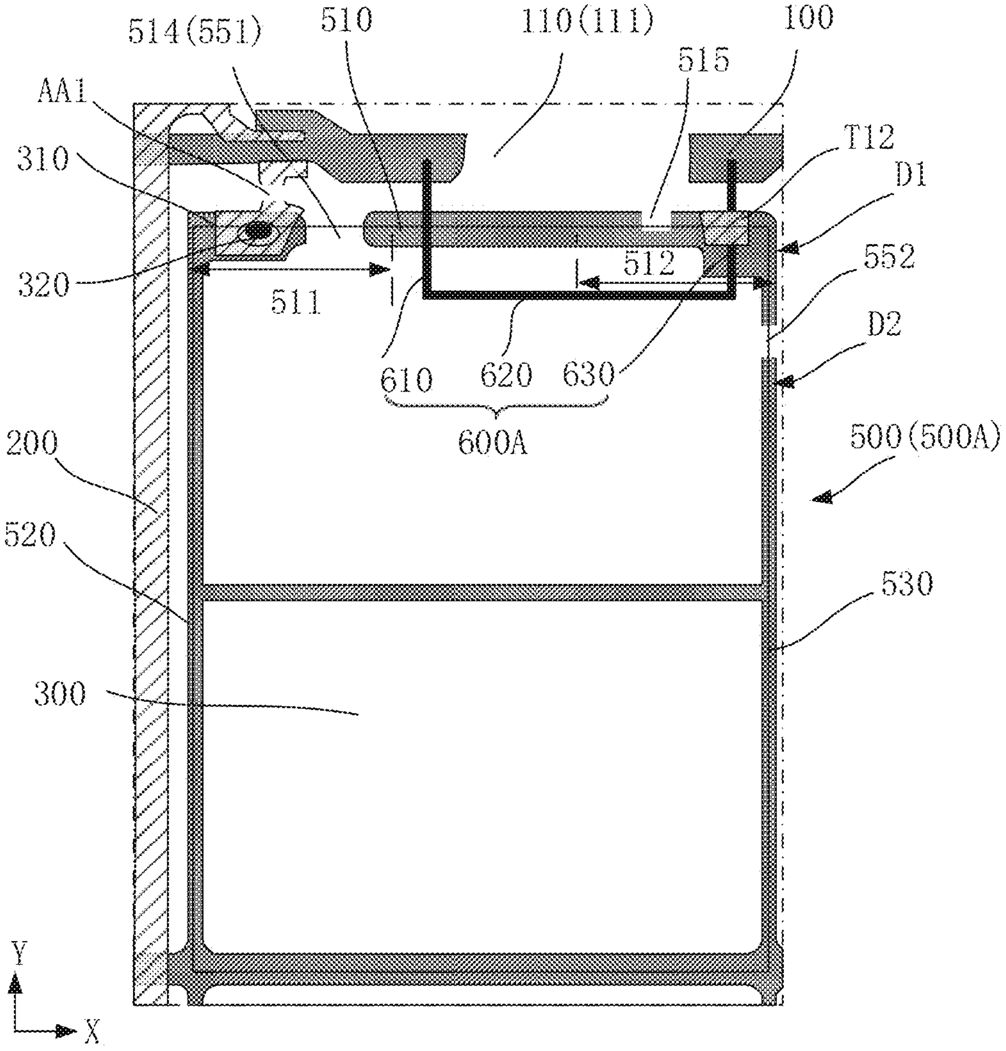
FIG. 19 is yet another possible enlarged view at M3 in FIG. 8, in accordance with some embodiments.

To solve this problem, embodiments of the present disclosure further provide yet another array substrate, see FIG. 19. FIG. 19 is yet another possible enlarged view at M3 in FIG. 8. Compared with FIG. 17, in the present example, a specific position of the first bridge 600A is adjusted. Based on this, the first break 514 is used as the first repair break 551, and the second repair break 552 is moved from the second subsection 512 to another conductive segment of the first repair capacitive line 500A.

Referring to FIG. 19 again, the first repair capacitive line 500A further includes a second conductive segment 520 and a third conductive segment 530. The second conductive segment 520 is connected to an end of the first conductive segment 510 located at the first subsection 511, and the third conductive segment 530 is connected to an end of the first conductive segment 510 located at the second subsection 512. In this case, the second repair break 552 may be located in one of the second conductive segment 520 and the third conductive segment 530 that is farther from the first break 514.

Widths of the first conductive segment 510, the second conductive segment 520 and the third conductive segment 530 may be the same or different. The width of the second conductive segment 520 is a length of the second conductive segment 520 in a direction perpendicular to an extending direction of the second conductive segment 520.

The width of the third conductive segment 530 is a length of the third conductive segment 530 in a direction perpendicular to an extending direction of the third conductive segment 530.

Since the charging coupling point 310 and the welding coupling point are not required to be disposed in the second conductive segment 520 and the third conductive segment 530, and the repair break may need to be formed by cutting during the repair of the array substrate, the width of the second conductive segment 520 and the width of the third conductive segment 530 may be set to be narrow. In some embodiments, the width of the second conductive segment 520 and the width of the third conductive segment 530 may be the same, and are less than the width of the first conductive segment 510. For example, the width of the second conductive segment 520 and the width of the third conductive segment 530 may be equal to the width of the retained portion of the first conductive segment 510, e.g., may be in a range of 6 μm to 8 μm, inclusive. Thus, each of the second conductive segment 520 and the third conductive segment 530 is easy to be cut off, has a high strength and is not easy to be broken, and has an appropriate resistance value.

In the present example, the second repair break 552 is disposed in the third conductive segment 530, and a specific arrangement may refer to the method of disposing the first repair break 551 in the first conductive segment 510 by cutting, and will not be repeated here.

Thus, the first repair break 551 and the second repair break 552 are respectively located on the two sides of the first bridge 600A, and the first repair capacitive line 500A is also divided into two portions, i.e., a first portion D1 crossing the first bridge 600A and a second portion D2 coupled to the first pixel electrode 300 with reference to Example 1 or Example 2.

Effects of the array substrate in the present embodiment are the same as those of Example 1, and will not be repeated here.

Figure 20:
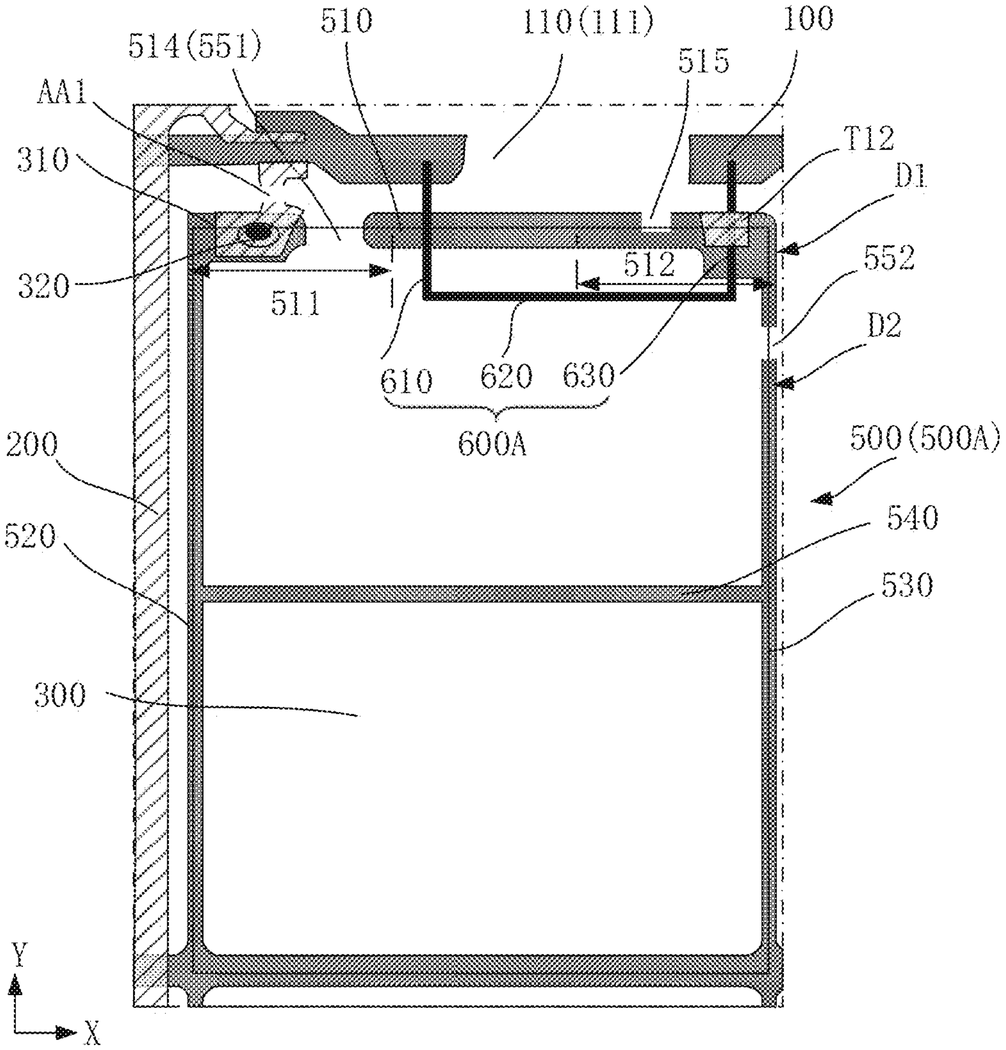
FIG. 20 is yet another possible enlarged view at M3 in FIG. 8, in accordance with some embodiments.

FIG. 20 is yet another possible enlarged view at M3 in FIG. 8. Referring to FIG. 20, in some other embodiments, the first repair capacitive line 500A further includes a fourth conductive segment 540. The fourth conductive segment 540 is substantially parallel to the first conductive segment 510, and is disposed between the second conductive segment 520 and the third conductive segment 530. For example, an end of the fourth conductive segment 540 is connected to a midpoint of the second conductive segment 520, and another end of the fourth conductive segment 540 is connected to a midpoint of the third conductive segment 530. The fourth conductive segment 540 may increase a capacitance value between the first repair capacitive line 500A and the first pixel electrode 300. A width of the fourth conductive segment 540 may refer to the width of the second conductive segment 520 and the width of the third conductive segment 530, and will not be repeated here.

Thus, in the sub-pixel region corresponding to the first gate line that does not need to be repaired in the array substrate, a voltage between the first capacitive line 500 and the first pixel electrode 300 may be well maintained, thereby driving the liquid crystal layer 30 to operate.

Example 6

Examples 1 to 5 each provide a technical solution in which the first break is used as the repair break. For example, referring to FIG. 14, the first break 514 is used as the second repair break 552 in the sub-pixel region of the array substrate. The present example will describe a case that the first break 514 is not used as a repair break.

Figure 21:
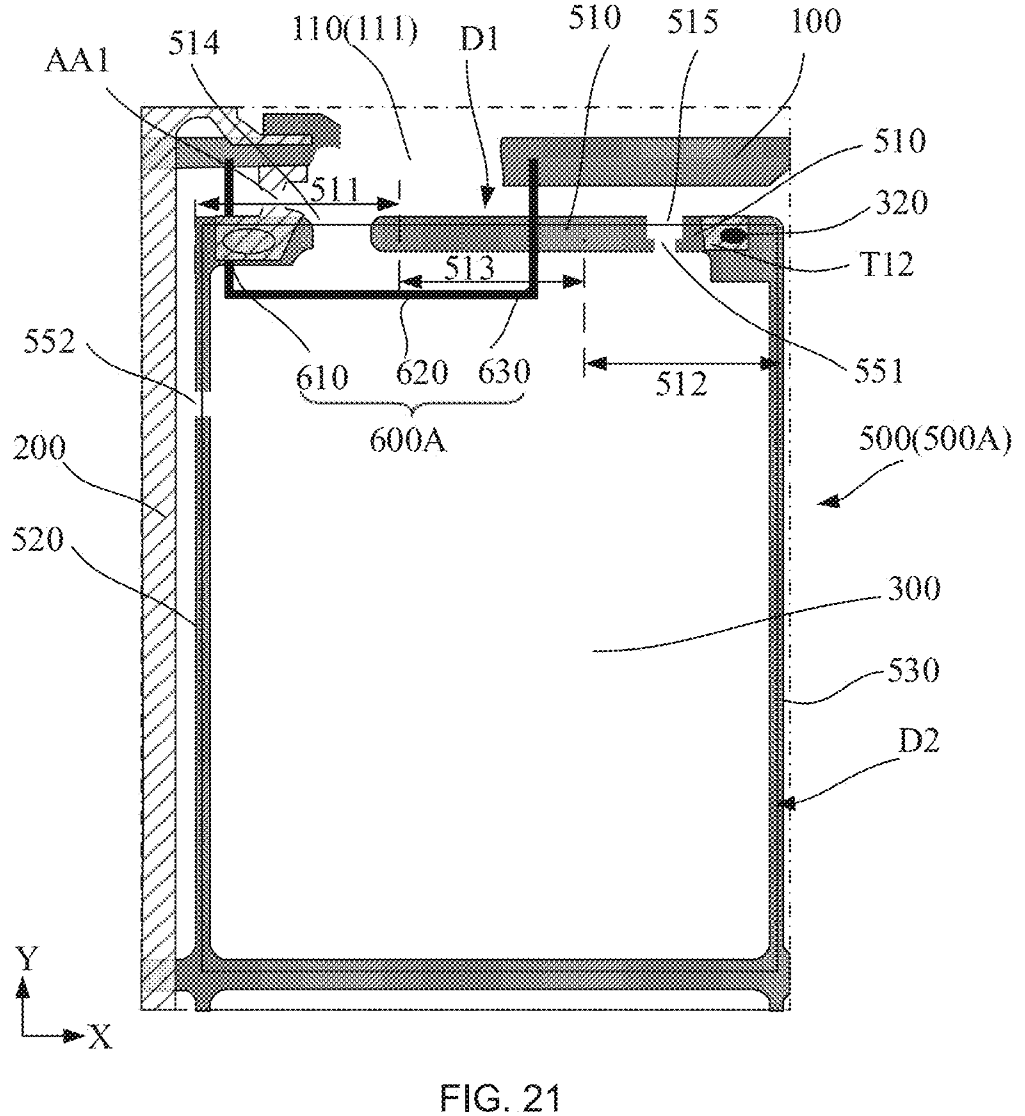
FIG. 21 is yet another possible enlarged view at M3 in FIG. 8, in accordance with some embodiments.

FIG. 21 is yet another possible enlarged view at M3.

Referring to FIG. 21, for example, one (e.g., left endpoint) of two endpoints of the first gate line break 111 is too close to the first break 514, and there is not enough space between the first gate line break 111 and the first break 514 to arrange the first bridge 600A (e.g., the first bridge segment 610 of the first bridge 600A). For another example, the two endpoints of the first gate line break 111 may be respectively disposed on two sides of the first break 514. In these cases, in order to repair the broken first gate line 100, for example, the first bridge segment 610 of the first bridge 600A may be moved left to the left side of the first break 514, or left to the position of the first break 514. In this case, since the first break 514 cannot be located outside the first bridge 600A, the first break 514 cannot be used as a repair break for dividing the first repair capacitive line 500A into two portions (i.e., first portion D1 and second portion D2). Therefore, some other embodiments of the present disclosure provide an array substrate 10. Referring to FIG. 21 again, in the present embodiments, a first repair capacitive line 500A has a first repair break 551 and a second repair break 552 respectively disposed on two sides of a first bridge 600A, and the first repair break 551 is located in a first conductive segment 510.

Except specific positions of the first bridge 600A and the second repair break 552, other features may refer to Example 3.

Different from Example 3, in the present example, the first repair break 551 and the second repair break 552 are located on two sides of the first break 514, respectively.

For example, the first break 514 is located in a first subsection 511 of the first conductive segment 510. In this case, according to the size of the first bridge 600A in the first direction X, the first repair break 551 may be disposed in the first conductive segment 510 (e.g., a second subsection 512 or a middle subsection 513), and the second repair break 552 may be disposed in a second conductive segment 520.

A method of arranging the first repair break 551 may refer to Example 3. In addition, the first repair break 551 may be manufactured by, for example, laser cutting at the position of the first conductive segment 510 (e.g., the second subsection 512) where the recess 515 is disposed. The second repair break 552 may be disposed in the second conductive segment 520 by cutting such as laser cutting.

Thus, the first repair break 551 and the second repair break 552 are respectively located on two sides of the first bridge 600A, and are respectively located on the two sides of the first break 514. Similarly, the first repair break 551 and the second repair break 552 divide the first repair capacitive line 500A into two portions, i.e., a first portion D1 crossing the first bridge 600A and a second portion D2 coupled to the first pixel electrode 300 with reference to Example 3.

Effects of the array substrate in the present embodiments are the same as those of Example 3, and will not be repeated here.

The array substrate in which the broken line is repaired provided in the above embodiments is described in an example where the first break is located in the first subsection. Hereinafter, some other embodiments of the present disclosure provide an array substrate, and a first break in the array substrate is located in a second subsection.

Example 7

Figure 22:
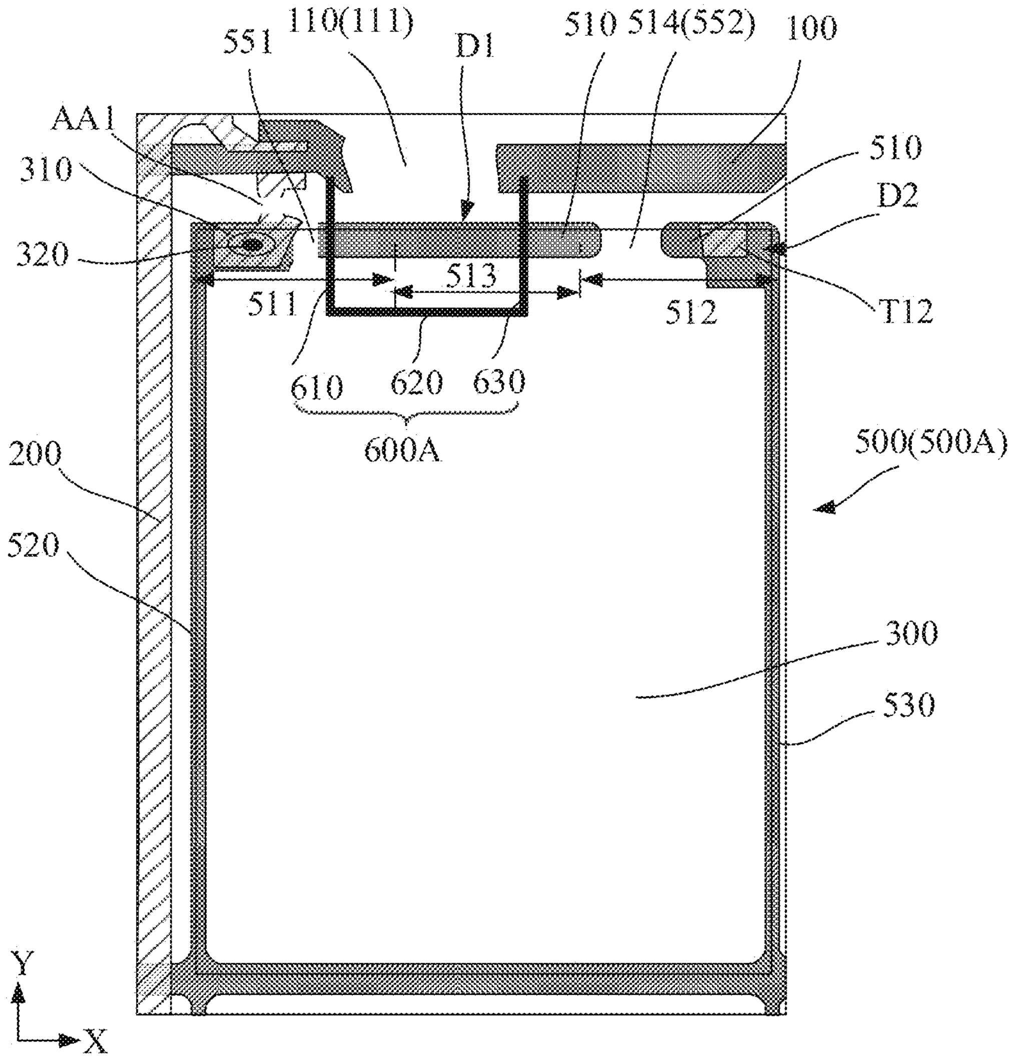
FIG. 22 is yet another possible enlarged view at M3 in FIG. 8, in accordance with some embodiments.

FIG. 22 is yet another possible enlarged view at M3.

Referring to FIG. 22, some other embodiments of the present disclosure provide the array substrate 10. In the present embodiments, the first break 514 is located in the second subsection 512. In a case where the array substrate has at least one broken first gate line 100, the array substrate needs to be repaired. As with the above embodiments, it is necessary to arrange the first repair break 551, the second repair break 552, the first bridge 600A and the welding coupling point(s) 320 in the first repair capacitive line 500A.

In the array substrate, the first repair break 551 is located in the first conductive segment 510, and one of the first repair break 551 and the second repair break 552 is the first break 514.

For example, in FIG. 22, the first repair break 551 may be disposed between the first bridge 600A and the charging coupling point 310 by cutting. For example, the first repair break 551 is located in the first subsection 511 of the first conductive segment 510.

Based on this, the welding coupling point 320 is located on the side (i.e., left side) of the first repair break 551 away from the first bridge 600A on the first conductive segment 510, and a specific position may refer to Examples 1 and 2. Accordingly, the first break 514 is used as the second repair break 552.

For another example, the first break 514 may be used as the first repair break 551.

Based on this, the welding coupling point 320 is located on the side (i.e., right side) of the first repair break 551 away from the first bridge 600A on the first conductive segment 510, and a specific location may refer to Example 3. Accordingly, the second repair break 552 may be disposed between the first bridge 600A and the charging coupling point 310 by cutting. For example, the first repair break 551 is disposed in the first subsection 511 of the first conductive segment 510.

Effects that can be achieved by the array substrate may also refer to Example 1, and will not be repeated here.

Example 8

Figure 23A:
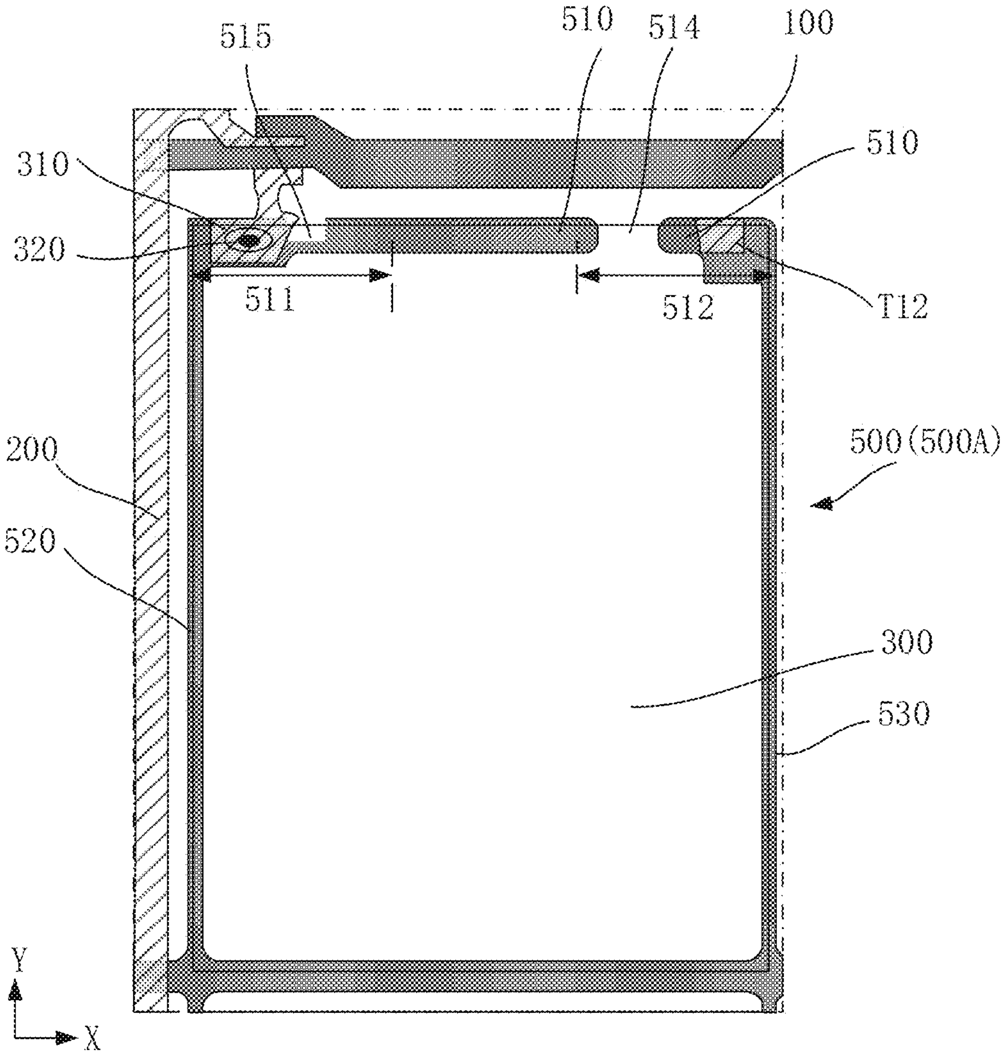
FIG. 23A is yet another possible enlarged view at M2 in FIG. 3, in accordance with some embodiments.

FIG. 23A is yet another possible enlarged view at M2 in FIG. 3.

Similar to Example 4, referring to FIG. 23A, the present example provides an array substrate in which a first conductive segment 510 is provided with a recess 515 whose opening faces a first gate line or faces away from the first gate line. The recess 515 and a first break 514 are respectively disposed on two sides of a middle subsection 513. For example, if the first break 514 is located in the second subsection 512, the recess 515 is disposed in the first subsection 511. Except that the arranging position of the recess 515 is different from that of Example 4, other features of the recess may refer to the related description in Example 4.

In some possible implementations, the array substrate has no broken first gate line, and in this case, structures of a plurality of sub-pixel regions of the array substrate may refer to FIG. 23A.

Figure 23B:
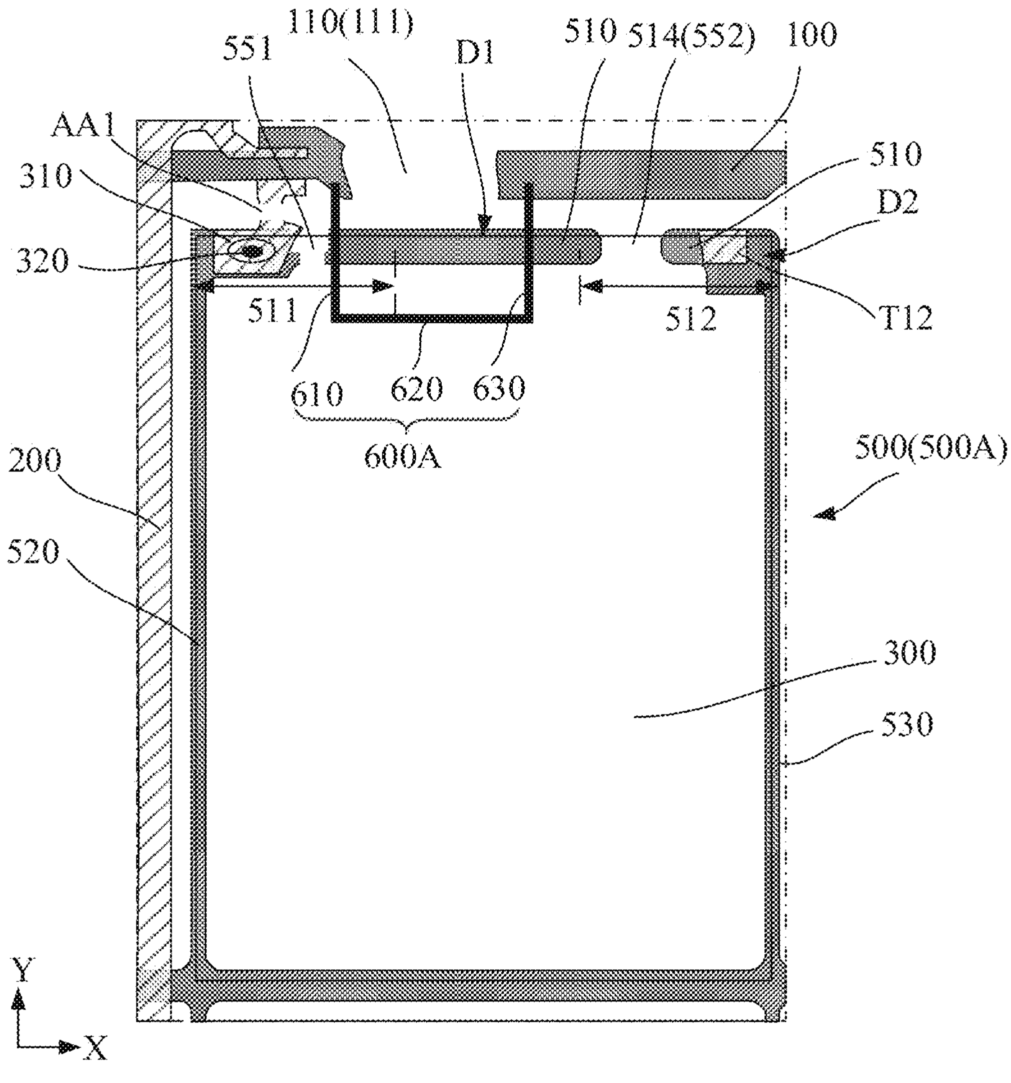
FIG. 23B is yet another possible enlarged view at M3 in FIG. 8, in accordance with some embodiments.

FIG. 23B is yet another possible enlarged view at M3 in FIG. 8.

In some other possible implementations, referring to FIG. 23B, the array substrate has at least one broken first gate line 100. The array substrate is based on the structure of the sub-pixel region shown in FIG. 23A, and the broken first gate line 100 is repaired.

Similar to Example 5, the recess 515 may be used to repair the array substrate. One of the first repair break 551 and the second repair break 552 is located at a position where the recess 515 of the first repair capacitive line 500A is located, and another one of the first repair break 551 and the second repair break 552 may be, for example, the first break 514.

For example, in FIG. 23B, the arrangement of the welding coupling point 320 may refer to Example 1 or Example 2. In this case, the repair break formed at the recess 515 is the first repair break 551, and the first break 514 is used as the second repair break 552.

For another example, the arrangement of the welding coupling point 320 may refer to Example 3. In this case, the repair break formed at the recess 515 is the second repair break 552, and the first break 514 is used as the first repair break 551.

Effects of the array substrate in the present embodiments are the same as those of Example 1, and will not be repeated here.

Example 9

Figure 24:
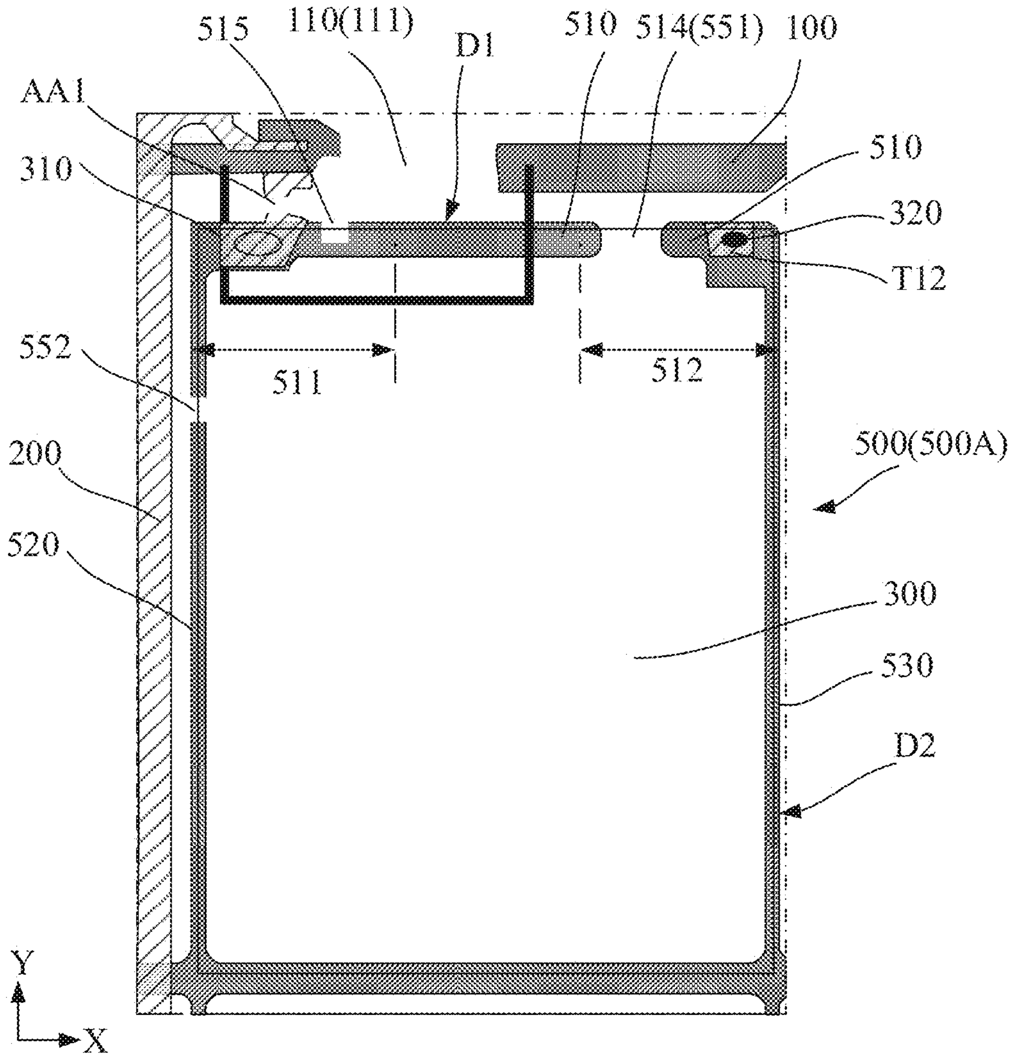
FIG. 24 is yet another possible enlarged view at M3 in FIG. 8, in accordance with some embodiments.

FIG. 24 is yet another possible enlarged view at M3.

Referring to FIG. 24, similar to Example 6, in a case where the first break 514 is located in the second subsection 512, and the recess 515 is located in the first subsection 511, a repair break may not be disposed at the recess 515.

Based on this, embodiments of the present disclosure provide yet another array substrate. Referring to FIG. 24, in the present example, the specific position of the first bridge 600A is adjusted compared with FIG. 23B. Based on this, the first break 514 is used as the first repair break 551, and the arrangement of the welding coupling point 320 may refer to Example 3. Moreover, the second repair break 552 is moved from the first conductive segment 510 (e.g., the first subsection 511) to another conductive segment (e.g., the second conductive segment 520) of the first repair capacitive line 500A.

Effects of the array substrate in the present embodiments are the same as those of Example 3, and will not be repeated here.

Example 10

Figure 25:
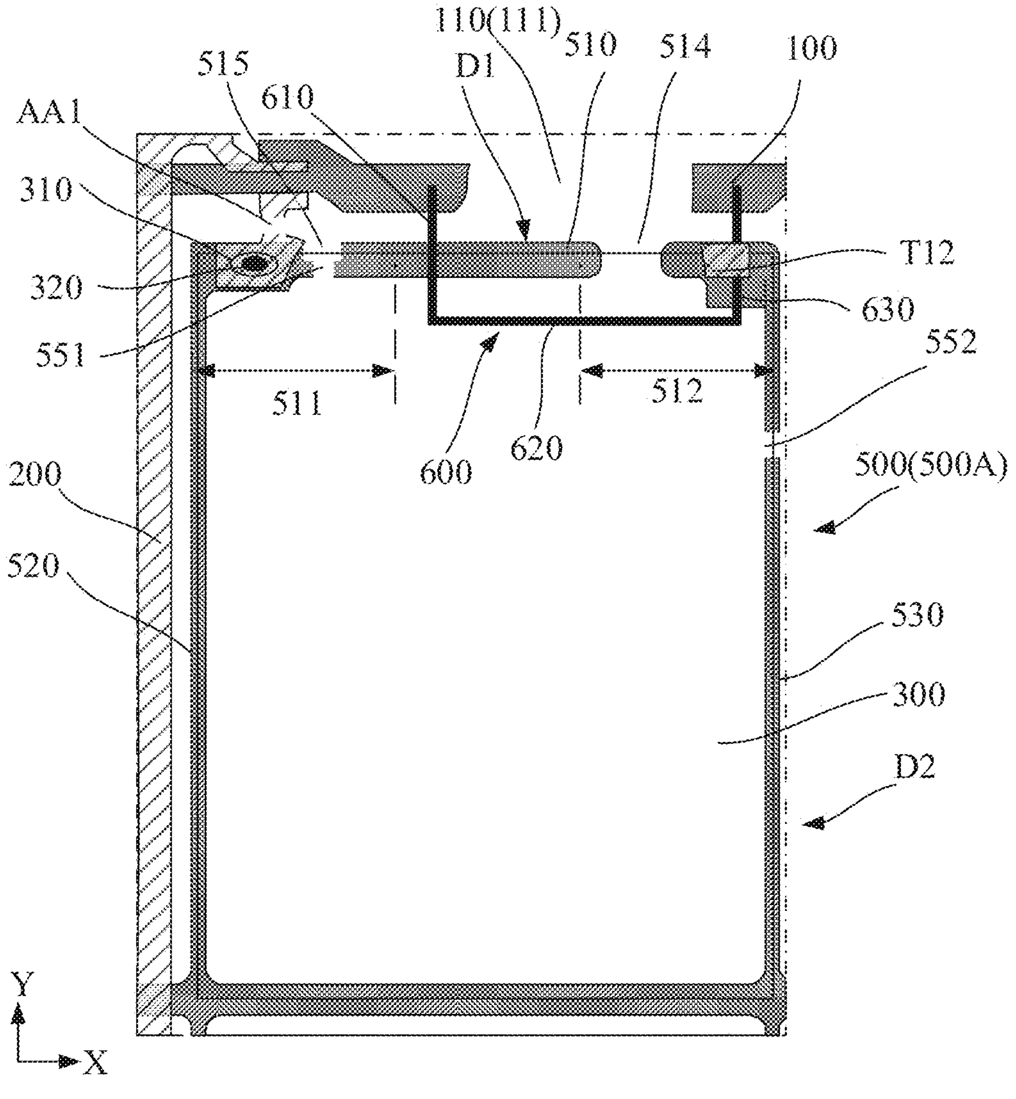
FIG. 25 is yet another possible enlarged view at M3 in FIG. 8, in accordance with some embodiments.

FIG. 25 is yet another possible enlarged view at M3 in FIG. 8.

Referring to FIG. 25, similar to Example 6, in the case where the first break 514 is located in the second subsection 512, and the recess 515 is located in the first subsection 511, there is also a case that the first break 514 cannot be used as a repair break.

Based on this, the present example provides an array substrate. Referring to FIG. 25, in the present example, the first repair capacitive line 500A has the first repair break 551 and the second repair break 552 respectively disposed on the two sides of the first bridge 600A, and the first repair break 551 is located in the first conductive segment 510.

Except the specific positions of the first bridge 600A and the second repair break 552, other features may refer to Example 8.

Different from Example 8, in the present example, the first repair break 551 and the second repair break 552 are respectively located on two sides of the first break 514.

For example, the first break 514 is located in the second subsection 512 of the first conductive segment 510. In this case, according to the size of the first bridge 600A in the first direction X, the first repair break 551 may be disposed in the first conductive segment 510 (e.g., the first subsection 511 or the middle subsection 513), and the second repair break 552 may be disposed in the third conductive segment 530.

A method of arranging the first repair break 551 may refer to Example 3. In addition, the first repair break 551 may be manufactured by, for example, laser cutting at the position of the first conductive segment 510 (e.g., the first subsection 511) where the recess 515 is disposed. The second repair break 552 may be disposed in the third conductive segment 530 by cutting such as laser cutting.

Thus, the first repair break 551 and the second repair break 552 are respectively located on the two sides of the first bridge 600A, and are respectively located on the two sides of the first break 514. Similarly, the first repair break 551 and the second repair break 552 divide the first repair capacitive line 500A into two portions, i.e., a first portion D1 crossing the first bridge 600A and a second portion D2 coupled to the first pixel electrode 300 with reference to Example 1 or 2.

Effects of the array substrate in the present embodiment are the same as those of Example 1, and will not be repeated here.

In some embodiments, a plurality of rows of sub-pixel regions are in one-to-one correspondence with first gate lines, and a scan signal transmitted by each first gate line determines a charging timing of a corresponding row of sub-pixel regions.

In some other embodiments, the number of rows of sub-pixel regions may be twice the number of first gate lines, and a scan signal transmitted by each first gate line determines a charging timing of two adjacent rows of sub-pixel regions.

Figure 26:
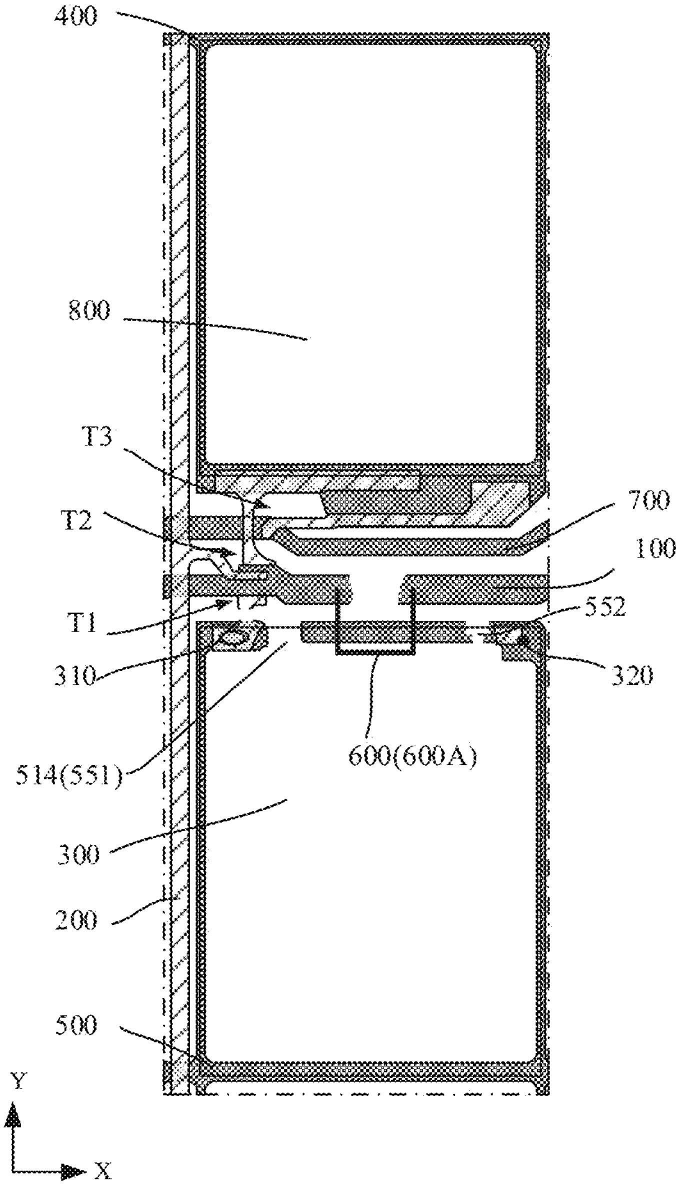
FIG. 26 is another possible enlarged view at M1 in FIG. 2, in accordance with some embodiments.

FIG. 26 is another possible enlarged view at M1 in FIG. 2. FIGS. 26 and 3 each show a structure in which a first gate line corresponds to two rows of sub-pixel regions.

FIG. 3 shows a case that the first gate line 100 is not broken, and FIG. 26 shows a case that the first gate line 100 is broken. The broken first gate line 100 in FIG. 26 may be repaired by any one of the above repair methods. That is, a structure of the lower sub-pixel region in FIG. 26 may refer to the structure of any sub-pixel region provided with the first bridge described above.

Figure 27:
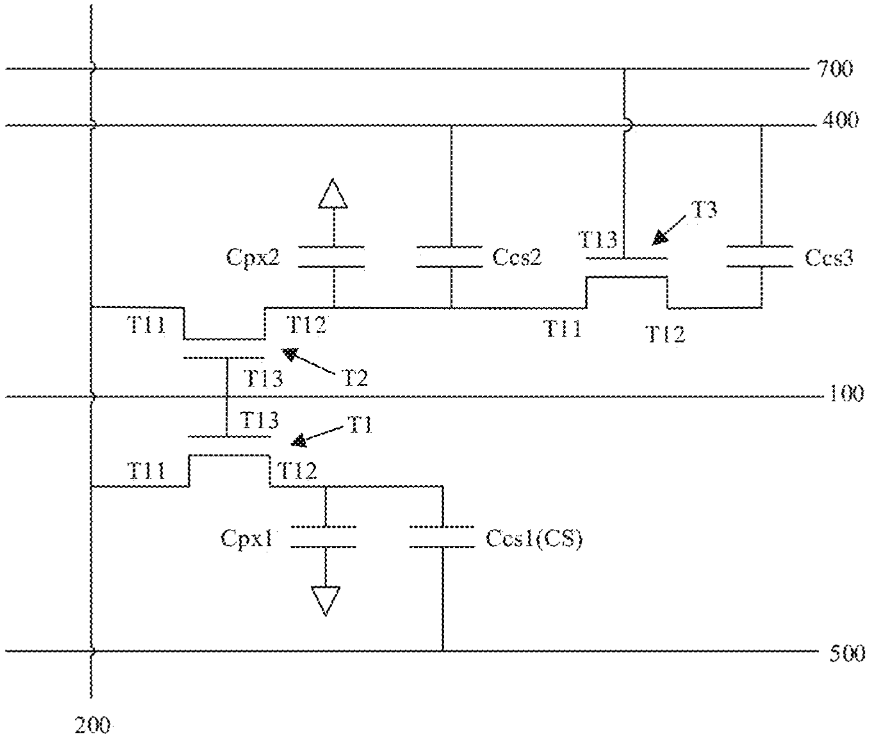
FIG. 27 is an equivalent circuit diagram of FIG. 3.

FIG. 27 is an equivalent circuit diagram of FIG. 3.

Referring to FIG. 3 (or 26) and 27, the array substrate 10 further includes a plurality of second pixel electrodes 800, a plurality of second transistors T2, and a plurality of second capacitive lines 400 that are all disposed on the substrate.

The second pixel electrode 800 (e.g., each second pixel electrode 800) is located on the second side of the first gate line 100. Based on this, the second pixel electrode 800 and the first pixel electrode 300 may be arranged opposite to each other. For example, the second pixel electrode 800 and the first pixel electrode 300 are respectively disposed on two sides of the first gate line 100, and are coupled to the same data line 100. In this case, the sub-pixel regions where the second pixel electrode 800 and the first pixel electrode 300 are respectively located may be located in the same column (i.e., may be arranged in the second direction Y).

A material of the second pixel electrode 800 may refer to the material of the first pixel electrode 300. For example, the material of the second pixel electrode 800 may be the same as the material of the first pixel electrode 300.

A gate T13, a first electrode T11 and a second electrode T12 of the second transistor T2 (e.g., each second transistor T2) are respectively coupled to the first gate line 100, the data line 200 and the second pixel electrode 800.

Functions of the gate T13, the first electrode T11 and the second electrode T12 of the second transistor T2 may refer to the functions of the gate T13, the first electrode T11 and the second electrode T12 of the first transistor T1, respectively. The gate T13 of the second transistor T2 can receive a gate signal from a second gate line 700, and the second transistor T2 is configured to be turned on in response to the gate signal received by the gate T13 being an effective voltage, thereby transmitting the voltage from the data line 200 to the second pixel electrode 800. A second liquid crystal capacitor Cpx2 is formed between the second electrode T12 of the second transistor T2 and the common electrode, and a second storage capacitor Ccs2 is formed between the second capacitive line 400 and the second pixel electrode 800. Accordingly, a first liquid crystal capacitor Cpx1 is formed between the second electrode T12 of the first transistor T1 and the common electrode, and a first storage capacitor Ccs1 (i.e., the above storage capacitor CS) is formed between the first capacitive line 500 and the first pixel electrode 300.

An orthographic projection of the second capacitive line 400 on the substrate BS is overlapped with an orthographic projection of the second pixel electrode 800 on the substrate BS. A structure and a function of the second capacitive line 400 may refer to those of the first capacitive line 500. The structure of the second capacitive line 400 and the structure of the first capacitive line 500 may be the same or different (e.g., a first conductive segment of the second capacitive line 400 and the first conductive segment 510 of the first capacitive line 500 are partially different in width).

In the present example, sub-pixel regions in two adjacent rows and in the same column are a group. Two sub-pixel regions in the same group are arranged opposite to each other in the second direction, and are controlled by the same first gate line 100. In a case where the first gate line 100 has the gate line break, a sub-pixel region located on a single side of the first gate line 100 may be provided with the bridge 600 therein. The bridge 600 may be disposed in the sub-pixel region located on the first side of the first gate line 100, or the sub-pixel region located on the second side of the first gate line 100.

Thus, the number of bridge(s) 600 is reduced, and the repair efficiency of the array substrate 10 is improved. Moreover, a sub-pixel opposite to the side where the bridge 600 is located may be restored to a normal operating state without being affected by the bridge 600, and is basically the same as a normal sub-pixel, so that the darkening operation is not required.

In some embodiments, referring to FIG. 27, the array substrate further includes the second gate line(s) 700 and a plurality of third transistors T3 that are all disposed on the substrate BS. A gate T13 of the third transistor T3 is coupled to the second gate line 700. A first electrode T11 of the third transistor T3 is coupled to the second electrode T12 of the second transistor T2. An orthographic projection of a second electrode T12 of the third transistor T3 on the substrate BS is overlapped with the orthographic projection of the second capacitive line 400 on the substrate BS, thereby forming a third storage capacitor Ccs3. The third storage capacitor Ccs3 may divert part of an electric quantity of the second storage capacitor Ccs2, thereby reducing a voltage on the second gate line 700.

The array substrates in which the broken line is repaired provided in the above embodiments is described in an example where the bridge passes through a sub-pixel region. Hereinafter, some other embodiments of the present disclosure provide the array substrate in which the bridge in the array substrate passes through two or more sub-pixel regions. That is, the bridge crosses two or more first capacitive lines.

Figure 28A:
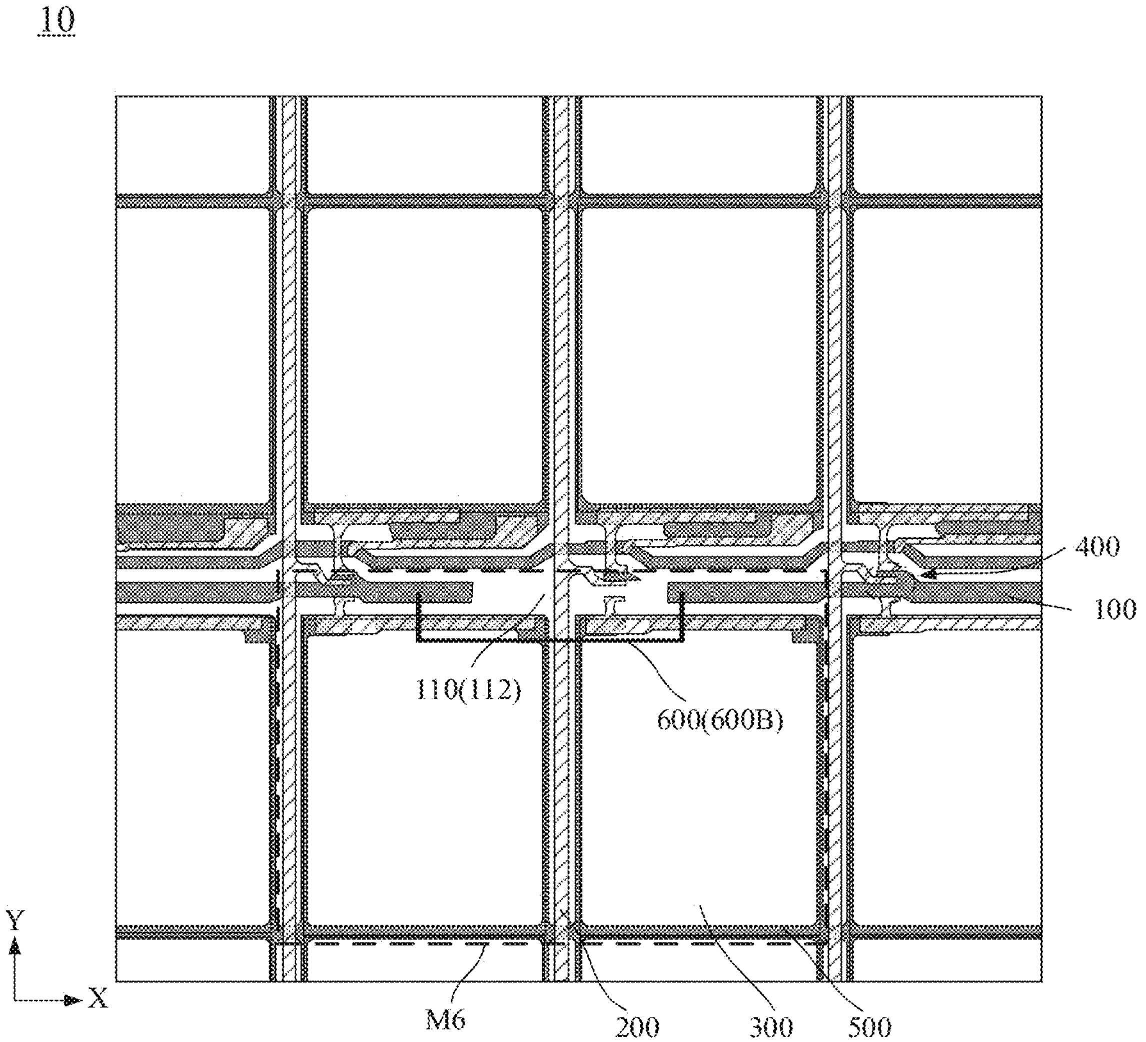
FIG. 28A is a top view of an array substrate after a broken line is repaired, in accordance with some other embodiments.

For example, FIG. 28A is a top view of an array substrate after a broken line is repaired. Referring to FIG. 28A, a gate line break is located between two adjacent sub-pixel regions, and crosses the two adjacent sub-pixel regions. For another example, a length of the gate line break is greater than a length of a first capacitive line. Since two ends of the bridge are respectively located on two sides of the gate line break, in the above cases, the bridge needs to pass through two or more sub-pixel regions.

For the convenience of description, this kind of bridge is designated as a second bridge, and the corresponding gate line break is designated as a second gate line break.

Example 11

Figure 28B:
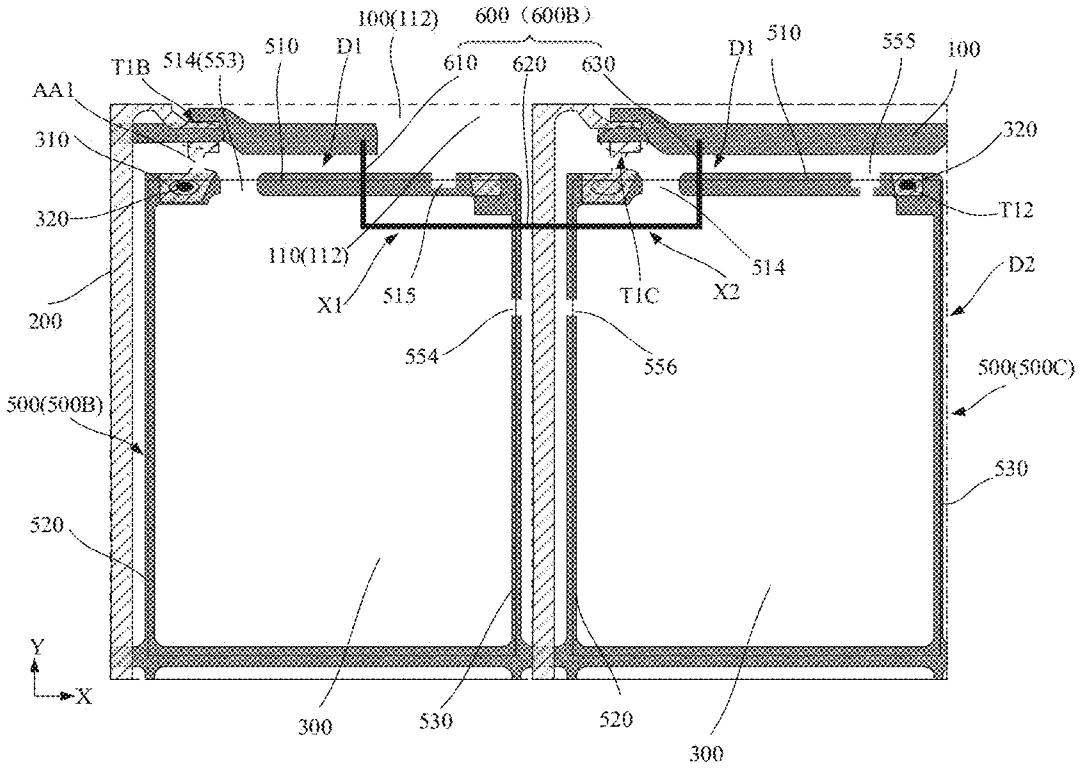
FIG. 28B is an enlarged view at M6 in FIG. 28A, in accordance with some embodiments.

FIG. 28B is a partial enlarged view at M6 in FIG. 28A.

Referring to FIG. 28A, some other embodiments of the present disclosure provide the array substrate 10. The first gate line 100 has a second gate line break 112. The array substrate 10 further includes a second bridge 600B, and two ends of the second bridge 600B are respectively connected to two sides of the second gate line break 112 in the first gate line 100. The second bridge 600B crosses a second repair capacitive line 500B and a third repair capacitive line 5000. Each of the second repair capacitive line 500B and the third repair capacitive line 5000 is one of the plurality of first capacitive lines 500.

For example, in the plurality of first capacitive lines 500, a first capacitive line 500 crossing a first bridge segment 610 of the second bridge 600B is the second repair capacitive line 500B, and another first capacitive line 500 crossing a third bridge segment 630 of the second bridge 600B is the third repair capacitive line 5000.

Sub-pixel regions respectively corresponding to the second repair capacitive line 500B and the third repair capacitive line 500C may also be darkened.

Referring to FIG. 28B, the second repair capacitive line 500B has a third repair break 553 and a fourth repair break 554 respectively disposed on two sides of the second bridge 600B.

The second repair capacitive line 500B and the second bridge 600B have two crossing positions. A crossing position is a crossing position of a first conductive segment 510 of the second repair capacitive line 500B and the first bridge segment 610 of the second bridge 600B, and is located at the first conductive segment 510. Another crossing position is a crossing position of a third conductive segment 530 of the second repair capacitive line 500B and a second bridge segment 620 of the second bridge 600B, and is located at the third conductive segment 530. Thus, the two sides of the second bridge 600B with respect to the second repair capacitive line 500B are actually two sides of a first bridge subsection X1 composed of the first bridge segment 610 and a portion of the second bridge segment 620 (i.e., a portion of the second bridge segment 620 located between the first bridge segment 610 and the corresponding third conductive segment 530).

The third repair break 553 is located in the first conductive segment 510. The second bridge 600B extends from a right side of the second repair capacitive line 500B to the third repair capacitive line 5000, and at least a portion of a second subsection 512 of the first conductive segment 510 is located in a region of the first bridge subsection X1 of the second bridge 600B, and may be coupled to the first gate line 100. Therefore, the third repair break 553 is not suitable to be disposed in the second subsection 512 of the first conductive segment 510. Thus, the third repair break 553 is located in the first conductive segment 510 at a position close to the first bridge segment 610 of the second bridge 600B, and is disposed in a first subsection 511 or a middle subsection 513 of the first conductive segment 510 of the second repair capacitive line 500B. The fourth repair break 554 is located in the corresponding third conductive segment 530.

Referring to FIG. 28B, in the second repair capacitive line 500B, in a case where the first break 514 is located on a left side of the first bridge segment 610 in the first subsection 511, the first break 514 may be used as the third repair break 553.

Then, the fourth repair break 554 is disposed in a portion of the third conductive segment 530 located on a side of the second bridge segment 620 away from the first conductive segment 510, and may be machined by, for example, laser cutting.

Similarly, the third repair break 553 and the fourth repair break 554 divide the second repair capacitive line 500B into two portions, i.e., a first portion D1 crossing the second bridge 600B and a second portion D2 coupled to the first pixel electrode 300.

In the array substrate, a portion of the first conductive segment 510 located on a side of the third repair break 553 away from the middle subsection 513 is coupled to a second electrode T12 of a second repair transistor T1B.

In the present embodiments, the left portion of the first subsection 511 is coupled to the second electrode T12 of the second repair transistor T1B. A specific arrangement of the welding coupling point 320 may refer to Example 1 or 2.

Similarly, when the darkening process is performed, the first pixel electrode 300 may be disconnected from the data line 200 in the sub-pixel region, so that the data line 200 cannot provide the data signal to the first pixel electrode 300.

The second repair transistor T1B is one of the plurality of first transistors T1, and corresponds to the second repair capacitive line 500B. The second repair transistor T1B refers to a transistor in the plurality of first transistors T1 that controls a sub-pixel to which the second repair capacitive line 500B belongs. The second electrode T12 of the second repair transistor T1B also has a transistor break AA1. A structure and a function of the transistor break AA1 may refer to Example 1 in combination with FIG. 10.

The third repair capacitive line 500C has a fifth repair break 555 and a sixth repair break 556 respectively disposed on two sides of the second bridge 600B. The fifth repair break 555 is located in a first conductive segment 510. Similarly, the third repair capacitive line 500C and the second bridge 600B have two crossing positions. A crossing position is a crossing position of the first conductive segment 510 of the third repair capacitive line 500C and a third bridge segment 630 of the second bridge 600B, and is located at the first conductive segment 510. Another crossing position is a crossing position of a second conductive segment 520 of the third repair capacitive line 5000 and the second bridge segment 620 of the second bridge 600B, and is located at the second conductive segment 520. Thus, the two sides of the second bridge 600B with respect to the third repair capacitive line 5000 are actually two sides of a second bridge subsection X2 composed of the third bridge segment 630 and a portion of the second bridge segment 620 (i.e., a portion of the second bridge segment 620 located between the third bridge segment 630 and the corresponding second conductive segment 520).

Referring to FIG. 28B, similarly, the fifth repair break 555 is located in the first conductive segment 510 at a position close to the third bridge segment 630 of the second bridge 600B, and is disposed in a second subsection 512 or a middle subsection 513 of the first conductive segment 510 of the third repair capacitive line 5000. For example, the second subsection 512 of the first conductive segment 510 is machined by laser cutting to form the fifth repair break 555. For another example, the first conductive segment 510 of the first capacitive line 500 is provided with the recess 515. If a portion at the recess 515 may be cut off to form a repair break, the fifth repair break 555 may be formed at the recess 515 by cutting.

The sixth repair break 556 is located in the corresponding second conductive segment 520. The sixth repair break 556 may be disposed in a portion of the second conductive segment 520 located on a side of the second bridge segment 620 away from the first conductive segment 510, and may be machined by, for example, laser cutting.

Similarly, the fifth repair break 555 and the sixth repair break 556 divide the third repair capacitive line 500C into two portions, i.e., a first portion D1 crossing the second bridge 600B and a second portion D2 coupled to the first pixel electrode 300.

In the array substrate, a portion of the first conductive segment 510 of the third repair capacitive line 5000 located on a side of the fifth repair break 555 away from the middle subsection 513 is coupled to a second electrode T12 of a third repair transistor T1C.

Referring to FIG. 28B, a right portion of the second subsection 512 is coupled to the second electrode T12 of the third repair transistor T1C. The arrangement of the welding coupling point 320 may refer to Example 3.

Similarly, when the darkening process is performed, the first pixel electrode 300 may be disconnected from the data line 200 in the sub-pixel region, so that the data line 200 cannot provide the data signal to the first pixel electrode 300.

The third repair transistor T1C is one of the plurality of first transistors T1, and corresponds to the third repair capacitive line 500C. The third repair transistor T1C refers a transistor in the plurality of first transistors T1 that controls a sub-pixel to which the third repair capacitive line 500C belongs. The second electrode T12 of the third repair transistor T1C also has a transistor break AA1. A structure and a function of the transistor break AA1 may refer to Example 1 in combination with FIG. 13.

In the third repair capacitive line 500C, a portion of the first conductive segment 510 located on a side of the fifth repair break away from the middle subsection 513 is coupled to the second electrode T12 of the third repair transistor T1C. That is, a right portion of the second subsection 512 is coupled to the second electrode T12 of the third repair transistor T1C. In addition, in the third repair capacitive line 500C, the first pixel electrode 300 is coupled to the second electrode T12 of the third repair transistor T1C at a charging coupling point 310. Thus, the first pixel electrode 300 is coupled to the second portion D2 of the third repair capacitive line 500C. The specific coupling method of the second portion D2 of the third repair capacitive line 500C and the first pixel electrode 300 is as shown in Example 1 or 2.

Example 12

Figure 29:
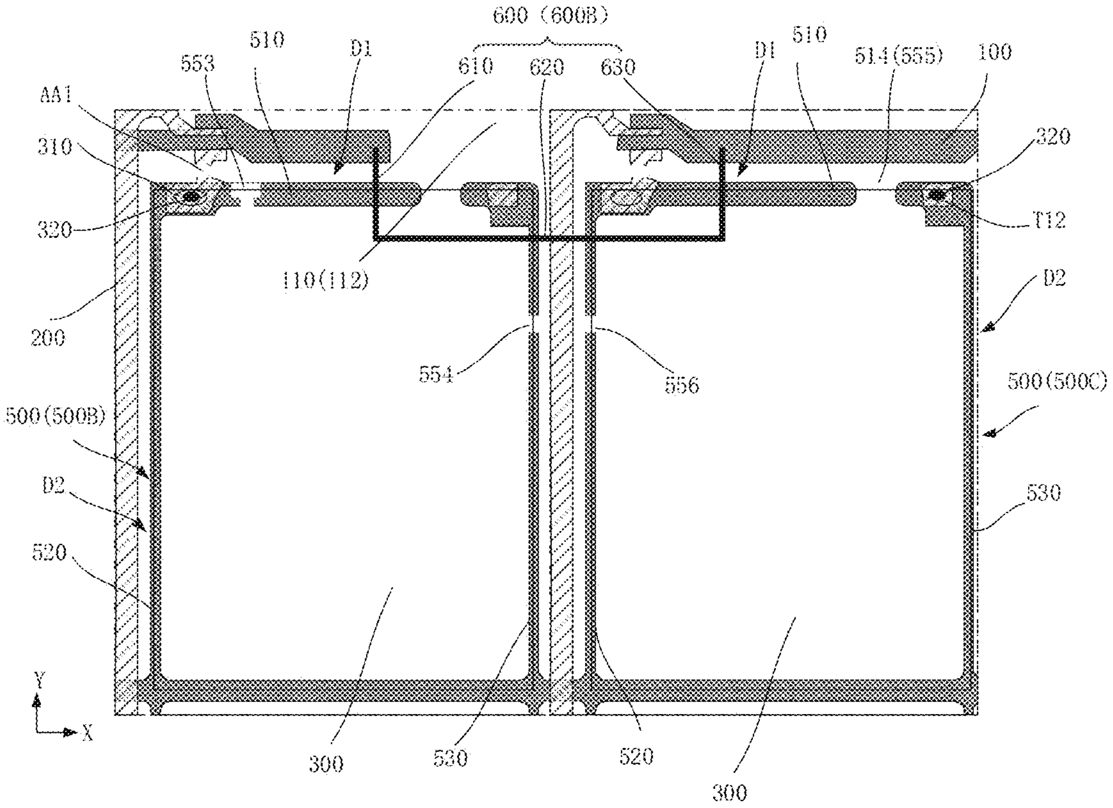
FIG. 29 is another possible enlarged view at M6 in FIG. 28A, in accordance with some embodiments.

FIG. 29 is another possible enlarged view at M6 in FIG. 28A.

Referring to FIG. 29, in the present embodiments, different from Example 11, the first break 514 is located in the second subsection 512.

Therefore, in the second repair capacitive line 500B, the first break 514 cannot be used as the third repair break 553. The third repair break 553 is located in the first subsection 511, and may be formed in the first subsection 511 by laser cutting. For another example, the first conductive segment 510 of the first capacitive line 500 is provided with the recess 515. If a portion at the recess 515 may be cut off to form a repair break, the third repair break 553 may be formed at the recess 515 by cutting.

The fourth repair break 554 is located in the third conductive segment 530, and the arrangement of the fourth repair break 554 may refer to Example 11.

A specific coupling method of the second portion D2 of the second repair capacitive line 500B and the first pixel electrode 300 may also refer to Example 11.

Referring to FIG. 29 again, accordingly, in the third repair capacitive line 500C, the first break 514 may be used as the fifth repair break 555. The sixth repair break 556 is located in the second conductive segment 520. The arrangement of the sixth repair break 556 may refer to Example 11.

A specific coupling method of the second portion D2 of the third repair capacitive line 500C and the first pixel electrode 300 may also refer to Example 11.

Examples 11 and 12 are embodiments in which the second bridge 600B crosses only two first capacitive lines. Hereinafter, embodiments in which the second bridge 600B crosses three or more first capacitive lines 500 are provided.

Example 13

Figure 30:
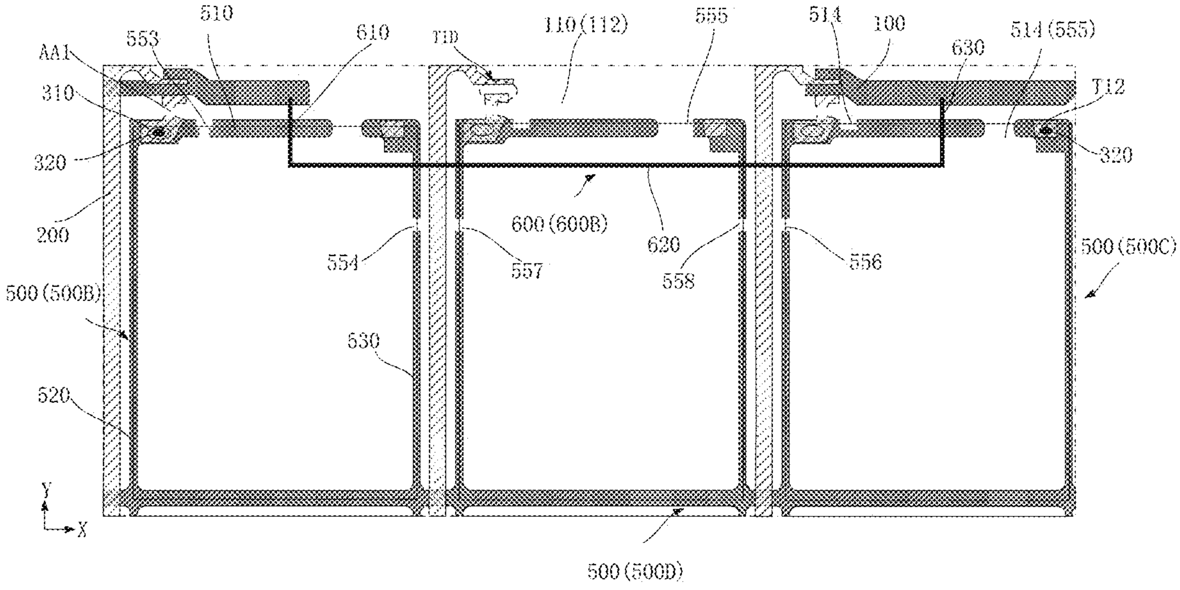
FIG. 30 is a partial structural diagram of an array substrate, in accordance with some embodiments.

FIG. 30 is a partial enlarged view of an array substrate after being repaired.

Referring to FIG. 30, the second gate line break 112 of the first gate line 100 is long. For example, the length of the second gate line break 112 is greater than a sum of lengths of two first capacitive lines 500. Thus, the second bridge 600B crosses at least three first capacitive lines 500. A description will be made in an example where the second bridge 600B crosses three first capacitive lines 500. A case that the second bridge 600B crosses more first capacitive lines 500 is similar thereto, and will not be repeated here.

Referring to FIG. 30, the first gate line 100 has the second gate line break 112.

The array substrate 10 includes second bridge(s) 600B. Two ends of the second bridge 600B are respectively connected to two sides of the second gate line break 112 in the first gate line 100.

The second bridge 600B crosses the second repair capacitive line 500B, the third repair capacitive line 500C and a fourth repair capacitive line 500D. The fourth repair capacitive line 500D is located between the second repair capacitive line 500B and the third repair capacitive line 500C.

In the present example, arrangement positions and arrangement methods of the third repair break 553 and the fourth repair break 554 in the second repair capacitive line 500B are similar to those of Example 12, and may refer to Example 12.

Accordingly, the darken operation of the sub-pixel region corresponding to the second repair capacitive line 500B may refer to Example 12, such as the coupling method of the second portion D2 of the second repair capacitive line 500B.

In the present example, arrangement positions and arrangement methods of the fifth repair break 555 and the sixth repair break 556 in the third repair capacitive line 5000 are similar to Example 12, and may refer to Example 12.

Accordingly, the darkening operation of the sub-pixel region corresponding to the third repair capacitive line 5000 may refer to Example 12, such as the coupling method of the second portion D2 of the second repair capacitive line 500B.

This example is different from Example 12 in that the fourth repair capacitive line 500D and a fourth repair transistor T1D are further included. The fourth repair capacitive line 500D is located between the second repair capacitive line 500B and the third repair capacitive line 5000. The fourth repair transistor T1D is located between the second repair transistor T1B and the third repair transistor T1C.

A seventh repair break 557 is provided in a portion of a second conductive segment 520 of the fourth repair capacitive line 500D located on a side of a second bridge segment 620 away from a first conductive segment 510. An eighth repair break 558 is provided in a portion of a third conductive segment 530 of the fourth repair capacitive line 500D located on the side of the second bridge segment 620 away from the first conductive segment 510. The seventh repair break and the eighth repair break divide the fourth repair capacitive line 500D into a first portion D1 and a second portion D2, and the second portion D2 is not coupled to the first pixel electrode 300.

A second electrode T12 of the fourth repair transistor T1D is also provided with a transistor break AA1.

FIG. 31 is a flow diagram of a manufacturing method of an array substrate.

Some embodiments of the present disclosure provide a manufacturing method of an array substrate.

In S100, first gate line(s), a plurality of data lines, a plurality of first transistors and a plurality of first capacitive lines are formed on a substrate. The first gate line has a first side and a second side opposite to each other in a width direction of the first gate line.

The data line and the first gate line cross, and are insulated from each other. A gate and a first electrode of the first transistor are respectively coupled to the first gate line and the data line.

In S200, a plurality of first pixel electrodes are formed on the substrate. The first pixel electrode is located on the first side of the first gate line, and is coupled to the second electrode of the first transistor.

An orthographic projection of the first capacitive line on the substrate is overlapped with an orthographic projection of the first pixel electrode on the substrate. The first capacitive line includes a first conductive segment whose extending direction is substantially parallel to an extending direction of the first gate line. The first conductive segment is proximate to the first gate line. The first conductive segment is provided with a first break therein, and the first break is located on a side of a charging coupling point away from the data line, and deviates from a middle subsection of the first conductive segment. The charging coupling point is a coupling position of the first pixel electrode and the second electrode of the first transistor. The middle subsection of the first conductive segment is located in a middle of the first conductive segment, and has a length of ⅓ of a total length. An orthographic projection, on the substrate, of a portion of the first conductive segment located on a side of the first break away from the middle subsection is overlapped with an orthographic projection of the second electrode of the first transistor on the substrate.

In the manufacturing method, the first gate line(s) 100, the plurality of data lines 200, the plurality of first transistors T1, the plurality of first capacitive lines 500 and the first pixel electrodes 300 may be deposited to form respective film layers by a process such as sputtering or chemical vapor deposition (CVD). Coating photoresist, exposing, developing, etching and other steps are performed on the respective film layers to form respective structures. Specific steps will not be repeated.

FIG. 32 is a process diagram of manufacturing an array substrate, in accordance with embodiments. In some embodiments, referring to FIG. 32, in a case where the first gate line 100 has the first gate line break 111, the array substrate needs to be repaired by providing a bridge 600 over the first gate line 100. Accordingly, the manufacturing method of the array substrate further includes following step.

A first bridge 600A is provided on the substrate BS. Two ends of the first bridge 600A are respectively connected to two sides of the first gate line break 111 in the first gate line 100. The first bridge 600A crosses a first repair capacitive line 500A that is one of the plurality of first capacitive lines 500.

The first repair capacitive line 500A is cut off at least one once to obtain a first repair break 551 and a second repair break 552 that are respectively disposed on two sides of the first bridge 600A. The first repair break 551 is located in the first conductive segment 510. One of the first repair break 551 and the second repair break 552 is the first break 514; or the first repair break 551 and the second repair break 552 are respectively located on two sides of the first break 514.

A portion of the first conductive segment 510 located on a side of the first repair break away from the middle subsection 513 is coupled to a second electrode T12 of a first repair transistor T1A. The first repair transistor T1A is one of the plurality of first transistors T1, and corresponds to the first repair capacitive line 500A.

For example, in some array substrates, the first break 514 in the first conductive segment 510 of the first repair capacitive line 500A may be used as the first repair break 551.

In this case, the first break 514 in the first conductive segment 510 of the first repair capacitive line 500A may be used as the first repair break 551. A cut-off process is performed at a position of a recess 515 in the first conductive segment 510 (a black cross line indicates a cut-off).

Then, the second electrode T12 of the first repair transistor T1A may be cut off at a position (N1 position in FIG. 32) deviating from the charging coupling point 310 and close to a first electrode T11 of the first repair transistor T1A, so as to form a transistor break AA1. The transistor break AA1 may stop the data line 200 from providing power to the second electrode T12 of the first repair transistor T1A.

Next, the portion of the first conductive segment 510 located on the side of the first repair break away from the middle subsection 513 may be coupled to the second electrode T12 of the first repair transistor T1A at the charging coupling point 310. In addition, in the first repair capacitive line 500A, the first pixel electrode 300 and the second electrode T12 of the first repair transistor T1A are coupled at the charging coupling point 310. Thus, the first pixel electrode 300 is coupled to a second portion D2 of the first repair capacitive line 500A, so that potentials of the first pixel electrode 300 and the second portion D2 of the first repair capacitive line 500A are equal, and the manufacturing of the array substrate is completed.

For example, in some array substrates, the first break 514 in the first conductive segment 510 of the first repair capacitive line 500A cannot be used as the first repair break 551.

Figure 33:
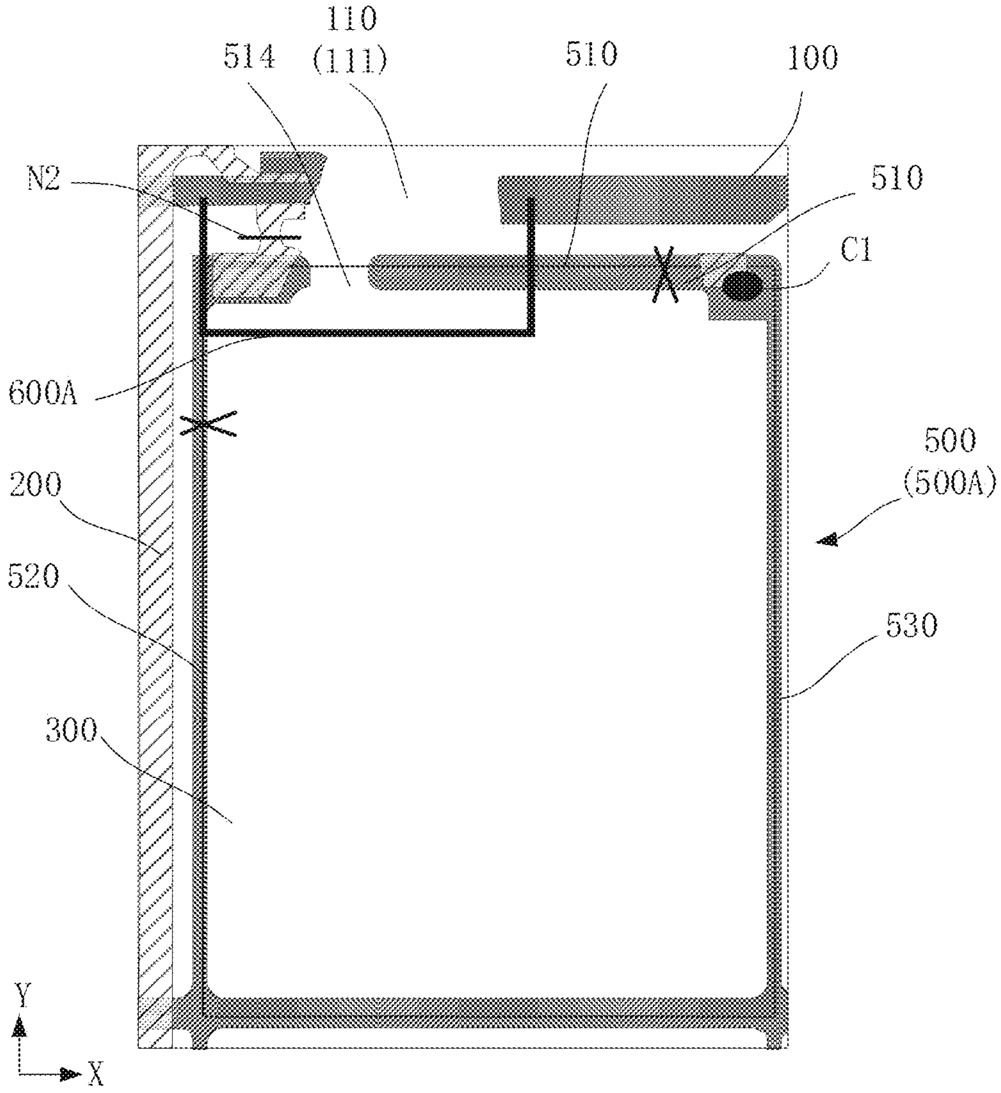
FIG. 33 is a process diagram of manufacturing an array substrate, in accordance with some embodiments.

FIG. 33 is a process diagram of manufacturing an array substrate, in accordance with embodiments. Referring to FIG. 33, in this case, a cut-off process may be performed on the first conductive segment 510 of the first repair capacitive line 500A to obtain the first repair break 551. A cut-off process may be performed on the second conductive segment 520 of the first repair capacitive line 500A to obtain the second repair break 552.

Then, the second electrode T12 of the first repair transistor T1A may be cut off at a position (N2 position in FIG. 33) deviating from the charging coupling point 310 and close to the first electrode T11 of the first repair transistor T1A, so as to form a transistor break AA1. The transistor break AA1 may stop the data line 200 from providing power to the second electrode T12 of the first repair transistor T1A.

Next, the portion of the first conductive segment 510 located on the side of the first repair break away from the middle subsection 513 may be coupled to the second electrode T12 of the first repair transistor T1A at the C1 position. In addition, in the first repair capacitive line 500A, the first pixel electrode 300 and the second electrode T12 of the first repair transistor T1A are coupled at the charging coupling point 310. Thus, the first pixel electrode 300 is coupled to the second portion D2 of the first repair capacitive line 500A, so that the potentials of the first pixel electrode 300 and the second portion D2 of the first repair capacitive line 500A are equal, and the manufacturing of the array substrate is completed.

In some embodiments, in the case where the first gate line 100 has the second gate line break 112, the array substrate needs to be repaired by providing the bridge 600 over the first gate line 100. Accordingly, the manufacturing method of the array substrate further includes following steps.

A second bridge 600B is provided on the substrate BS. Two ends of the second bridge 600B are respectively connected to two sides of the second gate line break 112 in the first gate line 100. The second bridge 600B crosses a second repair capacitive line 500B and a third repair capacitive line 5000. Each of the second repair capacitive line 500B and the third repair capacitive line 500C is one of the plurality of first capacitive lines 500. The second repair capacitive line 500B is cut off to obtain a third repair break 553 and a fourth repair break 554 that are respectively disposed on two sides of the second bridge 600B, and the third repair break 553 is located in a first conductive segment 510.

A portion of the first conductive segment 510 of the second repair capacitive line 500B located on a side of the third repair break away from a middle subsection 513 is coupled to a second electrode T12 of a second repair transistor T1B. The second repair transistor T1B is one of the plurality of first transistors T1, and corresponds to the second repair capacitive line 500B. The third repair capacitive line 5000 is cut off to obtain a sixth repair break 556. The first break 514 in the third repair capacitive line 500C is a fifth repair break 555. The fifth repair break 555 and the sixth repair break 556 are respectively located on two sides of the second bridge 600B. A portion of a first conductive segment 510 of the third repair capacitive line 500C located on a side of the fifth repair break away from a middle subsection 513 is coupled to a second electrode T12 of a third repair transistor T1C. The third repair transistor T1C is one of the plurality of first transistors T1, and corresponds to the third repair capacitive line 500C.

The manufacturing method of the array substrate with the second gate line break 112 may be obtained with reference to the manufacturing method of the array substrate with the first gate line break 111 in combination with the structure of the array substrate with the second gate line break 112, which will not be repeated herein.

The foregoing descriptions are merely some specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. An array substrate comprising a substrate, and a first gate line, a plurality of data lines, a plurality of first pixel electrodes, a plurality of first transistors and a plurality of first capacitive lines that are all disposed on the substrate; wherein the first gate line has a first side and a second side opposite to each other in a width direction of the first gate line;

a data line and the first gate line cross, and are insulated from each other;

a first pixel electrode is located on the first side of the first gate line;

a gate, a first electrode and a second electrode of a first transistor are coupled to the first gate line, the data line and the first pixel electrode, respectively;

an orthographic projection of a first capacitive line on the substrate is overlapped with an orthographic projection of the first pixel electrode on the substrate; the first capacitive line includes a first conductive segment whose extending direction is substantially parallel to an extending direction of the first gate line, and the first conductive segment is proximate to the first gate line; the first conductive segment is provided with a first break therein, and the first break is located on a side of a charging coupling point away from the data line, and deviates from a middle subsection of the first conductive segment; the charging coupling point is a coupling position of the first pixel electrode and the second electrode of the first transistor, and the middle subsection of the first conductive segment is a portion of the first conductive segment that is located in the middle and has a length of $1/3$ of a total length of the first conductive segment; an orthographic projection, on the substrate, of a portion of the first conductive segment located on a side of the first break away from the middle subsection is overlapped with an orthographic projection of the second electrode of the first transistor on the substrate.

2. The array substrate according to claim 1, wherein the first break is located on a side of the middle subsection of the first conductive segment proximate to the charging coupling point.

3. The array substrate according to claim 1, wherein the orthographic projection, on the substrate, of the portion of the first conductive segment located on the side of the first break away from the middle subsection, the orthographic projection of the second electrode of the first transistor on the substrate, and the orthographic projection of the first pixel electrode on the substrate are overlapped with each other.

4. The array substrate according to claim 1, wherein the first conductive segment is provided with a recess whose opening faces the first gate line or faces away from the first gate line; the recess and the first break are respectively disposed on two sides of the middle subsection.

5. The array substrate according to claim 4, wherein an orthographic projection, on the substrate, of a portion of the first conductive segment located on a side of the recess away from the middle subsection is overlapped with the orthographic projection of the second electrode of the first transistor on the substrate.

6. The array substrate according to claim 4, wherein at the recess, a ratio of a width of a retained portion of the first conductive segment to a width of the first conductive segment is in a range of ⅓ to ½, inclusive; and/or a width of the opening of the recess is in a range of 7.5 μm to 8.5 μm, inclusive.

7. The array substrate according to claim 1, wherein the portion of the first conductive segment located on the side of the first break away from the middle subsection has a length of greater than or equal to 15 μm.

8. The array substrate according to claim 1, wherein the first gate line has a first gate line break;

the array substrate further comprises a first bridge, and two ends of the first bridge are respectively connected to two sides of the first gate line break in the first gate line; the first bridge and a first repair capacitive line cross, and the first repair capacitive line is one of the plurality of first capacitive lines;

the first repair capacitive line has a first repair break and a second repair break respectively disposed on two sides of the first bridge, and the first repair break is located in a first conductive segment of the first repair capacitive line; wherein one of the first repair break and the second repair break is a first break in the first conductive segment of the first repair capacitive line, or the first repair break and the second repair break are respectively located on two sides of the first break in the first conductive segment of the first repair capacitive line; and a portion of the first conductive segment of the first repair capacitive line located on a side of the first repair break away from the first bridge is coupled to a second electrode of a first repair transistor; the first repair transistor is one of the plurality of first transistors, and corresponds to the first repair capacitive line.

9. The array substrate according to claim 8, wherein the first repair capacitive line includes a recess located in the first conductive segment; and one of the first repair break and the second repair break is located at a position where the recess of the first repair capacitive line is located.

10. The array substrate according to claim 8, wherein the first repair break is located between the first bridge and a charging coupling point of the first pixel electrode and the second electrode of the first repair transistor; and the second electrode of the first repair transistor, the first pixel electrode and the first repair capacitive line are coupled at the charging coupling point of the first pixel electrode and the second electrode of the first repair transistor.

11. The array substrate according to claim 1, wherein the first gate line has a second gate line break;

the array substrate further comprises a second bridge, and two ends of the second bridge are respectively connected to two sides of the second gate line break in the first gate line; the second bridge crosses a second repair capacitive line and a third repair capacitive line, and each of the second repair capacitive line and the third repair capacitive line is one of the plurality of first capacitive lines;

the second repair capacitive line has a third repair break and a fourth repair break respectively disposed on two sides of the second bridge, and the third repair break is located in a first conductive segment of the second repair capacitive line; a portion of the first conductive segment of the second repair capacitive line located on a side of the third repair break away from a middle subsection of the first conductive segment of the second repair capacitive line is coupled to a second electrode of a second repair transistor; the second repair transistor is one of the plurality of first transistors, and corresponds to the second repair capacitive line;

the third repair capacitive line has a fifth repair break and a sixth repair break respectively disposed on the two sides of the second bridge, and the fifth repair break is located in a first conductive segment of the third repair capacitive line; a portion of the first conductive segment of the third repair capacitive line located on a side of the fifth repair break away from a middle subsection of the first conductive segment of the third repair capacitive line is coupled to a second electrode of a third repair transistor; the third repair transistor is one of the plurality of first transistors, and corresponds to the third repair capacitive line;

wherein the third repair break is a first break of the second repair capacitive line, or the fifth repair break is a first break of the third repair capacitive line.

12. The array substrate according to claim 1, further comprising:

a plurality of second pixel electrodes, a plurality of second transistors and a plurality of second capacitive lines that are all disposed on the substrate; wherein a second pixel electrode is located on the second side of the first gate line;

a gate, a first electrode and a second electrode of a second transistor are coupled to the first gate line, the data line and the second pixel electrode, respectively;

an orthographic projection of a second capacitive line on the substrate is overlapped with an orthographic projection of the second pixel electrode on the substrate.

13. The array substrate according to claim 12, further comprising:

a second gate line and a plurality of third transistors that are all disposed on the substrate; wherein a gate of a third transistor is coupled to the second gate line, and a first electrode of the third transistor is coupled to the second electrode of the second transistor; an orthographic projection of a second electrode of the third transistor on the substrate is overlapped with the orthographic projection of the second capacitive line on the substrate.

14. A display device, comprising:

the array substrate according to claim 1.

15. A manufacturing method of an array substrate, comprising:

forming a first gate line, a plurality of data lines, a plurality of first transistors and a plurality of first capacitive lines on a substrate; wherein the first gate line has a first side and a second side opposite to each other in a width direction of the first gate line; a data line and the first gate line cross, and are insulated from each other; a gate and a first electrode of a first transistor are coupled to the first gate line and the data line, respectively; and forming a plurality of first pixel electrodes on the substrate; wherein a first pixel electrode is located on the first side of the first gate line, and is coupled to a second electrode of the first transistor;

wherein an orthographic projection of a first capacitive line on the substrate is overlapped with an orthographic projection of the first pixel electrode on the substrate; the first capacitive line includes a first conductive segment whose extending direction is substantially parallel to an extending direction of the first gate line, and the first conductive segment is proximate to the first gate line; the first conductive segment is provided with a first break therein, and the first break is located on a side of a charging coupling point away from the data line, and deviates from a middle subsection of the first conductive segment; the charging coupling point is a coupling position of the first pixel electrode and the second electrode of the first transistor, and the middle subsection of the first conductive segment is a portion of the first conductive segment that is located in the middle and has a length of ⅓ of a total length of the first conductive segment; an orthographic projection, on the substrate, of a portion of the first conductive segment located on a side of the first break away from the middle subsection is overlapped with an orthographic projection of the second electrode of the first transistor on the substrate.

16. The manufacturing method of the array substrate according to claim 15, wherein the first gate line has a first gate line break;

the manufacturing method further comprises:

providing a first bridge on the substrate; wherein two ends of the first bridge are respectively connected to two sides of the first gate line break in the first gate line, the first bridge and a first repair capacitive line cross, and the first repair capacitive line is one of the plurality of first capacitive lines;

cutting the first repair capacitor line off at least once to obtain a first repair break and a second repair break respectively disposed on two sides of the first bridge; wherein the first repair break is located in a first conductive segment of the first repair capacitive line;

one of the first repair break and the second repair break is a first break in the first conductive segment of the first repair capacitive line, or the first repair break and the second repair break are respectively located on two sides of the first break in the first conductive segment of the first repair capacitive line; and coupling a portion of the first conductive segment of the first repair capacitive line located on a side of the first repair break away from the first bridge to a second electrode of a first repair transistor; wherein the first repair transistor is one of the plurality of first transistors, and corresponds to the first repair capacitive line.

17. The manufacturing method of the array substrate according to claim 15, wherein the first gate line has a second gate line break;

the manufacturing method further comprises:

providing a second bridge on the substrate; wherein two ends of the second bridge are respectively connected to two sides of the second gate line break in the first gate line;

the second bridge crosses a second repair capacitive line and a third repair capacitive line, and each of the second repair capacitive line and the third repair capacitive line is one of the plurality of first capacitive lines;

cutting the second repair capacitor line off to obtain a third repair break and a fourth repair break respectively disposed on two sides of the second bridge; wherein the third repair break is located in a first conductive segment of the second repair capacitive line;

coupling a portion of the first conductive segment of the second repair capacitive line located on a side of the third repair break away from a middle subsection of the first conductive segment of the second repair capacitive line to a second electrode of a second repair transistor; wherein the second repair transistor is one of the plurality of first transistors, and corresponds to the second repair capacitive line;

cutting the third repair capacitive line off to obtain a sixth repair break; wherein a first break in the third repair capacitive line is a fifth repair break; the fifth repair break and the sixth repair break are respectively disposed on the two sides of the second bridge; and coupling a portion of the first conductive segment of the third repair capacitive line located on a side of the fifth repair break away from a middle subsection of the first conductive segment of the third repair capacitive line to a second electrode of a third repair transistor; wherein the third repair transistor is one of the plurality of first transistors, and corresponds to the third repair capacitive line.

18. The array substrate according to claim 1, wherein the first break is located on a side of the middle subsection of the first conductive segment away from the charging coupling point.

19. The array substrate according to claim 2, wherein the orthographic projection, on the substrate, of the portion of the first conductive segment located on the side of the first break away from the middle subsection, the orthographic projection of the second electrode of the first transistor on the substrate, and the orthographic projection of the first pixel electrode on the substrate are overlapped with each other.

20. The array substrate according to claim 18, wherein the orthographic projection, on the substrate, of the portion of the first conductive segment located on the side of the first break away from the middle subsection, the orthographic projection of the second electrode of the first transistor on the substrate, and the orthographic projection of the first pixel electrode on the substrate are overlapped with each other.

* * * * *